(12) United States Patent
Miyake

(10) Patent No.: US 9,933,903 B2
(45) Date of Patent: Apr. 3, 2018

(54) INPUT DEVICE AND INPUT/OUTPUT DEVICE

(71) Applicant: Semiconductor Energy Laboratory Co., Ltd., Atsugi-shi, Kanagawa-ken (JP)

(72) Inventor: Hiroyuki Miyake, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 99 days.

(21) Appl. No.: 14/868,792

(22) Filed: Sep. 29, 2015

(65) Prior Publication Data

US 2016/0098120 A1    Apr. 7, 2016

(30) Foreign Application Priority Data

Oct. 2, 2014   (JP) .................................. 2014-203854

(51) Int. Cl.
*G06F 3/044*    (2006.01)
*B60K 35/00*   (2006.01)
(Continued)

(52) U.S. Cl.
CPC .............. *G06F 3/044* (2013.01); *B60K 35/00* (2013.01); *G06F 1/163* (2013.01); *G06F 1/1626* (2013.01); *G06F 1/1641* (2013.01); *G06F 1/1652* (2013.01); *G06F 3/0412* (2013.01); *G01R 27/2605* (2013.01); *G02F 1/13338* (2013.01); *G06F 3/03547* (2013.01); *G06F 3/0416* (2013.01); *G06F 2203/04102* (2013.01);
(Continued)

(58) Field of Classification Search
CPC . B60K 35/00; G01R 27/2605; G02F 1/13338; G02F 1/1626; G02F 1/163; G02F 1/1641; G02F 1/1652; G02F 3/03547; G02F 3/044; G02F 3/0412; G02F 3/0416; G02F 2203/04102; G02F 2203/04103; G02F 2203/04112; H03K 17/955; G09G 2320/0209
See application file for complete search history.

(56) References Cited

U.S. PATENT DOCUMENTS 6,972,753 B1   12/2005 Kimura et al.
7,399,991 B2   7/2008 Seo et al.
(Continued)

FOREIGN PATENT DOCUMENTS

JP   2000-172444 A   6/2000
JP   2002-324673 A   11/2002

*Primary Examiner* — Michael J Eurice
(74) *Attorney, Agent, or Firm* — Fish & Richardson P.C.

(57) ABSTRACT

An input device or an input/output device that is suitable for increasing in size is provided. An input device or an input/output device that can be driven at high frequencies is provided. An input device includes a plurality of row wirings and a plurality of column wirings. To each of the plurality of row wirings, periodic rectangular waves are applied. When attention is paid to one row wiring Xi (i is greater than or equal to 1 and less than or equal to m−1), a signal that has a phase opposite to that of a signal applied to the row wiring Xi and that is delayed for a given period is applied to a row wiring Xi+1, which is the row wiring next to the row wiring Xi. The width of each of the rectangular waves applied to the row wirings corresponds to a frame period.

19 Claims, 30 Drawing Sheets

(51) Int. Cl.
*G06F 1/16* (2006.01)
*G06F 3/0354* (2013.01)
*G01R 27/26* (2006.01)
*G02F 1/1333* (2006.01)
*G06F 3/041* (2006.01)
*H03K 17/955* (2006.01)

(52) U.S. Cl.
CPC ............ *G06F 2203/04103* (2013.01); *G06F 2203/04112* (2013.01); *G09G 2320/0209* (2013.01); *H03K 17/955* (2013.01)

(56) References Cited

U.S. PATENT DOCUMENTS

| | | |
|---|---|---|
| 8,823,893 B2 | 9/2014 | Yamazaki |
| 9,134,864 B2 | 9/2015 | Tamura |
| 2007/0176905 A1* | 8/2007 | Shih .................... G02F 1/13338 345/173 |
| 2008/0116904 A1* | 5/2008 | Reynolds .............. G06F 3/0416 324/678 |
| 2008/0157893 A1* | 7/2008 | Krah .................... G06F 3/0418 331/177 R |
| 2008/0158180 A1* | 7/2008 | Krah .................... G06F 3/03545 345/173 |
| 2008/0186289 A1* | 8/2008 | Ijima ...................... G06F 3/042 345/175 |
| 2009/0015533 A1* | 1/2009 | Fujita .................. G09G 3/3655 345/92 |
| 2009/0115737 A1* | 5/2009 | Toyoshima ............ G06F 3/044 345/173 |
| 2009/0115750 A1* | 5/2009 | Chen ..................... G06F 3/044 345/204 |
| 2009/0219257 A1* | 9/2009 | Frey ...................... G06F 3/044 345/173 |
| 2009/0244014 A1* | 10/2009 | Hotelling .............. G06F 3/0416 345/173 |
| 2009/0303203 A1* | 12/2009 | Yilmaz ................. G06F 3/0418 345/174 |
| 2010/0139991 A1* | 6/2010 | Philipp ................. G06F 3/0418 178/18.06 |
| 2010/0244859 A1* | 9/2010 | Cormier, Jr. ............ G06F 3/044 324/678 |
| 2011/0216043 A1* | 9/2011 | Tamura ................. G06F 1/3203 345/175 |
| 2012/0306811 A1* | 12/2012 | Farmer ............... G06F 3/04883 345/174 |
| 2013/0050130 A1* | 2/2013 | Brown .................... G06F 3/044 345/174 |
| 2013/0249825 A1* | 9/2013 | Kang .................. G06F 3/03547 345/173 |
| 2013/0257798 A1* | 10/2013 | Tamura ................. G06F 3/0418 345/174 |
| 2013/0321333 A1* | 12/2013 | Tamura .................. G06F 3/044 345/174 |
| 2014/0043546 A1 | 2/2014 | Yamazaki et al. |
| 2014/0192278 A1* | 7/2014 | Esaka .................... G06F 3/044 349/12 |
| 2014/0240617 A1* | 8/2014 | Fukutome .......... G02F 1/13338 349/12 |
| 2014/1028573 | 9/2014 | Tanabet et al. |
| 2015/0084911 A1* | 3/2015 | Stronks ................ G06F 3/0416 345/174 |
| 2015/0268792 A1* | 9/2015 | Hamaguchi ............ G06F 3/044 345/174 |
| 2015/0346776 A1 | 12/2015 | Miyake |
| 2015/0346866 A1 | 12/2015 | Kusunoki et al. |
| 2015/0355763 A1 | 12/2015 | Miyake et al. |

* cited by examiner

FIG. 27A
FIG. 27B
FIG. 27C1
FIG. 27D
FIG. 27E
FIG. 27C2
FIG. 27F
FIG. 27G
FIG. 27H
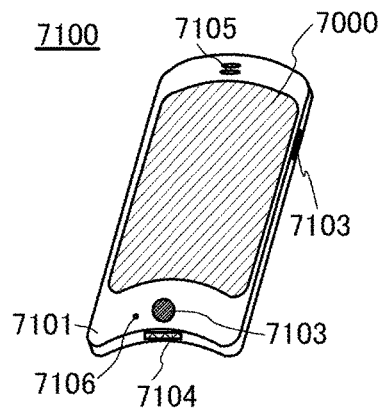
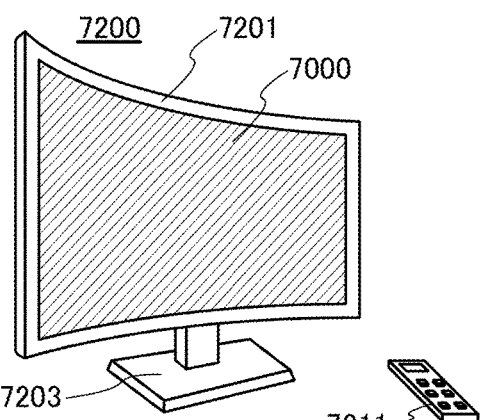
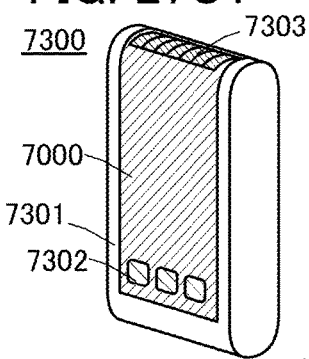
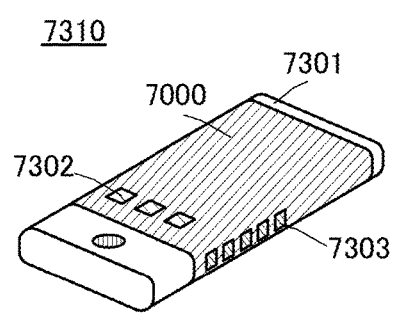
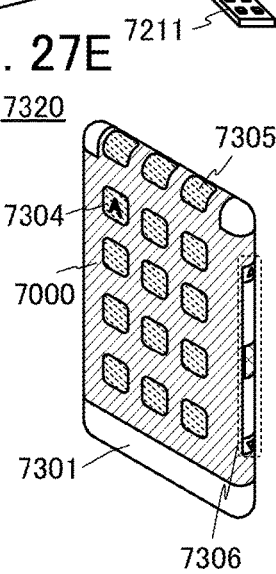
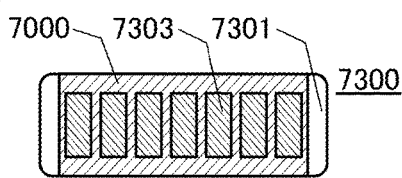
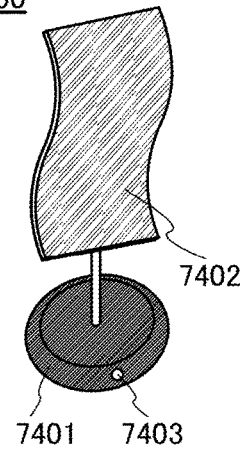
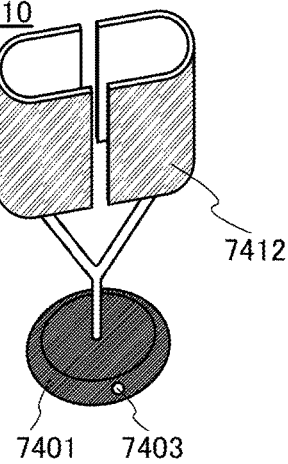
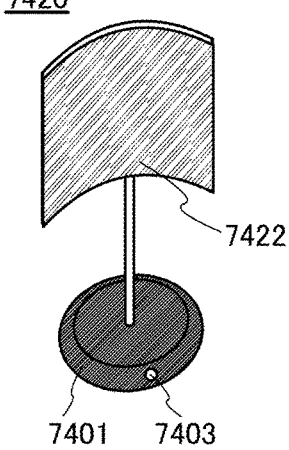

FIG. 28A1
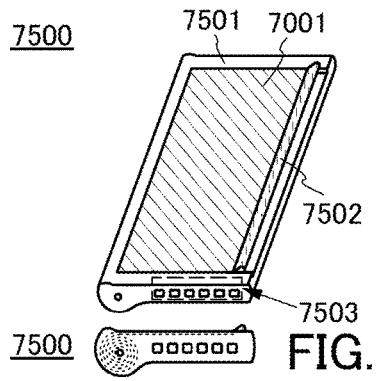
FIG. 28B
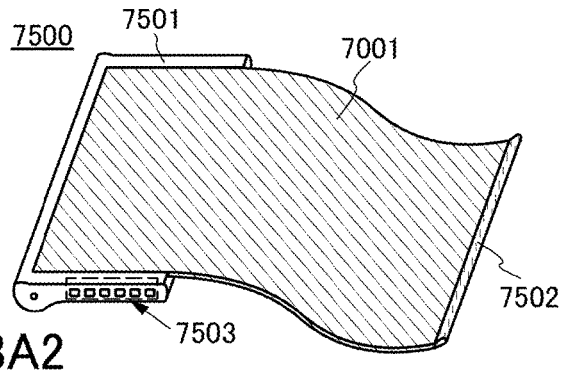
FIG. 28A2
FIG. 28C
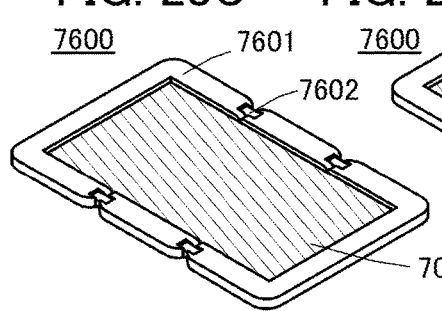
FIG. 28D
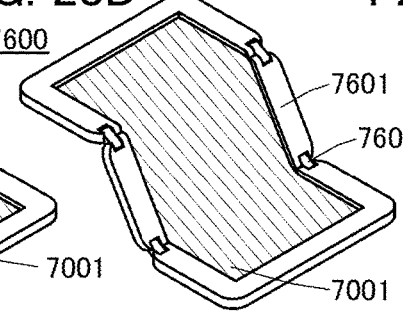
FIG. 28E
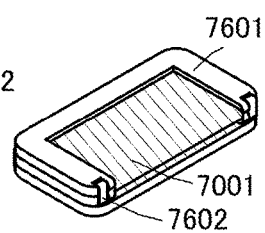
FIG. 28F
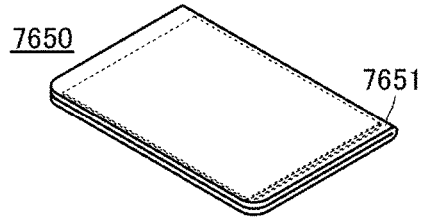
FIG. 28G
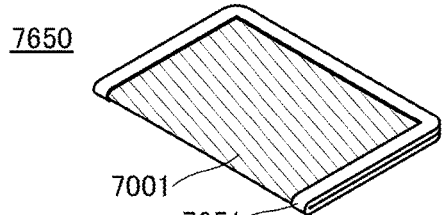
FIG. 28H
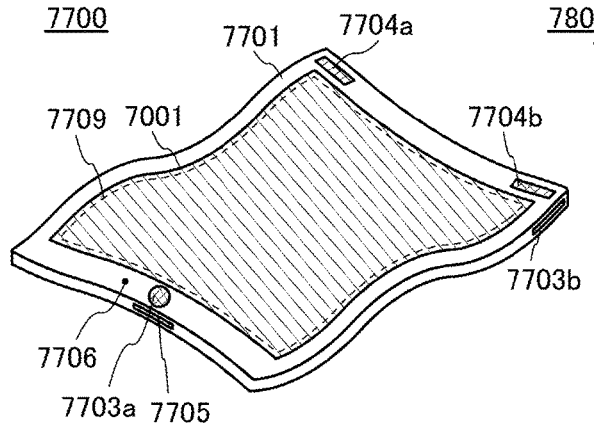
FIG. 28I
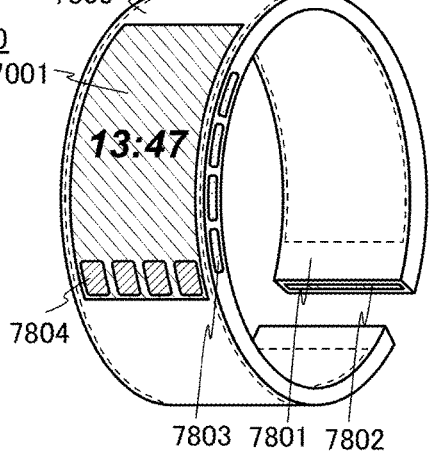

INPUT DEVICE AND INPUT/OUTPUT DEVICE

BACKGROUND OF THE INVENTION

1. Field of the Invention

One embodiment of the present invention relates to an input device. One embodiment of the present invention relates to an input/output device.

Note that one embodiment of the present invention is not limited to the above technical field. Examples of the technical field of one embodiment of the present invention disclosed in this specification include a semiconductor device, a display device, a light-emitting device, a power storage device, a memory device, an electronic device, a lighting device, an input device, an input/output device, a driving method thereof, and a manufacturing method thereof.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an input device, an input/output device, an electro-optical device, a power generation device (including a thin film solar cell, an organic thin film solar cell, and the like), and an electronic device may each include a semiconductor device in some cases.

2. Description of the Related Art

In recent years, a display device provided with a touch sensor as a position input unit has attracted attention. The display device provided with a touch sensor is called a touch panel, a touch screen, or the like (hereinafter also referred to simply as a "touch panel"). Examples of portable information appliances with a touch panel are a smartphone, a tablet, and the like.

Examples of the display device include, typically, a liquid crystal display device, a light-emitting device including a light-emitting element such as an organic electroluminescent (EL) element or a light-emitting diode (LED), and an electronic paper performing display by an electrophoretic method or the like.

For example, in a basic structure of an organic EL element, a layer containing a light-emitting organic compound is provided between a pair of electrodes. By voltage application to this element, the light-emitting organic compound can emit light. A display device including such an organic EL element needs no backlight which is necessary for liquid crystal display devices and the like; therefore, thin, lightweight, high contrast, and low power consumption display devices can be obtained. Patent Document 1, for example, discloses an example of a display device using organic EL elements.

In a touch panel, a pressure-sensitive sensor array or a capacitive sensor array is provided so as to overlap with a display panel, for example; by touching a substrate of the sensor array with a finger or an input pen, the touched position is sensed.

Patent Document 2 discloses a structure in which a touch panel is provided on a display screen of an electroluminescence display device.

REFERENCE

Patent Document

[Patent Document 1] Japanese Published Patent Application No. 2002-324673

[Patent Document 2] Japanese Published Patent Application No. 2000-172444

SUMMARY OF THE INVENTION

Along with the increase in size of display devices, the increase in size of sensor arrays have been required. In addition, higher-resolution display devices or higher-speed operation thereof have been required. The sensitivity of a touch sensor has been required to be increased.

An object of one embodiment of the present invention is to provide an input device or an input/output device that is suitable for increasing in size. Another object of one embodiment of the present invention is to provide an input device or an input/output device that can be driven at high frequencies. Another object of one embodiment of the present invention is to provide an input device or an input/output device that can increase the sensitivity. Another object of one embodiment of the present invention is to provide an input device or an input/output device that is suitable for reduction in bezel area of display devices. Another object of one embodiment of the present invention is to provide an input device or an input/output device that is suitable for high-resolution display devices.

Note that the descriptions of these objects do not disturb the existence of other objects. In one embodiment of the present invention, there is no need to achieve all the objects. Note that other objects can be derived from the description of the specification, the drawings, the claims, and the like.

One embodiment of the present invention is an input device including m (m is an integer of 2 or more) row wirings, n (n is an integer of 2 or more) column wirings, and a circuit. A capacitor is formed between each of the row wirings and each of the column wirings. The circuit has a function of outputting a signal to each of the row wirings and of sensing a potential or current of each of the column wirings. The circuit also inputs the i-th (i is an integer greater than or equal to 1 and less than or equal to m−1) signal to the i-th row wiring, and inputs the i+1-th signal to the i+1-th row wiring. The i-th signal includes a period in which a first time at which the first potential changes into the second potential and a second time at which the second potential changes into the first potential are alternately and regularly repeated. The i+1-th signal includes a period in which a third time at which the third potential changes into the fourth potential and a fourth time at which the fourth potential changes into the third potential are alternately and regularly repeated. The third time is placed in a period between the first time and the second time.

In the above, it is preferable that a period from the first time to the second time have the same length as a period from the third time to the fourth time.

In addition, it is preferable that a period from the first time to the second time correspond to a frame period.

In the above, it is preferable that the first potential be equal to the third potential, and the second potential be equal to the fourth potential. Alternatively, it is preferable that the first potential be equal to the fourth potential, and the second potential be equal to the third potential.

In the above, it is preferable that m be an odd number of 3 or more.

In the above, it is preferable that the row wiring and the column wiring contain a light-transmitting conductive material. Alternatively, it is preferable that the row wiring and the column wiring contain a light-blocking conductive material and have a region whose width is greater than or equal to 50 nm and less than or equal to 100 μm.

Another embodiment of the present invention is an input/output device including the above input device and a display panel provided with a display element and a transistor.

One embodiment of the present invention can provide an input device or an input/output device that is suitable for increasing in size. Alternatively, an input device or an input/output device that can be driven at high frequencies can be provided. Alternatively, an input device or an input/output device that can increase the sensitivity can be provided. Alternatively, an input device or an input/output device that is suitable for reduction in bezel area of display devices can be provided. Alternatively, an input device or an input/output device that is suitable for high-resolution display devices can be provided. Alternatively, a novel input device or a novel input/output device can be provided.

Note that the description of these effects does not disturb the existence of other effects. In one embodiment of the present invention, there is no need to have all the effects listed above. Other effects can be derived from the description of the specification, the drawings, the claims, and the like.

BRIEF DESCRIPTION OF THE DRAWINGS

In the accompanying drawings:

FIGS. 27A, 27B, 27C1, 27C2, 27D, 27E, 27F, 27G, and 27H illustrate examples of electronic devices and lighting devices;

FIGS. 28A1, 28A2, 28B, 28C, 28D, 28E, 28F, 28G, 28H, and 28I each illustrate an example of an electronic device of an embodiment;

DETAILED DESCRIPTION OF THE INVENTION

Figure 1A:
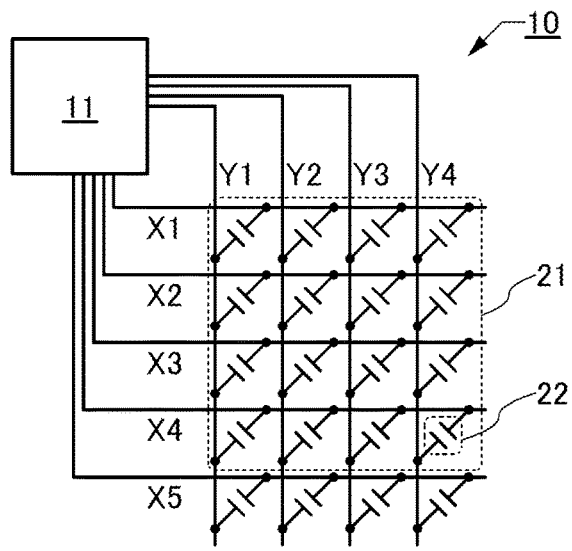
FIGS. 1A to 1C illustrate a structure example and a driving method example of an input device of an embodiment.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below.

Note that in the structures of the invention described below, the same portions or portions having similar functions are denoted by the same reference numerals in different drawings, and description of such portions is not repeated. Further, the same hatching pattern is applied to portions having similar functions, and the portions are not especially denoted by reference numerals in some cases.

Note that in each drawing described in this specification, the size, the layer thickness, or the region of each component is exaggerated for clarity in some cases. Therefore, embodiments of the present invention are not limited to such a scale.

Note that in this specification and the like, ordinal numbers such as "first," "second," and the like are used in order to avoid confusion among components and do not limit the number.

A transistor is a kind of semiconductor elements and can achieve amplification of current or voltage, switching operation for controlling conduction or non-conduction, or the like. A transistor in this specification includes an insulated-gate field effect transistor (IGFET) and a thin film transistor (TFT).

Embodiment 1

In this embodiment, structure examples of an input device and a display device provided with the input device of one embodiment of the present invention, and a driving method example thereof are described with reference to drawings.

Structure Example

FIG. 1A illustrates a structure example of an input device 10. The input device 10 includes m (m is an integer of 2 or more) row wirings (row wirings X1 to Xm), n (n is an integer of 2 or more) column wirings (column wirings Y1 to Yn), and a circuit 11. The row wirings intersect the column wirings. A capacitor 22 is formed between one of the row wirings and one of the column wirings. The input device 10 includes a sensor array 21 in which a plurality of (m×n) capacitors 22 are arranged in a matrix.

For simplicity, FIG. 1A illustrates a structure of the input device 10 in which five row wirings (row wirings X1 to X5) and four column wirings (column wirings Y1 to Y4) are provided.

The circuit 11 has a function of outputting a signal to each of the plurality of column wirings. The circuit 11 also has a function of sensing a potential of, or a current flowing through, each of the plurality of column wirings. Signals output from the circuit 11 to the row wirings include a signal whose potential is dramatically changed (also referred to as a pulse signal).

The circuit 11 sequentially outputs signals to the plurality of row wirings and senses current flowing accordingly to each of the column wirings or senses potential of each of the column wirings. When a conductive object such as a finger or a stylus approaches part of the sensor array, the changing amount of current flowing to a column wiring adjacent to the object or of potential of the column wiring is changed, which makes it possible to obtain positional information about the object. The circuit 11 can output the obtained positional information to the outside.

Figure 2:
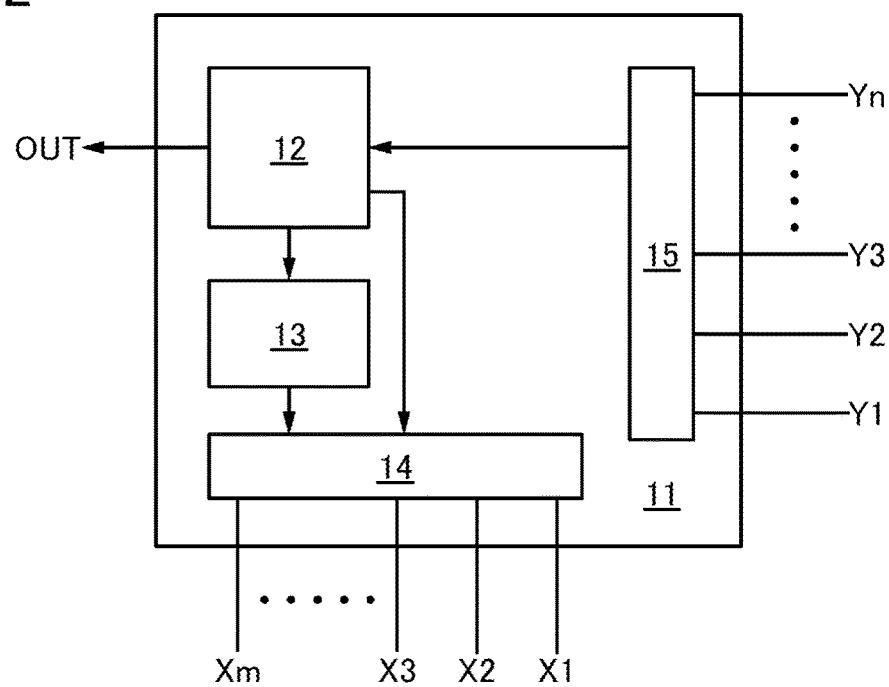
FIG. 2 illustrates a circuit structure example of an embodiment.

FIG. 2 is a block diagram illustrating a structure example of the circuit 11. The circuit 11 includes a control unit 12, a pulse signal generation circuit 13, a selection circuit 14, a sensing circuit 15, and the like.

The pulse signal generation circuit 13 is a circuit that generates a pulse signal in accordance with a timing signal output from the control unit 12. A pulse signal is output from the pulse signal generation circuit 13 to the selection circuit 14. The selection circuit 14 has a function of outputting the pulse signal that is input from the pulse signal generation circuit 13 sequentially to a plurality of row wirings (the row wirings X1 to Xm). The sensing circuit 15 has a function of obtaining the current flowing to each of a plurality of column wirings (the column wirings Y1 to Yn) or the potential of each of the column wirings Y1 to Yn and of outputting information thereon to the control unit 12. The sensing circuit 15 may have a function of an analog-to-digital converter circuit, in which case, a digital signal is output to the control unit 12.

The control unit 12 has a function of controlling the operation or timing of the pulse signal generation circuit 13 and the selection circuit 14. The control unit 12 can also convert information of the current or the potential input from the sensing circuit 15 into positional information, and can output the information to the outside through an output terminal OUT. Note that when a function of conversion into positional information is provided outside the circuit 11, the control unit 12 does not necessarily have such an arithmetic function, and the output from the sensing circuit 15 may be directly output to the outside.

Driving Method Example

An example of a driving method performed by the circuit 11 will be described next. An example of a driving method to which a mutual projected capacitive type method which is one embodiment of the present invention is applied will be described below.

Figure 1B:
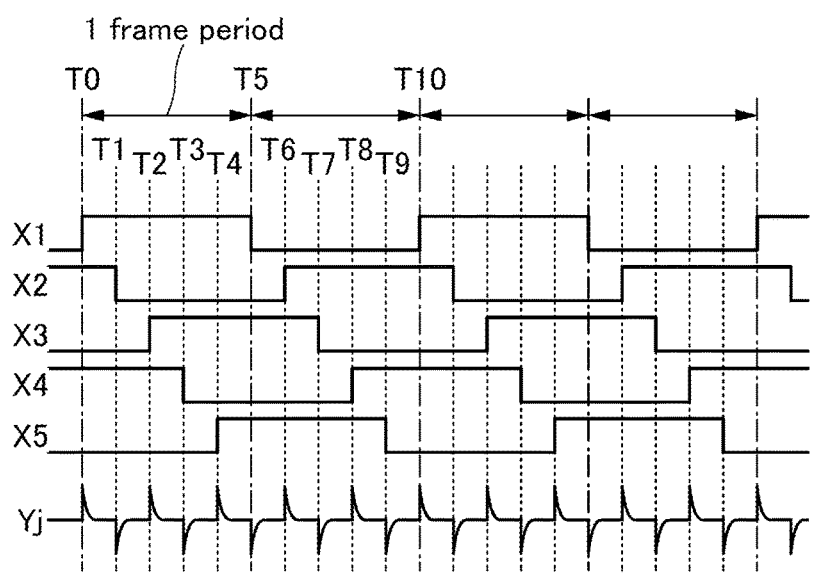

FIG. 1B is a timing chart illustrating operation of the input device 10 shown in FIG. 1A. FIG. 1B illustrates how signals input to the row wirings X1 to X5 and current flowing to one of the four column wirings (a column wiring Yj, j is one of 1 to 4) are each changed over time.

To the row wirings X1 to X5, rectangular waves that regularly shift between two kinds of potentials, a high level potential and a low level potential, are applied. When attention is paid to one row wiring Xi (i is greater than or equal to 1 and less than or equal to m−1), a signal that has a phase opposite to that of the signal applied to the row wiring Xi and that is delayed for a given period is applied to a row wiring Xi+1, which is the row wiring next to the row wiring Xi.

In an example shown in FIG. 1B, a signal applied to the row wiring X1 is shifted from a low level potential to a high level potential at time T0 and shifted from the high level potential to the low level potential at time T5. A signal applied to the row wiring X2 is shifted from a high level potential to a low level potential at time T1 and shifted from the low level potential to the high level potential at time T6. A signal applied to the row wiring X3 is shifted from a low level potential to a high level potential at time T2 and shifted from a high level potential to a low level potential at time T7.

In some cases, a shift of potential of a wiring from a low level to a high level is expressed by the phrase "a potential rises." In addition, a shift of potential of a wiring from a high level to a low level is expressed by the phrase "a potential falls."

Instantaneous current flows into a column wiring Yj when a potential of each of the row wirings rises or falls. When a potential of the row wiring rises, the current direction is opposite to the direction when the potential falls.

In an example shown in FIG. 1B, current flows into the column wiring Yj at the time T0 in response to a rise in a signal applied to the row wiring X1. At the time T1, the opposite-direction current flows in a response to a fall in a signal applied to the row wiring X2. As described above, pulse currents in different directions alternately flow to the column wiring Yj. Such operation can increase a driving frequency because defects are not caused and the potential of the column wiring Yj in a steady state (where no current flows) does not change over time.

As illustrated in FIG. 1B, times at which potentials of all of the other row wirings (the row wirings X2 to X5) rise or fall are preferably included in a period from the time T0 at which the potential of the row wiring X1 rises to the time T5 at which the potential falls. In other words, all the row wirings are preferably scanned during the period from the time T0 to the time T5 which corresponds to a pulse width of a signal applied to the row wiring X1. At this time, the period from the time T0 to the time T5 corresponds to one frame period (also referred to as a frame width). Note that although not shown here, a retrace period may be provided during a period from the time T4 to the time T5, that is, a period after all the row wirings are scanned and before the next scan is started.

Figure 1C:
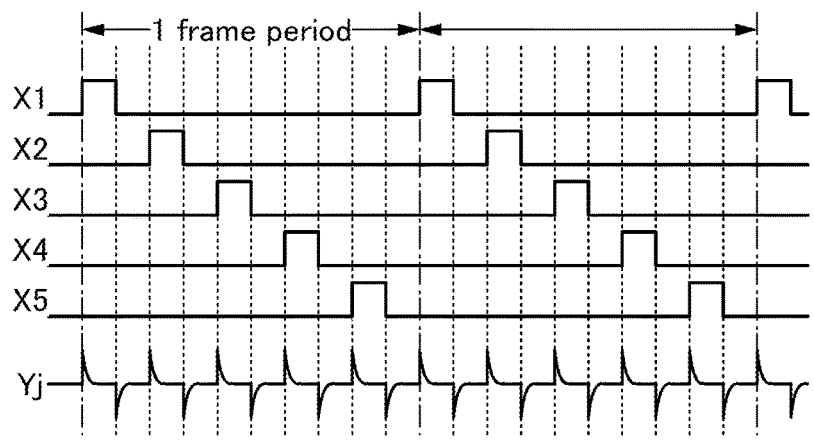

In FIG. 1C, a timing chart of a driving method different from that of FIG. 1B is illustrated as another example. In FIG. 1C, rectangular waves are sequentially applied to the row wirings. The waveform of the current flowing to the column wiring Yj is the same as that obtained by the driving method illustrated in FIG. 1B. However, a set of two pulse currents flowing in different directions correspond to one row wiring. In contrast to FIG. 1C, one pulse current corresponds to one row wiring in the driving method illustrated in FIG. 1B. Therefore, when the interval between two pulse currents flowing to the column wiring Yj is uniform, one frame period in the driving method illustrated in FIG. 1C is two times as long as one frame period in the driving method illustrated in FIG. 1B. That is, compared with FIG. 1C, scanning can be performed in a half period in the driving method illustrated in FIG. 1B.

In the driving method illustrated in FIG. 1B, the period of the signal applied to each of the row wirings (for example, a period from the time T0 to a time T10) corresponds to two frame periods. In contrast, in the driving method illustrated in FIG. 1C, the period of the signal corresponds to one frame period. That is, the driving method illustrated in FIG. 1B can roughly double the driving frequency compared with the driving method illustrated in FIG. 1C, for example.

The number m of row wirings included in the input device 10 is preferably an odd number. When m is an odd number, as shown in FIG. 1B, the direction of current flowing to the column wiring Yj at the end of one frame (for example, time T4) is opposite to that at the start of the next frame (for example, time T5). Therefore, pulse currents in the opposite directions can be constantly and alternately applied to the column wiring Yj, and it is possible to prevent the potential of the column wiring Yj from changing over time. As a result, a standby period during which the potential of the column wiring Yj become stabilized after one pulse current flows can be shorter; therefore, the driving frequency can be further increased.

Note that the number n of column wirings included in the input device 10 has no particular limitation and may be an odd number or an even number. The magnitude relation between the number m of row wirings and the number n of column wirings is not particularly limited, and the number of row wirings may be the same as, greater than, or less than that of the column wirings. When the number n of column wirings is less than the number m of row wirings, capacitance of one row wiring can be small; therefore, the driving frequency can be increased in some cases. When the number m of row wirings is less than the number n of column wirings, the number of pulse signals output during one frame period can be decreased; therefore, the driving frequency can be increased in some cases. The number m of row wirings and the number n of column wirings are determined as appropriate in accordance with the area of the sensing surface of the input device 10, the pitch of sensing points thereof, or the like.

The increase of the driving frequency makes it possible to increase the sensitivity of touch operation. In addition, the numbers of row wirings and the column wirings can be large; therefore, a higher-resolution input device can be provided. Accordingly, even when the contact area or proximity area with the object is small, high sensitivity can be achieved; therefore, the input stylus or the like can be thin. As a result, it is possible to provide an application or the like in which thinner lines can be drawn with accuracy.

Modification Example 1

Figure 3A:
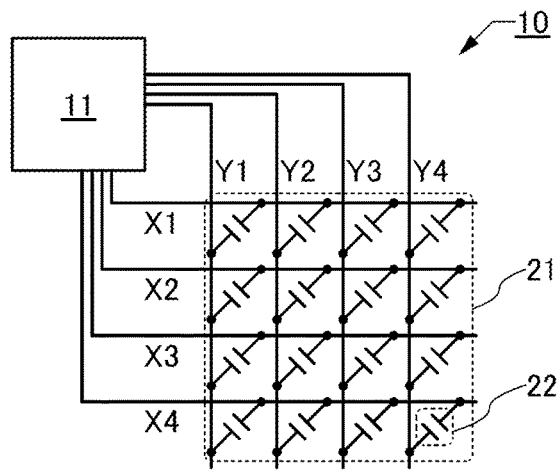
FIGS. 3A to 3C illustrate a structure example and a driving method example of an input device of an embodiment.

FIG. 3A illustrates a structure example of the input device 10 in which the number m of row wirings is an even number. FIG. 3A illustrates a case where four row wirings (row wirings X1 to X4) are provided. In addition, FIG. 3A illustrates a case where four column wirings (column wirings Y1 to Y4) are provided as in FIG. 1A.

Figure 3B:
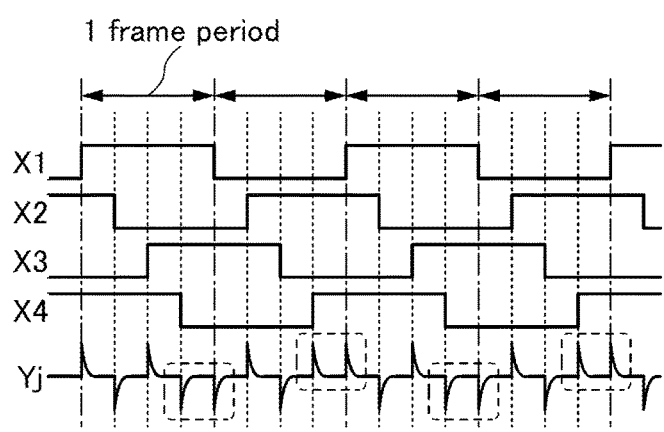

FIG. 3B illustrates a timing chart of the driving method of the input device 10. As shown in portions, surrounded by dashed lines, of the waveforms of the current flowing to the column wiring Yj, pulse currents flow in the same direction at two successive times at or near the border of the frame period, in the case where the number m of the row wirings is an even number. After the pulse current flows, a potential of the column wiring Yj does not return completely to the original potential and changes in some cases. In that case, it is preferable that the interval of the pulse signal input to the row wirings X1 to Xm be widened, and the length of one frame period be adjusted, so that the interval between the pulse currents flowing to the column wiring Yj becomes wide enough to stabilize the potential of the column wiring Yj. Note that even when such adjustment is performed, the driving frequency can be increased enough compared with that achieved when using the driving method shown in FIG. 1C.

Figure 3C:
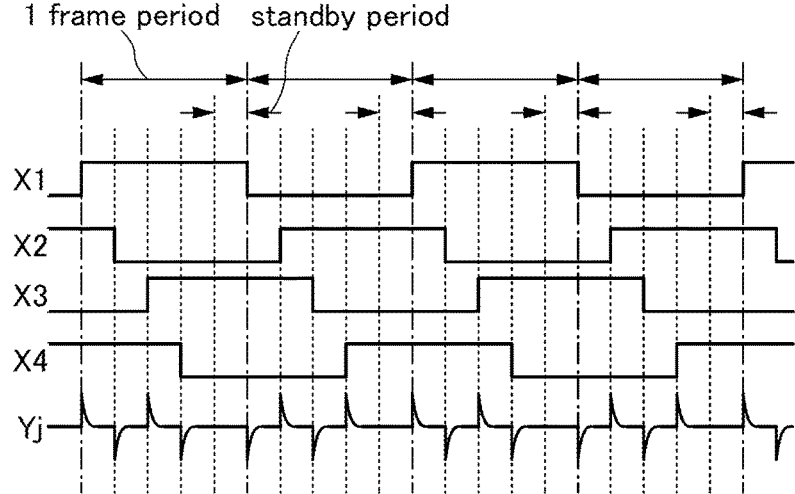

As shown in FIG. 3C, a standby period (or a retrace period) for stabilizing the potential of the column wiring Yj may be provided at the end of each frame period. Thus, the driving frequency in one frame period is not required to decrease and high sensitivity can be maintained.

Modification Example 2

Figure 4A:
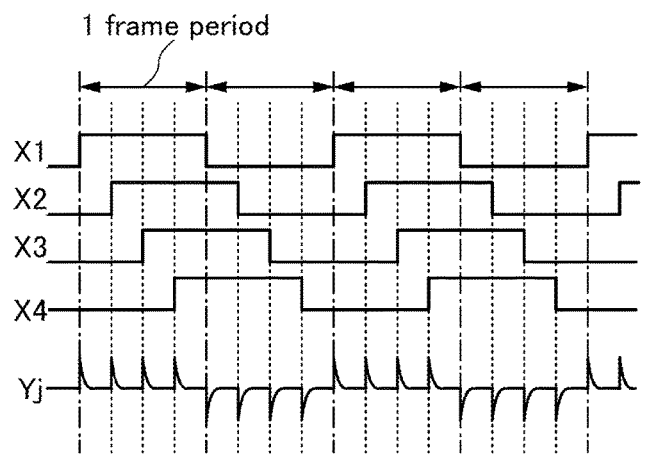
FIGS. 4A and 4B each illustrate a driving method example of an input device of an embodiment.

FIG. 4A illustrates an example of a driving method different from the above. Although, in the above description, the case where signals with opposite phases are input alternately to even-numbered rows and odd-numbered rows of a plurality of row wirings is described, an example of the case where signals with the same phase are used will be described here.

As shown in FIG. 4A, signals applied to the row wirings X1 to X4 are signals whose potentials are shifted in the same direction in one frame period. That is, the potentials of four signals input to the row wirings X1 to X4 are uniformly shifted in the direction of potential rising or potential falling. Therefore, pulse currents flows in the same direction to the column wiring Yj during one frame period. In the next frame, a series of pulse currents flows in the opposite direction.

Like the above, also such a driving method makes it possible to increase significantly the driving frequency. There is no need to use a signal with inverted phase; therefore, the circuit structure can be advantageously simplified.

Figure 4B:
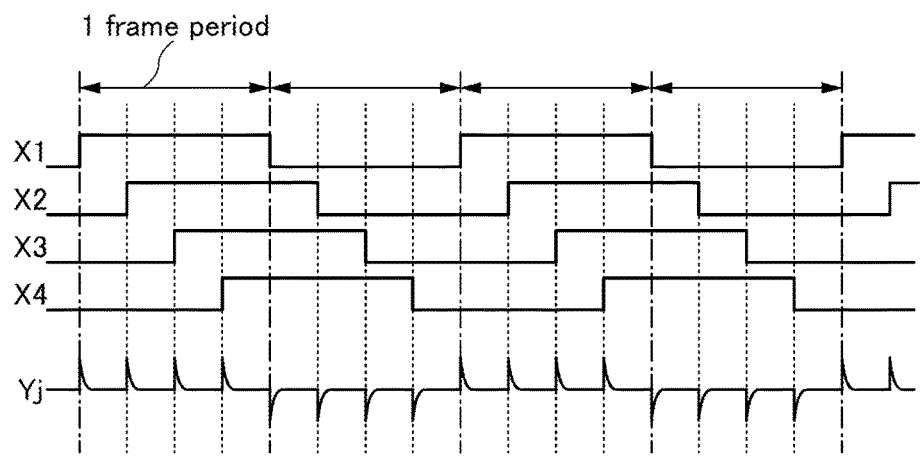

Note that, in the case where the potential of the column wiring Yj does not return to the original potential as described above and changes, the length of one frame period is preferably adjusted. For example, FIG. 4B illustrates an example of the case where the length of one frame period is longer than that of FIG. 4A. This can make the interval between two pulse currents flowing to the column wiring Yj long enough, and stabilize the potential of the column wiring Yj enough during the interval. Even when such a driving method is used, the driving frequency can be kept high enough compared with that achieved when using the conventional driving method.

The above is the description of a driving method example of the input device 10.

Example of Driving Method for Touch Panel

Next, an example of a driving method for a touch panel, which is an input/output device including the input device 10 of one embodiment of the present invention and a display panel for displaying an image, will be described. An example of a method for driving the input device 10 and a display panel in combination will be described below.

Figure 5A:
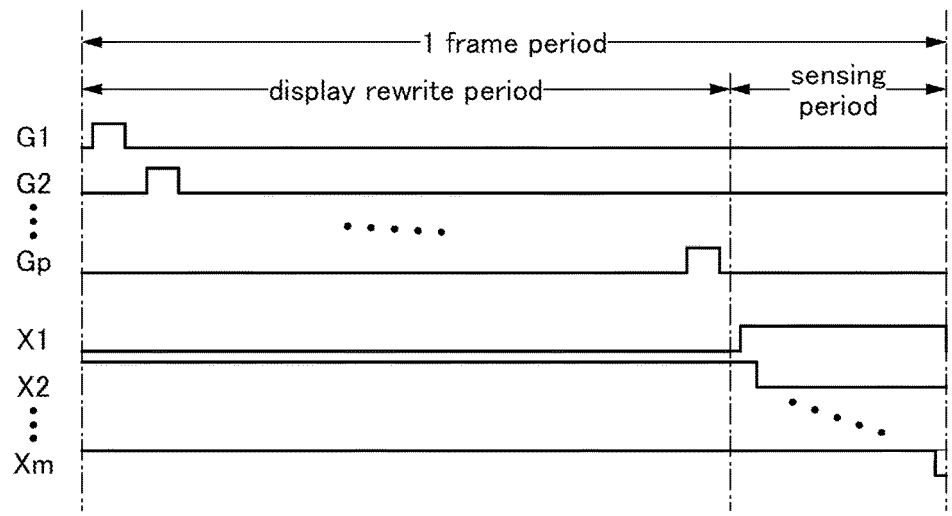
FIGS. 5A and 5B each illustrate a driving method example of an input/output device of an embodiment.
Figure 5B:
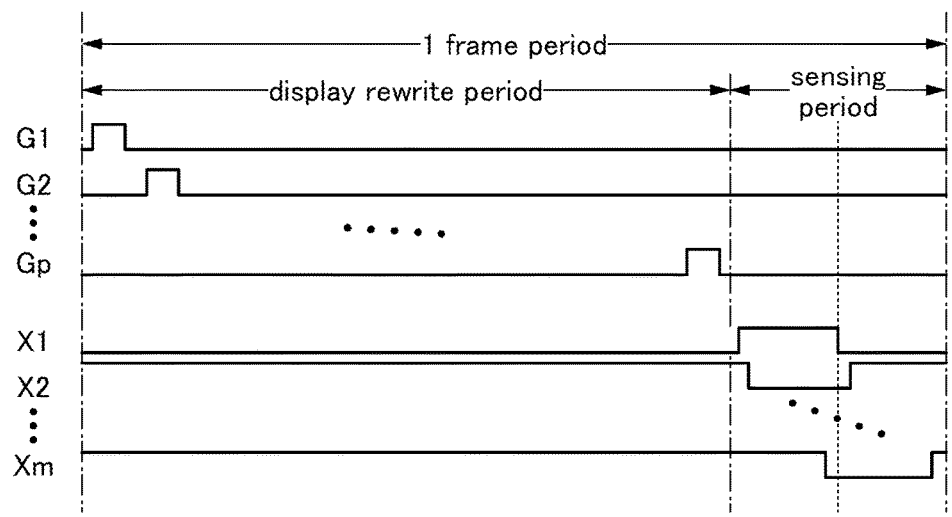

FIG. 5A is a timing chart for operation of the input device 10 and a display panel. FIGS. 5A and 5B show signals applied to p (p is an integer) scan lines (scan lines G1 to Gp) included in the display panel and signals applied to the row wirings (the row wirings X1 to Xm) of the input device 10.

As shown in FIG. 5A, it is preferable that display rewrite periods for the display panel and sensing periods for the input device 10 (corresponding to one frame period in FIG. 1B) be alternately provided. This can prevent electromagnetic noise that is generated when the display rewrite of the display panel is performed from affecting the input device 10; therefore, the sensitivity of the input device 10 can be increased.

In the input device 10 of one embodiment of the present invention, the driving frequency can be extremely high, which makes it possible to set the sensing period shown in FIG. 5A short. Therefore, the driving frequency of the display panel can be lowered. The decrease of the driving frequency of the display panel produces a variety of secondary effects. For example, power consumption of a scan line driver circuit (a gate driver) can be reduced. In addition, a size of a transistor included in a scan line driver circuit can be small, and an occupation area of the scan line driver circuit can be reduced, for example. As a result, a width of a bezel (a peripheral portion, which is a portion except for the display region) of the display panel can be reduced.

The high driving frequency of the input device 10 of one embodiment of the present invention can realize performing a plurality of times of sensing in one sensing period as shown in FIG. 5B. As the number of times of sensing performed in one frame period is increased, the sensing accuracy can be increased. Although FIG. 5B shows the case where two times of sensing are performed in the sensing period, three or more times of sensing may be performed in one frame period of the touch panel.

The above is the description of an example of the driving method for a touch panel.

Structure Example of Sensor Electrode or the Like

More specific structure examples of the input device 10 are described below with reference to drawings.

Figure 6A:
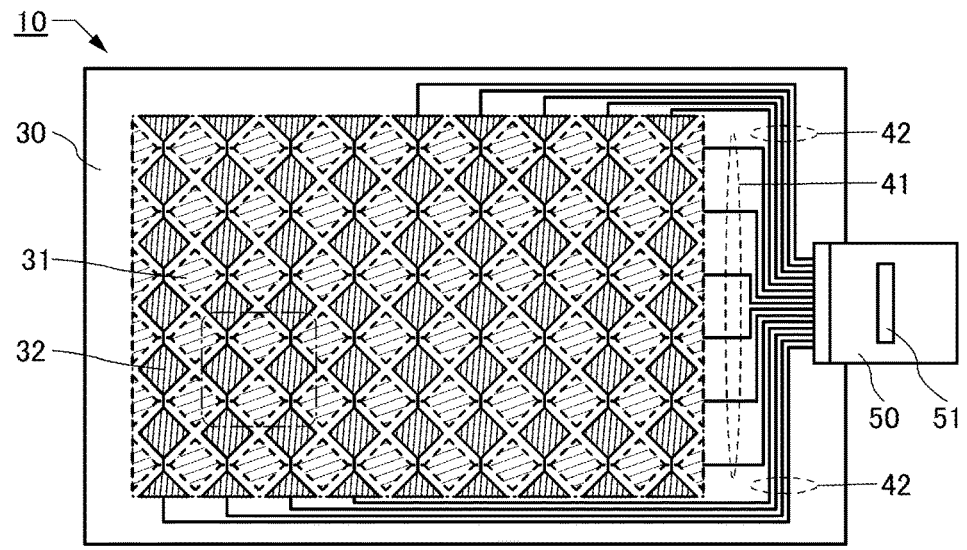
FIGS. 6A to 6D each illustrate a structure example of an input device of an embodiment.

FIG. 6A is a schematic top view of the input device 10. The input device 10 includes a plurality of electrodes 31, a plurality of electrodes 32, a plurality of wirings 41, and a plurality of wirings 42 over a substrate 30. The substrate 30 is provided with a flexible printed circuit (FPC) 50 which is electrically connected to each of the plurality of wirings 41 and the plurality of wirings 42. FIG. 6A illustrates an example in which the FPC 50 is provided with an IC 51.

Figure 6B:
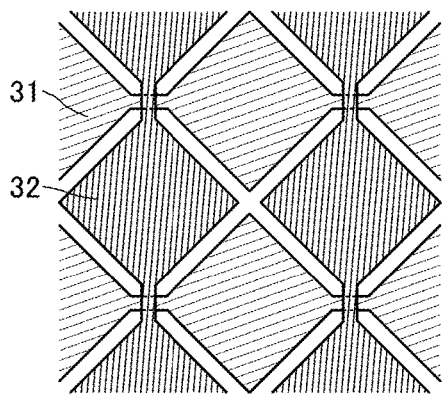

FIG. 6B shows an enlarged view of a region surrounded by a dashed dotted line in FIG. 6A. The electrodes 31 are each in the form of a series of rhombic electrode patterns aligned in a lateral direction. The rhombic electrode patterns aligned in a line are electrically connected to each other. The electrodes 32 are also each in the form of a series of rhombic electrode patterns aligned in a longitudinal direction and the rhombic electrode patterns aligned in a line are electrically connected. Part of the electrode 31 and part of the electrode 32 overlap and intersect with each other. At this intersection portion, an insulator is sandwiched in order to avoid an electrical short-circuit between the electrode 31 and the electrode 32.

Figure 6C:
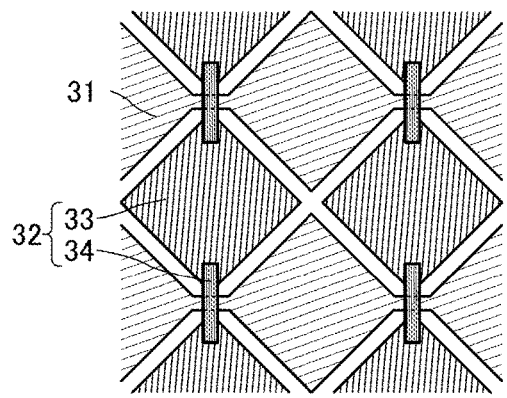

As shown in FIG. 6C, the electrodes 32 may form a plurality of island-shape rhombic electrodes 33 and bridge electrodes 34. The electrodes 33 are aligned in a longitudinal direction, and two adjacent electrodes 33 are electrically connected to each other by the bridge electrode 34. Such a structure makes it possible that the electrodes 33 and the electrodes 31 can be formed at the same time by processing the same conductive film. This can prevent variations in the thickness of these films, and can prevent the resistance value and the light transmittance of each electrode from varying from place to place. Note that although the electrodes 32 include the bridge electrodes 34 here, the electrodes 31 may have such a structure.

Figure 6D:
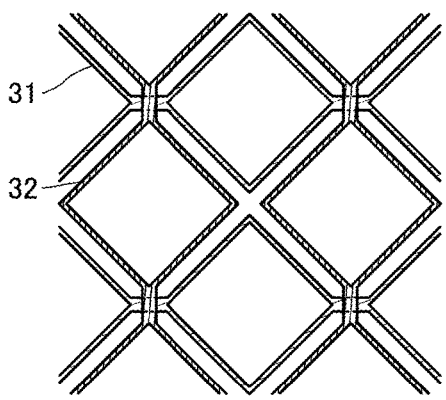

As shown in FIG. 6D, a design in which rhombic electrode patterns of the electrodes 31 and 32 shown in FIG. 6B are hollowed out and only edge portions are left may be used. At that time, when the electrodes 31 and the electrodes 32 are too small in width for the users to see, the electrodes 31 and the electrodes 32 can be formed using a light-blocking material such as a metal or an alloy, as described later. In addition, either the electrodes 31 or the electrodes 32 shown in FIG. 6D may include the above bridge electrodes 34.

One of the electrodes 31 is electrically connected to one of the wirings 41. One of the electrodes 32 is electrically connected to one of the wirings 42. Here, either one of the electrode 31 and the electrode 32 corresponds to the above row wiring, and the other corresponds to the above column wiring.

The IC 51 is an IC having a function corresponding to that included in the above circuit 11. Therefore, a signal output from the IC 51 is applied to either of the electrodes 31 and the electrodes 32 through the wirings 41 or the wirings 42. Current (or a potential) flowing through either of the electrodes 31 and the electrodes 32 is input to the IC 51 through the wirings 41 or the wirings 42. Although here an example in which the IC 51 is mounted over the FPC 50 is described, the IC 51 may be mounted over the substrate 30.

When a touch panel is formed in such a manner that the input device 10 is stacked over a display surface of the display panel, a light-transmitting conductive material is preferably used for the electrodes 31 and the electrodes 32. In the case where a light-transmitting conductive material is used for the electrodes 31 and the electrodes 32 and light from the display panel is extracted through the electrodes 31 or the electrodes 32, it is preferable that a conductive film containing the same conductive material be arranged between the electrodes 31 and the electrodes 32 as a dummy pattern. Part of a space between the electrodes 31 and the electrodes 32 is filled with the dummy pattern, which can reduce variation in light transmittance. As a result, unevenness in luminance of light transmitted through the input device 10 can be reduced.

As a light-transmitting conductive material, a conductive oxide such as indium oxide, indium tin oxide, indium zinc oxide, zinc oxide, or zinc oxide to which gallium is added can be used. Note that a film including graphene can be used as well. The film including graphene can be formed, for example, by reducing a film containing graphene oxide. As a reducing method, a method with application of heat or the like can be employed.

Further, a metal film or an alloy film which is thin enough to have a light-transmitting property can be used. For example, a metal material such as gold, silver, platinum, magnesium, nickel, tungsten, chromium, molybdenum, iron, cobalt, copper, palladium, or titanium, or an alloy material containing any of these metal materials can be used. Alternatively, a nitride of the metal material or the alloy material (e.g., titanium nitride), or the like may be used. Alternatively, a stacked film in which two or more of conductive films containing the above materials are stacked may be used.

For the electrodes 31 and the electrodes 32, a conductive film which is processed to be too thin to see by the users may be used. Such a conductive film is processed into a lattice shape (a mesh shape), for example, which makes it possible to achieve both high conductivity and high visibility of the display device. It is preferable that the conductive film have a portion in which the width is greater than or equal to 30 nm and less than or equal to 100 μm, preferably greater than or equal to 50 nm and less than or equal to 50 μm, and further preferably greater than or equal to 50 nm and less than or equal to 20 μm. In particular, the conductive film having the pattern width of 10 μm or less is extremely difficult to see by the users, which is preferable.

As examples, enlarged schematic views of part of the electrodes 31 or the electrodes 32 are shown in FIGS. 7A to 7D.

Figure 7A:
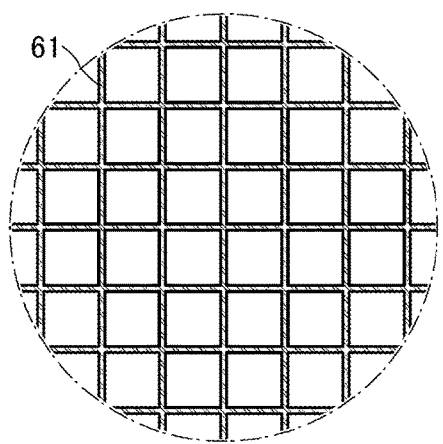
FIGS. 7A to 7D each illustrate a structure example of an input device of an embodiment.

FIG. 7A shows an example of the case in which a lattice-shape conductive film 61 is used. The conductive film 61 is preferably placed so as not to overlap the display element included in the display device because light from the display element is not blocked. In that case, it is preferable that the direction of the lattice be provided so as to be the same as the direction of the display element arrangement and that the pitch of the lattice be an integer multiple of the pitch of the display element arrangement.

Figure 7B:
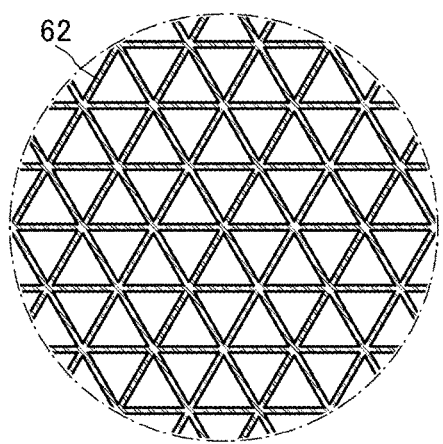

FIG. 7B shows an example of a lattice-shape conductive film 62, which is processed so as to be provided with triangle openings. Such a structure makes it possible to further reduce the resistance compared with the structure shown in FIG. 7A.

Figure 7C:
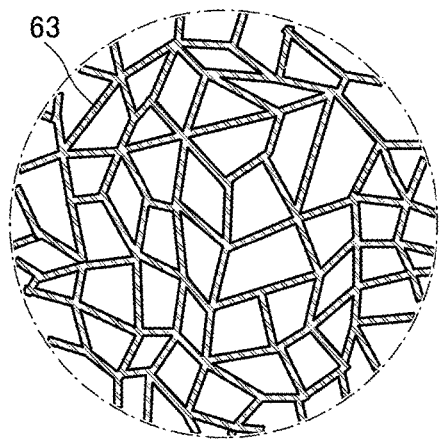

In addition, a conductive film 63, which has an irregular pattern shape, may be used as shown in FIG. 7C. Such a structure can prevent generation of moiré when overlapping with the display portion of the display device.

Figure 7D:
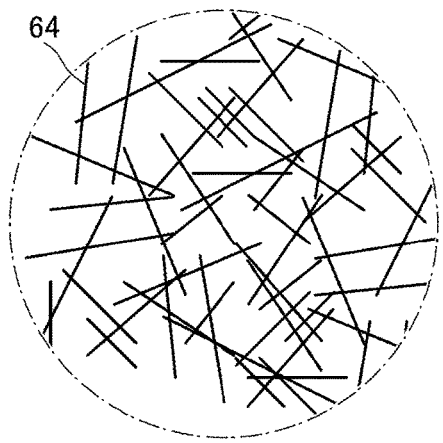

Conductive nanowires may be used for the electrodes 31 and the electrodes 32. FIG. 7D shows an example of the case in which nanowires 64 are used. The nanowires 64 are dispersed at appropriate density so as to be in contact with the adjacent nanowires, which can form a two-dimensional network; therefore, a conductive film with extremely high light-transmitting property can be provided. For example, a nanowire which has a mean value of the diameters of greater than or equal to 1 nm and less than or equal to 100 nm, preferably greater than or equal to 5 nm and less than or equal to 50 nm, further preferably greater than or equal to 5 nm and less than or equal to 25 nm can be used. As the nanowire 64, a metal nanowire such as an Ag nanowire, a Cu nanowire, and an Al nanowire, a carbon nanotube, or the like can be used. In the case of using an Ag nanowire, for example, light transmittance of 89% or more and a sheet resistance of 40 ohm/square or more and 100 ohm/square or less can be achieved.

Although examples in which a plurality of rhombuses are aligned in one direction are shown in FIG. 6A and the like as top surface shapes of the electrodes 31 and the electrodes 32, the shapes of the electrodes 31 and the electrodes 32 are not limited thereto and can have various top surface shapes such as a belt shape (a rectangular shape), a belt shape having a curve, and a zigzag shape. In addition, although the above shows the electrodes 31 and the electrodes 32 are arranged to be perpendicular to each other, they are not necessarily arranged to be perpendicular and the angle formed by two of the electrodes may be less than 90°.

Figure 8A:
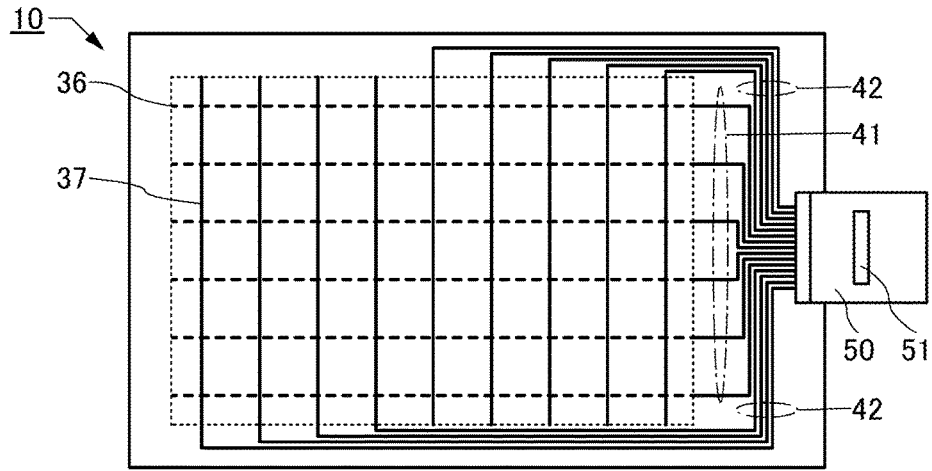
FIGS. 8A to 8C each illustrate a structure example of an input device of an embodiment.
Figure 8B:
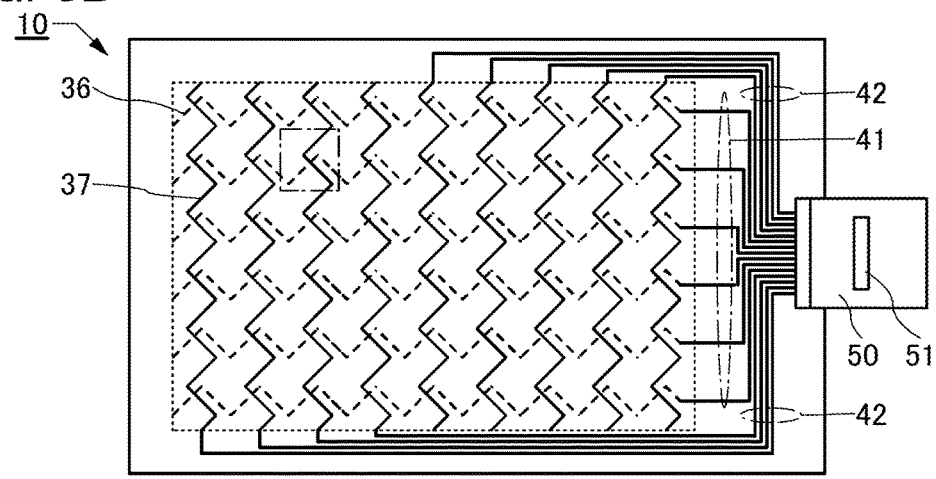
Figure 8C:
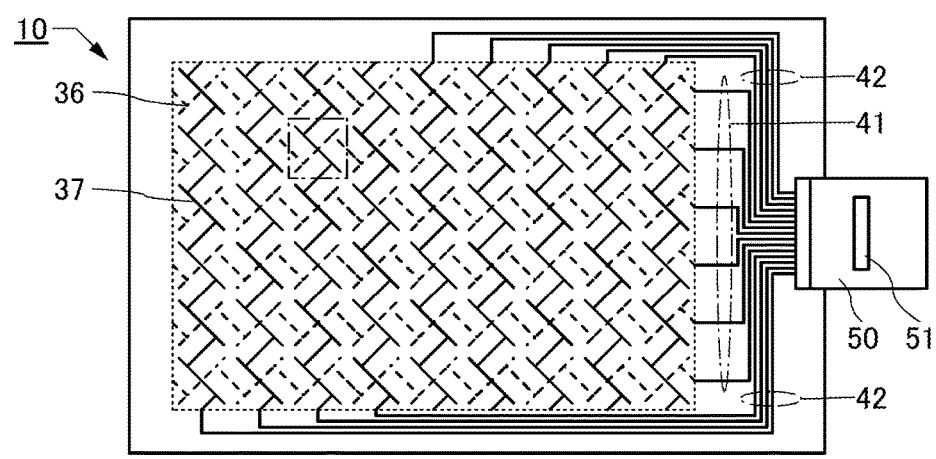

FIGS. 8A to 8C illustrate examples of the case where electrodes 36 and electrodes 37, which have a top surface shape of thin lines, are used instead of the electrodes 31 and the electrodes 32. FIG. 8A shows an example in which linear electrodes 36 and 37 are arranged so as to form a lattice shape.

FIG. 8B shows an example in which the electrodes 36 and the electrodes 37 have a top surface shape of a zigzag shape. As shown in FIG. 8B, the electrodes 36 and the electrodes 37 are arranged so as not to cross the straight-line portions at the centers but so as to place the centers of the straight-line portions in different positions from each other; therefore, the length of closely facing parallel parts of the electrodes 36 and the electrodes 37 can be longer. This is preferable because the capacitance between the electrodes can be increased and the sensitivity can be increased. Alternatively, as shown in FIG. 8C, the electrodes 36 and the electrodes 37 are arranged so as to have a design in which part of the straight-line portion of a zigzag shape is projected, which can increase the capacitance between the electrodes because the length of the parts facing each other can be longer even when the centers of the straight-line portions are placed in the same position.

Figure 9A:
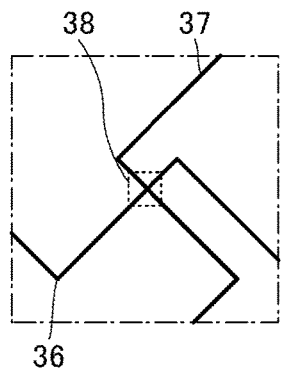
FIGS. 9A to 9F each illustrate a structure example of an input device of an embodiment.
Figure 9B:
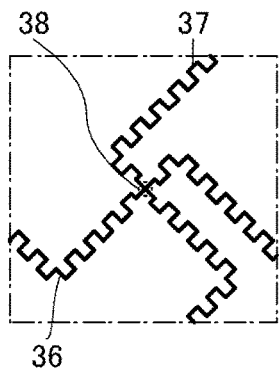
Figure 9C:
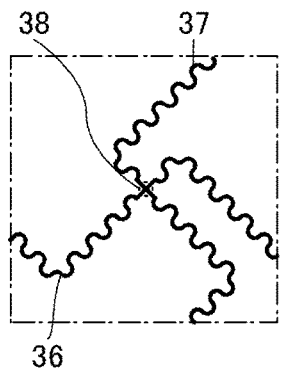
Figure 9D:
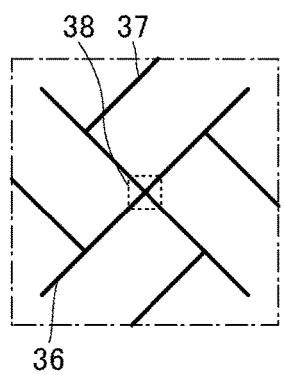
Figure 9E:
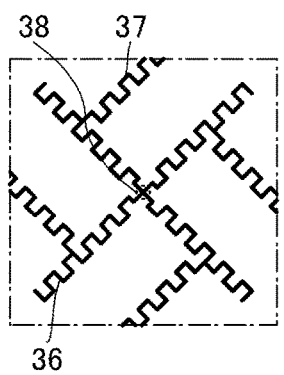
Figure 9F:
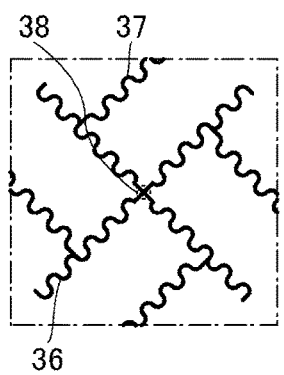

FIGS. 9A to 9C show enlarged views of a region surrounded by a dashed dotted line in FIG. 8B, and FIGS. 9D to 9F show enlarged views of a region surrounded by a dashed dotted line in FIG. 8C. In these drawings, the electrodes 36, the electrodes 37, and intersection portions 38 at which the electrodes 36 and the electrodes 37 intersect are illustrated. The straight-line portions of the electrodes 36 and the electrodes 37 shown in FIGS. 9A and 9D may have a serpentine shape that meanders with angled corners as shown in FIGS. 9B and 9E or may have a serpentine shape that continuously meanders as shown in FIGS. 9C and 9F.

The electrode shapes or the like have been described so far.

Structure Example of Touch Panel

A structure example of a touch panel will be described below with reference to drawings as an example of an input/output device including the input device of one embodiment of the present invention.

Structure Example

Figure 10A:
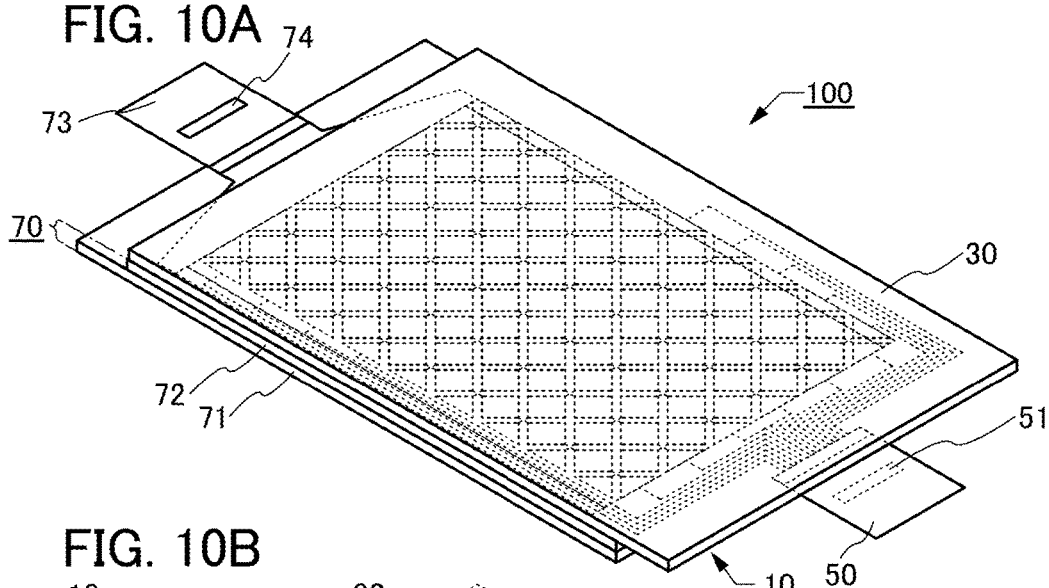
FIGS. 10A and 10B illustrate a structure example of an input/output device of an embodiment.
Figure 10B:
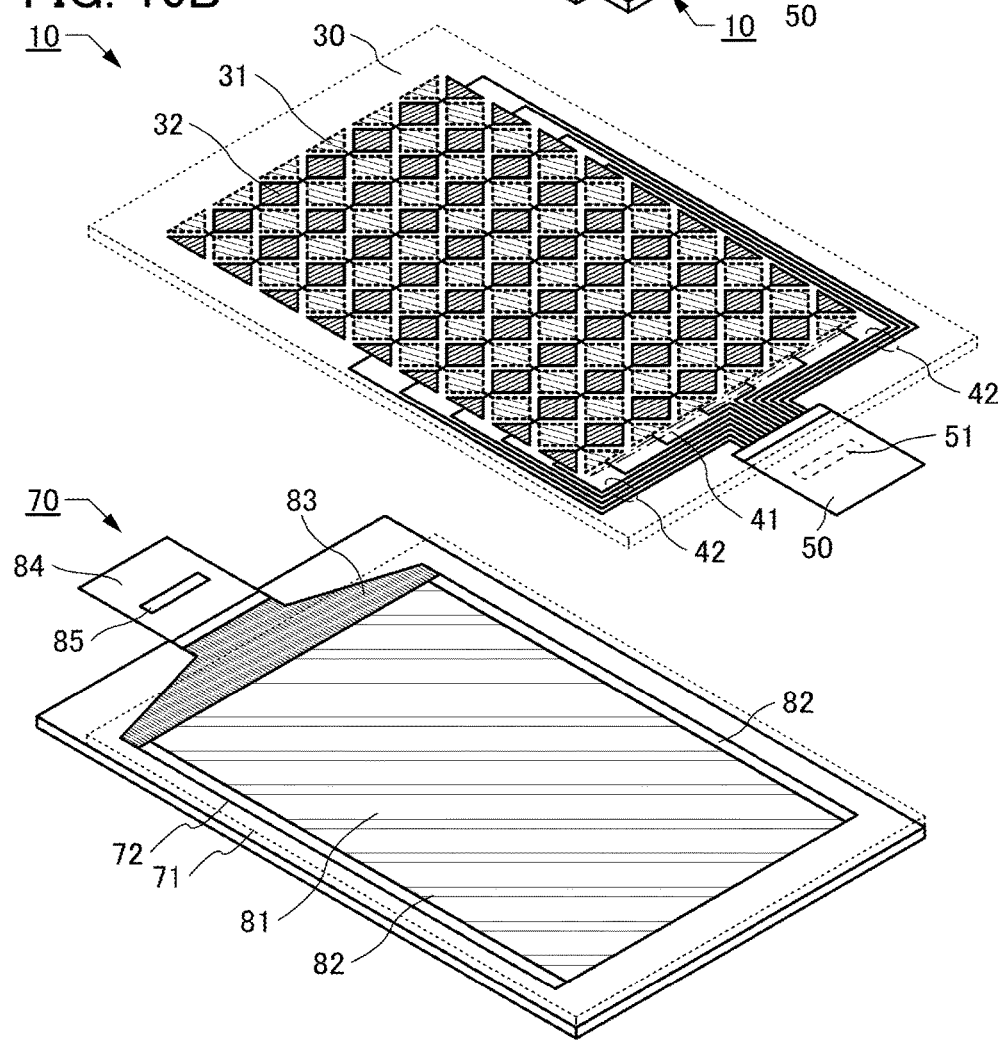

FIG. 10A is a schematic perspective view of a touch panel 100. FIG. 10B is a developed view of the schematic perspective view of FIG. 10A. Note that only typical components are illustrated for simplicity. In FIG. 10B, some components (such as the substrate 30 and a substrate 71) are shown only in dashed outline.

The touch panel 100 includes the input device 10 and a display panel 70, which are provided to overlap with each other.

The above description can be referred to for the structure of the input device 10. FIGS. 10A and 10B illustrate an example where the input device 10 includes the substrate 30, the plurality of electrodes 31, the plurality of electrodes 32, the plurality of wirings 41, the plurality of wirings 42, the FPC 50, and the IC 51.

As the input device 10, for example, a capacitive touch sensor can be used. Examples of the capacitive touch sensor are a surface capacitive touch sensor and a projected capacitive touch sensor. Examples of the projected capacitive touch sensor are a self capacitive touch sensor and a mutual capacitive touch sensor, which differ mainly in the driving method. The use of a mutual capacitive type is preferable because multiple points can be sensed simultaneously. An example of using a projected capacitive touch sensor will be described below.

Note that one embodiment of the present invention is not limited to this example, and any of a variety of sensors capable of sensing the proximity or touch of an object to be sensed, such as a finger or a stylus, can be used as the input device 10.

The display panel 70 includes the substrate 71 and a substrate 72 which are provided so as to face each other. A display portion 81, a driver circuit 82, a wiring 83, and the like are provided over the substrate 71. The substrate 71 is also provided with an FPC 84 which is electrically connected to the wiring 83. In the example illustrated in FIGS. 10A and 10B, an IC 85 is provided over the FPC 84.

The display portion 81 includes at least a plurality of pixels. Each of the pixels includes at least one display element. It is preferable that each of the pixels include a transistor and a display element. As the display element, typically, a light-emitting element such as an organic EL element, a liquid crystal element, or the like can be used.

As the driver circuit 82, a circuit serving as a scan line driver circuit or a signal line driver circuit, for example, can be used.

The wiring 83 has a function of supplying a signal or power to the display portion 81 or the driver circuit 82. The signal or power is input to the wiring 83 from the outside or the IC 85 through the FPC 84.

In the example illustrated in FIGS. 10A and 10B, the IC 85 is mounted on the FPC 84 by a chip-on-film (COF) method. As the IC 85, an IC serving as a scan line driver circuit or a signal line driver circuit, for example, can be used. Note that it is possible that the IC 85 is not provided when the display panel 70 includes circuits serving as a scan line driver circuit and a signal line driver circuit or when circuits serving as a scan line driver circuit and a signal line driver circuit are externally provided and a signal for driving the display panel 70 is input through the FPC 84. The IC 85 may be directly mounted on the substrate 71 by a chip-on-glass (COG) method or the like.

Cross-Sectional Structure Example 1

Figure 11:
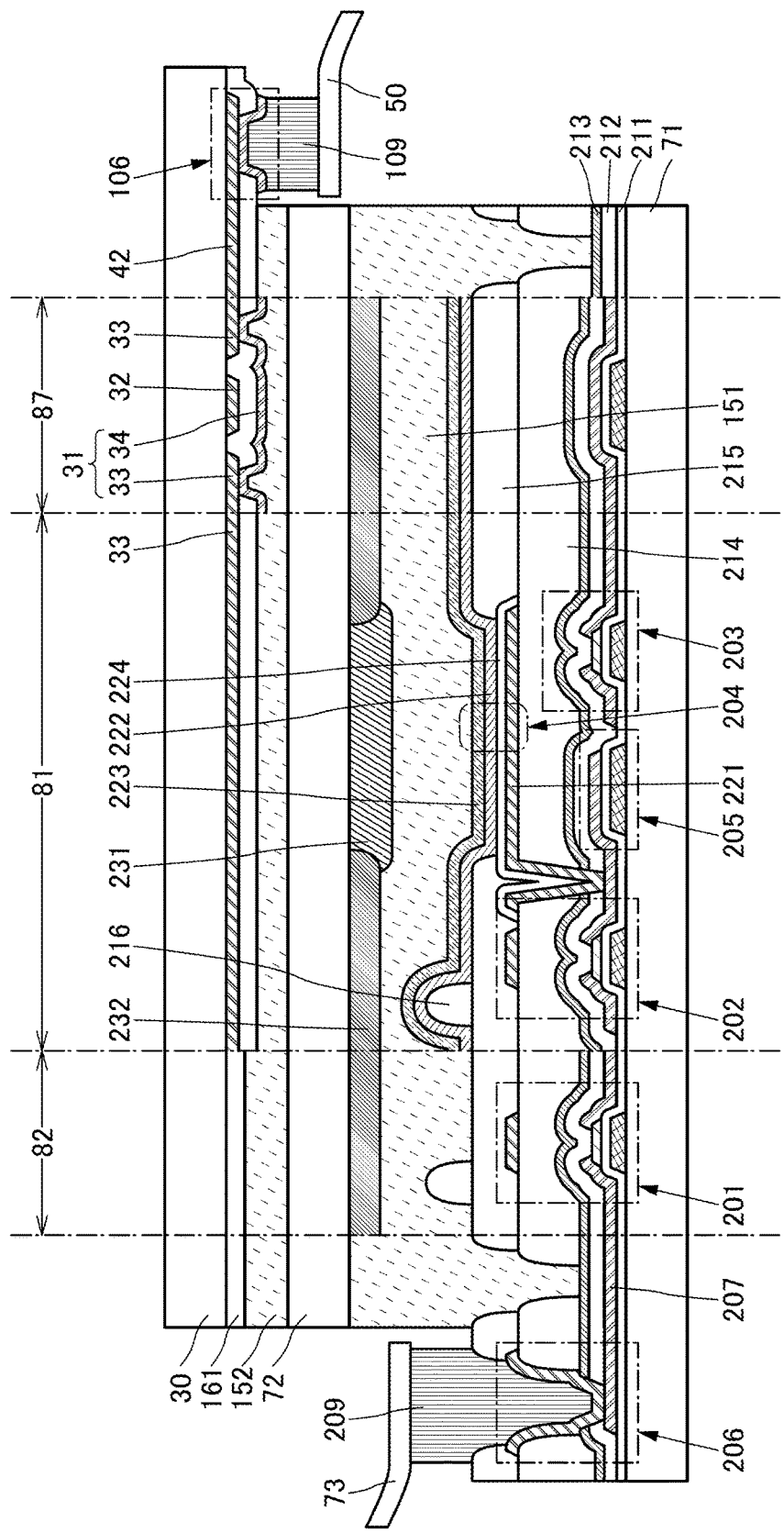
FIG. 11 illustrates a structure example of an input/output device of an embodiment

Next, an example of a cross-sectional structure of the touch panel 100 will be described with reference to a drawing. FIG. 11 is a schematic cross-sectional view of the touch panel 100. FIG. 11 illustrates cross sections of a region including the FPC 73, a region including the driver circuit 82, a region including the display portion 81, and a region including the FPC 50 in FIG. 10A.

The substrate 71 and the substrate 72 are attached to each other with an adhesive layer 151. The substrate 72 and the substrate 30 are attached to each other with an adhesive layer 152. Here, a structure including the substrate 71, the substrate 72, and components provided therebetween corresponds to the display panel 70. A structure including the substrate 30 and components formed over the substrate 30 corresponds to the input device 10.

<Display Panel 70>

The substrate 71 is provided with a transistor 201, a transistor 202, a transistor 203, a display element 204, a capacitor 205, a connection portion 206, a wiring 207, and the like.

An insulating layer 211, an insulating layer 212, an insulating layer 213, an insulating layer 214, an insulating layer 215, a spacer 216, and the like are provided over the substrate 71. A portion of the insulating layer 211 functions as a gate insulating layer of each transistor, and another portion thereof functions as a dielectric of the capacitor 205. The insulating layer 212, the insulating layer 213, and the insulating layer 214 are provided to cover each transistor, the capacitor 205, and the like. The insulating layer 214 functions as a planarization layer. Note that an example where the three insulating layers, the insulating layers 212, 213, and 214, are provided to cover the transistors and the like is described here; however, the present invention is not limited to this example, and four or more insulating layers, a single insulating layer, or two insulating layers may be provided. The insulating layer 214 functioning as a planarization layer is not necessarily provided when not needed.

The display element 204 is provided over the insulating layer 214. An example where a top-emission organic EL element is used as the display element 204 is described here. The display element 204 emits light to the second electrode 223 side. The transistors 202 and 203, the capacitor 205, a wiring, and the like are provided to overlap with a light-emitting region of the display element 204. Thus, an aperture ratio of the display portion 81 can be increased.

The display element 204 includes an EL layer 222 between a first electrode 221 and a second electrode 223. An optical adjustment layer 224 is provided between the first electrode 221 and the EL layer 222. The insulating layer 215 is provided to cover end portions of the first electrode 221 and the optical adjustment layer 224.

FIG. 11 illustrates a cross section of one pixel as an example of the display portion 81. An example where the pixel includes the transistor 202 for current control, the transistor 203 for switching control, and the capacitor 205 is described here. One of a source and a drain of the transistor 202 and one electrode of the capacitor 205 are electrically connected to the first electrode 221 through an opening provided in the insulating layers 212, 213, and 214.

FIG. 11 illustrates an example of the driver circuit 82 in which the transistor 201 is provided.

In the example illustrated in FIG. 11, the transistors 201 and 202 each have a structure in which a semiconductor layer where a channel is formed is provided between two gate electrodes. Such transistors can have a higher field-effect mobility and thus have higher on-state current than other transistors. Consequently, a circuit capable of high-speed operation can be obtained. Furthermore, the area occupied by a circuit can be reduced. The use of the transistor having high on-state current can reduce signal delay in wirings and can reduce display luminance variation even in a display panel in which the number of wirings is increased because of increase in size or resolution.

Note that the transistors provided in the driver circuit 82 and the display portion 81 may have the same structure or different structures.

A material through which impurities such as water or hydrogen do not easily diffuse is preferably used for at least one of the insulating layers 212 and 213 which cover the transistors. That is, the insulating layer 212 or the insulating layer 213 can function as a barrier film. Such a structure can effectively suppress diffusion of the impurities into the transistors from the outside, and a highly reliable touch panel can be achieved.

The spacer 216 is provided over the insulating layer 215 and has a function of adjusting the distance between the substrate 71 and the substrate 72. In the example illustrated in FIG. 11, there is a gap between the spacer 216 and a light-blocking layer 232, which may however be in contact with each other. Although the spacer 216 is provided on the substrate 71 side in the structure described here, the spacer 216 may be provided on the substrate 72 side (e.g., in a position closer to the substrate 71 than that of the light-blocking layer 232). Alternatively, a particulate spacer may be used instead of the spacer 216. Although a material such as silica can be used for the particulate spacer, an elastic material such as an organic resin or rubber is preferably used. In some cases, the particulate spacer may be vertically crushed.

A coloring layer 231, the light-blocking layer 232, and the like are provided on the substrate 71 side of the substrate 72. The light-blocking layer 232 has an opening, and the opening is provided to overlap with the display region of the display element 204.

As examples of a material that can be used for the light-blocking layer 232, carbon black, a metal oxide, and a composite oxide containing a solid solution of a plurality of metal oxides can be given. Stacked films containing the material of the coloring layer 231 can also be used for the light-blocking layer 232. For example, a material containing an acrylic resin can be used for the coloring layer 231, and a stacked-layer structure of a film containing a material of a coloring layer which transmits light of a certain color and a film containing a material of a coloring layer which transmits light of another color can be employed. It is preferable that the coloring layer 231 and the light-blocking layer 232 be formed using the same material because the same manufacturing apparatus can be used and the process can be simplified.

As examples of a material that can be used for the coloring layer 231, a metal material, a resin material, and a resin material containing a pigment or dye can be given.

An insulating layer which functions as an overcoat may be provided to cover the coloring layer 231 and the light-blocking layer 232.

The connection portion 206 is provided in a region near an end portion of the substrate 71. The connection portion 206 is electrically connected to the FPC 73 through a connection layer 209. In the example of the structure illustrated in FIG. 11, the connection portion 206 is formed by stacking a portion of the wiring 207 which is electrically connected to the driver circuit 82 and a conductive layer which is formed by processing a conductive film used for forming the first electrode 221. When the connection portion 206 is formed by stacking two or more conductive layers as described above, electric resistance can be reduced and mechanical strength of the connection portion 206 can be increased.

Furthermore, FIG. 11 illustrates a cross-sectional structure of a crossing portion 87 where a wiring formed by processing a conductive film used for forming the gate electrode of the transistor and a wiring formed by processing a conductive film used for forming the source electrode and the drain electrode of the transistor cross each other.

<Input Device 10>

The electrode 31 and the electrode 32 are provided on the substrate 72 side of the substrate 30. An example where the electrode 31 includes an electrode 33 and a bridge electrode 34 is described here. As illustrated in the crossing portion 87 in FIG. 11, the electrode 32 and the electrode 33 are formed on the same plane. The bridge electrode 34 is provided over an insulating layer 161 which covers the electrode 32 and the electrode 33. The bridge electrode 34 electrically connects two electrodes 33, between which the electrode 32 is provided, through openings formed in the insulating layer 161.

A connection portion 106 is provided in a region near an end portion of the substrate 30. The connection portion 106 is electrically connected to the FPC 50 through a connection layer 109. In the example of the structure illustrated in FIG. 11, the connection portion 106 is formed by stacking a portion of the wiring 42 and a conductive layer which is formed by processing a conductive film used for forming the bridge electrode 34.

As the connection layer 109 or the connection layer 209, an anisotropic conductive film (ACF), an anisotropic conductive paste (ACP), or the like can be used.

The substrate 30 here can be used also as a substrate with which an object to be sensed, such as a finger or a stylus, is to be in contact. In that case, a protective layer (such as a ceramic coat) is preferably provided over the substrate 30. The protective layer can be formed using an inorganic insulating material such as silicon oxide, aluminum oxide, yttrium oxide, or yttria-stabilized zirconia (YSZ). Alternatively, tempered glass may be used for the substrate 30. Physical or chemical processing by an ion exchange method, a wind tempering method, or the like may be performed on the tempered glass, so that compressive stress is applied on the surface. In the case where the touch sensor is provided on one side of the tempered glass and the opposite side of the tempered glass is provided on, for example, the outermost surface of an electronic device for use as a touch surface, the thickness of the whole device can be decreased.

<Components>

The above components will be described below.

A substrate having a flat surface can be used as the substrate included in the touch panel. The substrate through which light emitted from the display element is extracted is formed using a material that transmits the light. For example, a material such as glass, quartz, ceramic, sapphire, or an organic resin can be used.

The weight and thickness of the touch panel can be decreased by using a thin substrate. Furthermore, a flexible touch panel can be obtained by using a substrate that is thin enough to have flexibility.

Examples of glass include alkali-free glass, barium borosilicate glass, aluminoborosilicate glass, and the like.

Examples of materials having flexibility and a light-transmitting property with respect to visible light include glass that is thin enough to have flexibility, polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, a polyvinyl chloride resin, and a polytetrafluoroethylene (PTFE) resin. In particular, a material whose thermal expansion coefficient is low is preferred, and for example, a polyamide imide resin, a polyimide resin, or PET can be suitably used. A substrate in which a glass fiber is impregnated with an organic resin or a substrate whose thermal expansion coefficient is reduced by mixing an organic resin with an inorganic filler can also be used. A substrate using such a material is lightweight, and thus a touch panel using this substrate can also be lightweight.

Since the substrate through which light is not extracted does not need a light-transmitting property, a metal substrate using a metal material or an alloy material or the like can be used as well as the above-mentioned substrates. A metal material and an alloy material, which have high thermal conductivity, are preferred because they can easily conduct heat to the whole substrate and accordingly can prevent a local temperature rise in the touch panel. To obtain flexibility or bendability, the thickness of a metal substrate is preferably greater than or equal to 10 µm and less than or equal to 200 µm, more preferably greater than or equal to 20 µm and less than or equal to 50 µm.

Although there is no particular limitation on a material of the metal substrate, it is preferable to use, for example, aluminum, copper, nickel, a metal alloy such as an aluminum alloy or stainless steel.

It is possible to use a substrate subjected to insulation treatment in such a manner that a surface of a conductive substrate is oxidized or an insulating film is formed on the surface. The insulating film may be formed by, for example, a coating method such as a spin-coating method or a dipping method, an electrodeposition method, an evaporation method, or a sputtering method. An oxide film may be formed on the substrate surface by exposure to or heating in an oxygen atmosphere or by an anodic oxidation method or the like.

The flexible substrate may have a stacked structure of a layer of any of the above-mentioned materials and a hard coat layer (e.g., a silicon nitride layer) which protects a surface of the touch panel from damage or the like, a layer (e.g., an aramid resin layer) which can disperse pressure, or the like. Furthermore, to suppress a decrease in the lifetime of the light-emitting element due to moisture or the like, an insulating film with low water permeability may be provided. For example, a film containing nitrogen and silicon (e.g., a silicon nitride film, a silicon oxynitride film) or a film containing nitrogen and aluminum (e.g., an aluminum nitride film) may be provided.

The substrate may be formed by stacking a plurality of layers. When a glass layer is used, a barrier property against water and oxygen can be improved and thus a reliable touch panel can be provided.

For example, a substrate in which a glass layer, an adhesive layer, and an organic resin layer are stacked in this order from the side closer to a light-emitting element can be used. The thickness of the glass layer is greater than or equal to 20 µm and less than or equal to 200 µm, preferably greater than or equal to 25 µm and less than or equal to 100 µm. With such a thickness, the glass layer can have both a high barrier property against water and oxygen and a high flexibility. The thickness of the organic resin layer is greater than or equal to 10 µm and less than or equal to 200 µm, preferably greater than or equal to 20 µm and less than or equal to 50 µm. With such an organic resin layer provided on an outer side of the glass layer, breakage or a crack of the glass layer can be inhibited, resulting in increased mechanical strength. With the substrate that includes such a composite material of a glass material and an organic resin, a highly reliable and flexible touch panel can be provided.

The transistors each include a conductive layer functioning as the gate electrode, the semiconductor layer, a conductive layer functioning as the source electrode, a conductive layer functioning as the drain electrode, and an insulating layer functioning as a gate insulating layer. FIG. 11 shows the case of using bottom-gate transistors.

Note that there is no particular limitation on the structure of the transistor included in the touch panel of one embodiment of the present invention. For example, a forward staggered transistor or an inverted staggered transistor may be used. A top-gate transistor or a bottom-gate transistor may be used. There is no particular limitation on a semiconductor material used for the transistor, and an oxide semiconductor, silicon, or germanium can be used, for example.

There is no particular limitation on the crystallinity of a semiconductor material used for the transistor, and an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used, in which case deterioration of the transistor characteristics can be suppressed.

As a semiconductor material for the semiconductor layer of the transistor, an element of Group 14, a compound semiconductor, or an oxide semiconductor can be used, for example. A semiconductor containing silicon, a semiconductor containing gallium arsenide, an oxide semiconductor containing indium, or the like can be typically used.

An oxide semiconductor is preferably used as a semiconductor in which a channel of the transistor is formed. In particular, an oxide semiconductor having a wider band gap than silicon is preferably used. A semiconductor material having a wider band gap and a lower carrier density than silicon is preferably used because off-state current of the transistor can be reduced.

For example, the oxide semiconductor preferably contains at least indium (In) or zinc (Zn). More preferably, the oxide semiconductor is In-M-Zn-based oxide (M is a metal such as Al, Ti, Ga, Ge, Y, Zr, Sn, La, Ce, or Hf).

As the semiconductor layer, it is preferable to use an oxide semiconductor film including a plurality of crystal parts. Specifically, the c-axes of the crystal parts are oriented substantially perpendicular to a surface on which the semiconductor layer is formed or the top surface of the semiconductor layer, and no grain boundary is observed between adjacent crystal parts.

Such an oxide semiconductor without grain boundary prevents a crack in an oxide semiconductor film from being caused by stress generated when the display panel is bent. Consequently, such an oxide semiconductor is preferably used for a flexible touch panel that is bent when used.

The use of such an oxide semiconductor for the semiconductor layer achieves a highly reliable transistor with little change in the electrical characteristics.

Charge accumulated in a capacitor through the transistor can be retained for a long time because of low off-state current of the transistor. The use of such a transistor in pixels allows a driver circuit to stop while the gray level of an image displayed in display regions is maintained. As a result, a display device with extremely low power consumption is obtained.

Alternatively, silicon is preferably used as a semiconductor in which a channel of the transistor is formed. Silicon may be amorphous silicon but is preferably silicon having crystallinity, such as microcrystalline silicon, polycrystalline silicon, or single crystal silicon. In particular, polycrystalline silicon can be formed at a lower temperature than single crystal silicon and has higher field-effect mobility and higher reliability than amorphous silicon. The use of such a polycrystalline semiconductor in pixels increases the aperture ratio of the pixels. Moreover, by using a polycrystalline semiconductor, a scan line driver circuit and a signal line driver circuit can be formed over a substrate where pixels are provided even when the pixel density is quite high; thus, the number of components included in an electronic device can be decreased.

Conductive layers such as a gate, a source, and a drain of the transistor and wirings and electrodes in the touch panel can have a single-layer structure or a stacked-layer structure using any of metals such as aluminum, titanium, chromium, nickel, copper, yttrium, zirconium, molybdenum, silver, tantalum, and tungsten or an alloy containing any of these metals as its main component. For example, it is possible to employ a single-layer structure of an aluminum film containing silicon; a two-layer structure in which an aluminum film is stacked over a titanium film; a two-layer structure in which an aluminum film is stacked over a tungsten film; a two-layer structure in which a copper film is stacked over a copper-magnesium-aluminum alloy film; a two-layer structure in which a copper film is stacked over a titanium film; a two-layer structure in which a copper film is stacked over a tungsten film; a three-layer structure in which a titanium film or a titanium nitride film, an aluminum film or a copper film, and a titanium film or a titanium nitride film are stacked in this order; or a three-layer structure in which a molybdenum film or a molybdenum nitride film, an aluminum film or a copper film, and a molybdenum film or a molybdenum nitride film are stacked in this order. Note that a transparent conductive material containing indium oxide, tin oxide, or zinc oxide may be used. Copper containing manganese is preferably used because controllability of shape processing by etching is increased.

As a light-transmitting material that can be used for conductive layers such as wirings and electrodes in the touch panel, a conductive oxide such as indium oxide, indium tin oxide, indium zinc oxide, zinc oxide, or zinc oxide to which gallium is added, or graphene can be used. It is also possible to use a metal material such as gold, silver, platinum, magnesium, nickel, tungsten, chromium, molybdenum, iron, cobalt, copper, palladium, or titanium; an alloy material containing any of these metal materials; or a nitride of the metal material (e.g., titanium nitride). In the case of using the metal material or the alloy material (or the nitride thereof), the film thickness is set small enough to transmit light. Alternatively, a stacked film of any of the above materials can be used for the conductive layers. For example, a stacked film of indium tin oxide and an alloy of silver and magnesium is preferably used because the conductivity can be increased.

Examples of an insulating material that can be used for the insulating layers, the overcoat, the spacer, and the like include a resin such as an acrylic resin or an epoxy resin, a resin having a siloxane bond, and an inorganic insulating material such as silicon oxide, silicon oxynitride, silicon nitride oxide, silicon nitride, or aluminum oxide.

The light-emitting element is preferably provided between a pair of insulating films with low water permeability, in which case impurities such as water can be prevented from entering the light-emitting element, thereby preventing a decrease in device reliability.

Examples of the insulating film with low water permeability include a film containing nitrogen and silicon (e.g., a silicon nitride film and a silicon nitride oxide film) and a film containing nitrogen and aluminum (e.g., an aluminum nitride film). Alternatively, a silicon oxide film, a silicon oxynitride film, an aluminum oxide film, or the like may be used.

For example, the moisture vapor transmission rate of the insulating film with low water permeability is lower than or equal to $1 \times 10^{-5}$ [g/(m$^2$·day)], preferably lower than or equal to $1 \times 10^{-6}$ [g/(m$^2$·day)], further preferably lower than or equal to $1 \times 10^{-7}$ [g/(m$^2$·day)], still further preferably lower than or equal to $1 \times 10^{-8}$ [g/(m$^2$·day)].

For the adhesive layers, any of a variety of types of curable adhesives, e.g., a light curable adhesive such as a UV curable adhesive, a reactive curable adhesive, a heat curable adhesive, and an anaerobic adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, an ethylene vinyl acetate (EVA) resin, and the like. In particular, a material with low moisture permeability, such as an epoxy resin, is preferred. Alternatively, a two-component type resin may be used. Still alternatively, an adhesive sheet or the like may be used.

Furthermore, the resin may include a drying agent. For example, a substance that adsorbs moisture by chemical adsorption, such as oxide of an alkaline earth metal (e.g., calcium oxide or barium oxide), can be used. Alternatively, a substance that adsorbs moisture by physical adsorption, such as zeolite or silica gel, may be used. The drying agent is preferably included because it can prevent an impurity such as moisture from entering a functional element, thereby improving the reliability of the display panel.

In addition, a filler with a high refractive index or a light-scattering member may be mixed into the resin, in which case the efficiency of light extraction from the light-emitting element can be improved. For example, titanium oxide, barium oxide, zeolite, zirconium, or the like can be used.

As the light-emitting element, a self-luminous element can be used, and an element whose luminance is controlled by current or voltage is included in the category of the light-emitting element. For example, a light-emitting diode (LED), an organic EL element, an inorganic EL element, or the like can be used.

The light-emitting element may be a top-emission, bottom-emission, or dual-emission light-emitting element. A conductive film that transmits visible light is used as the electrode through which light is extracted. A conductive film that reflects visible light is preferably used as the electrode through which light is not extracted.

The EL layer includes at least a light-emitting layer. In addition to the light-emitting layer, the EL layer may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

For the EL layer, either a low-molecular compound or a high-molecular compound can be used, and an inorganic compound may also be used. Each of the layers included in the EL layer can be formed by any of the following methods: an evaporation method (including a vacuum evaporation method), a transfer method, a printing method, an inkjet method, a coating method, and the like.

When a voltage higher than the threshold voltage of the light-emitting element is applied between a cathode and an anode, holes are injected to the EL layer from the anode side and electrons are injected to the EL layer from the cathode side. The injected electrons and holes are recombined in the EL layer and a light-emitting substance contained in the EL layer emits light.

In the case where a light-emitting element emitting white light is used as the light-emitting element, the EL layer preferably contains two or more kinds of light-emitting substances. For example, the two or more kinds of light-emitting substances are selected so as to emit light of complementary colors to obtain white light emission. Specifically, it is preferable to contain two or more selected from light-emitting substances emitting light of red (R), green (G), blue (B), yellow (Y), orange (O), and the like and light-emitting substances emitting light containing two or more of spectral components of R, G, and B. The light-emitting element preferably emits light with a spectrum having two or more peaks in the wavelength range of a visible light region (e.g., 350 nm to 750 nm). An emission spectrum of a material emitting light having a peak in a yellow wavelength range preferably includes spectral components also in green and red wavelength ranges.

More preferably, a light-emitting layer containing a light-emitting material emitting light of one color and a light-emitting layer containing a light-emitting material emitting light of another color are stacked in the EL layer. For example, the plurality of light-emitting layers in the EL layer may be stacked in contact with each other or may be stacked with a separation layer therebetween. For example, a separation layer may be provided between a fluorescent layer and a phosphorescent layer.

The separation layer can be provided to prevent an energy transfer by the Dexter mechanism (particularly triplet energy transfer) from a phosphorescent material or the like in an excited state which is generated in the phosphorescent layer to a fluorescent material or the like in the fluorescent layer. The thickness of the separation layer may be approximately several nanometers, specifically 0.1 nm or more and 20 nm or less, 1 nm or more and 10 nm or less, or 1 nm or more and 5 nm or less. The separation layer contains a single material (preferably a bipolar material) or a plurality of materials (preferably, a hole-transport material and an electron-transport material).

The separation layer may be formed using a material contained in the light-emitting layer in contact with the separation layer. This facilitates the manufacture of the light-emitting element and reduces the drive voltage. For example, in the case where the phosphorescent layer contains a host material, an assist material, and the phosphorescent material (a guest material), the separation layer may contain the host material and the assist material. In other words, the separation layer includes a region which does not contain the phosphorescent material, while the phosphorescent layer includes a region containing the phosphorescent material. Thus, the separation layer and the phosphorescent layer can be separately deposited depending on the presence of the phosphorescent material. Furthermore, such a structure enables the separation layer and the phosphorescent layer to be deposited in the same chamber, which leads to a reduction in manufacturing cost.

The conductive film that transmits visible light can be formed using, for example, indium oxide, indium tin oxide (ITO), indium zinc oxide, zinc oxide, or zinc oxide to which gallium is added. Alternatively, a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) can be formed thin so as to have a light-transmitting property. Alternatively, a stacked film of any of the above materials can be used for the conductive layers. For example, a stacked film of ITO and an alloy of silver and magnesium is preferably used because the conductivity can be increased. Further alternatively, graphene or the like may be used.

For the conductive film that reflects visible light, for example, a metal material such as aluminum, gold, platinum, silver, nickel, tungsten, chromium, molybdenum, iron, cobalt, copper, or palladium or an alloy containing any of these metal materials can be used. Furthermore, lanthanum, neodymium, germanium, or the like may be added to the metal material or the alloy. Furthermore, an alloy containing aluminum (an aluminum alloy) such as an alloy of aluminum and titanium, an alloy of aluminum and nickel, or an alloy of aluminum and neodymium; or an alloy containing silver such as an alloy of silver and copper, an alloy of silver, copper, and palladium, or an alloy of silver and magnesium can be used for the conductive film. An alloy containing silver and copper is preferable because of its high heat resistance. Furthermore, when a metal film or a metal oxide film is stacked on and in contact with an aluminum alloy film, oxidation of the aluminum alloy film can be prevented. Examples of materials for the metal film or the metal oxide film include titanium and titanium oxide. Alternatively, the above conductive film that transmits visible light and a film containing a metal material may be stacked. For example, a stacked film of silver and ITO or a stacked film of an alloy of silver and magnesium and ITO can be used.

Each of the electrodes can be formed by an evaporation method or a sputtering method. Alternatively, a discharging method such as an inkjet method, a printing method such as a screen printing method, or a plating method may be used.

The light-emitting element may be a single element including one EL layer or a tandem element in which a plurality of EL layers are stacked with a charge generation layer therebetween.

The above is the description of the components.

Modification Example 1 of Cross-Sectional Structure Example

Figure 12:
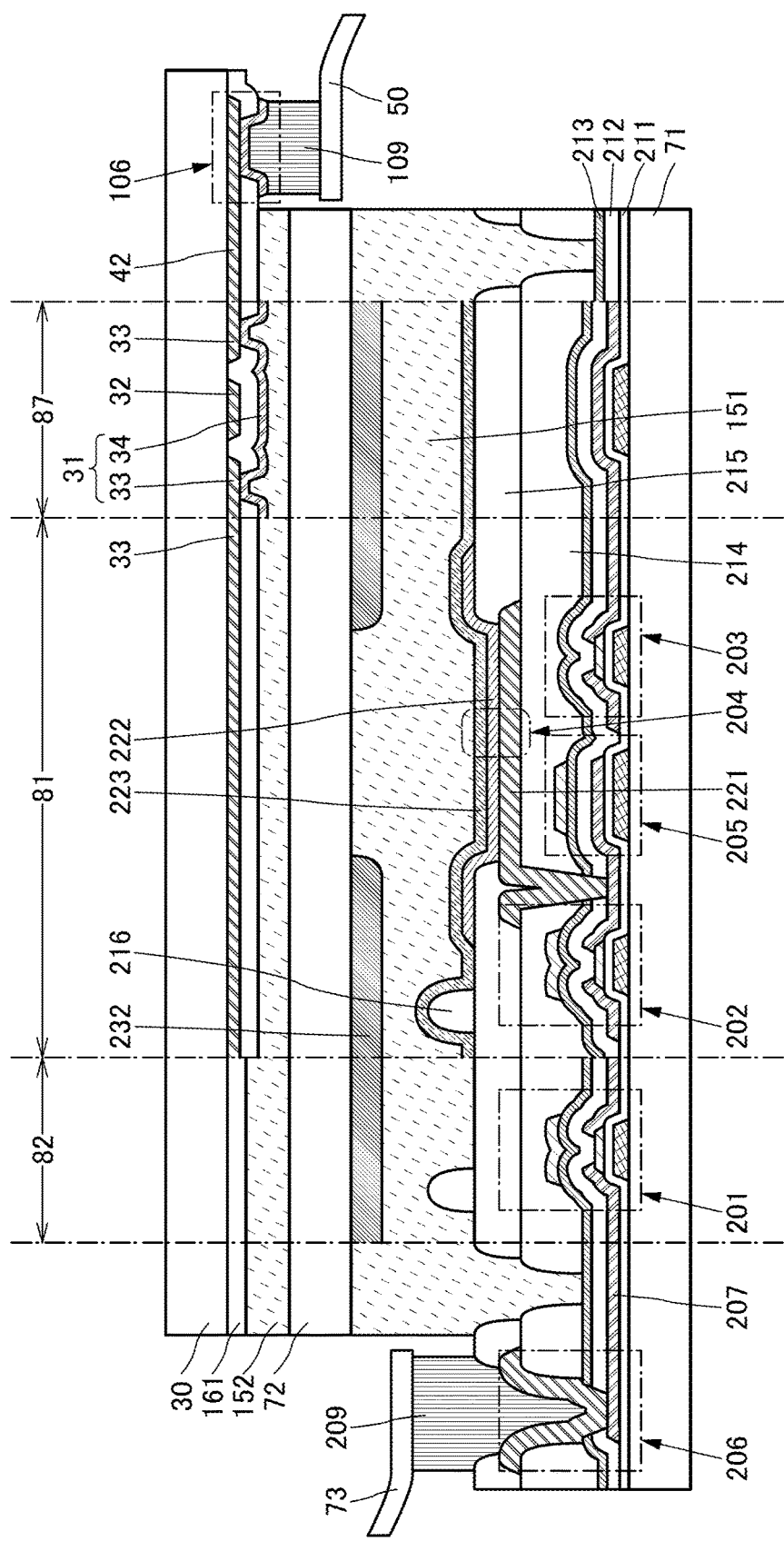
FIG. 12 illustrates a structure example of an input/output device of an embodiment.

FIG. 12 illustrates a cross-sectional structure example of the touch panel 100 which partly differs from that in FIG. 11. Note that descriptions of the portions already described are omitted and different portions are described below.

In FIG. 12, in the transistors 201 and 202, conductive layers functioning as their second gates are provided between the insulating layer 213 and the insulating layer 214. Such a structure is preferable to the structure in FIG. 11 because the voltage to be applied to the second gates can be lowered.

FIG. 12 illustrates an example where the display element 204 is formed by a separate coloring method. Specifically, pixels for different colors include different EL layers 222 which emit light of the respective colors. In a region outside the light-emitting region of the display element 204, an end portion of the EL layer 222 is covered with the second electrode 223. The EL layer 222 can be formed by, for example, an evaporation method using a metal mask, a printing method, an inkjet method, or the like.

In the example illustrated in FIG. 12, the optical adjustment layer 224 and the coloring layer 231 illustrated in FIG. 11 are not provided.

Note that the structure of the transistors, the structure of the display element 204, and the like which are illustrated here can be interchanged with any of the structures of transistors, display elements, and the like which are illustrated in FIG. 11 and in the following cross-sectional structures.

The above is the description of the modification example 1 of the cross-sectional structure example.

Structure examples which partly differ from the above cross-sectional structure example 1 will be described below with reference to drawings. Note that descriptions of the portions already described are omitted and different portions are described below.

Cross-Sectional Structure Example 2

Figure 13:
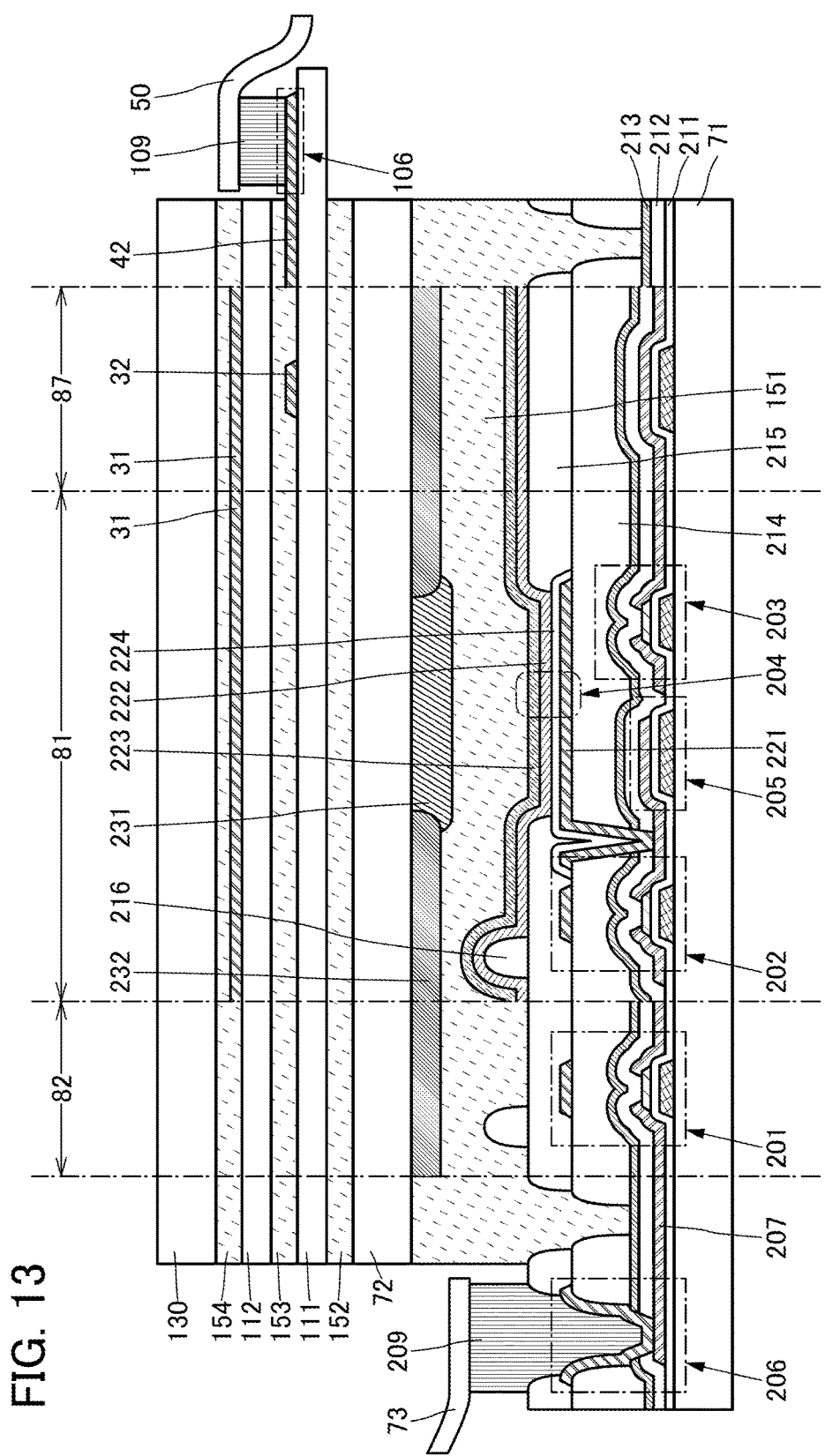
FIG. 13 illustrates a structure example of an input/output device of an embodiment.

A touch panel illustrated in FIG. 13 includes a substrate 111 and a substrate 112. The substrate 111 and the substrate 72 are attached to each other with the adhesive layer 152, and the substrate 111 and the substrate 112 are attached to each other with an adhesive layer 153.

The electrode 32, the wiring 42, and the like are formed over the substrate 111. The electrode 31, the wiring 41 (not illustrated), and the like are formed over the substrate 112. In FIG. 13, the FPC 50 is provided over the substrate 111; the substrate 112 is similarly provided with an FPC in a region not illustrated.

In the case where two substrates are used in the structure of the input device 10 as described above, substrates as thin as, or thinner than, the substrates 71 and 72 are preferably used as the substrates 111 and 112. It is particularly preferable to use a material having flexibility for the substrates 111 and 112, in which case the thickness of the touch panel 100 can be decreased.

A protective substrate 130 may be provided over the substrate 112 with an adhesive layer 154 therebetween as illustrated in FIG. 13. A surface of the protective substrate 130 on a side opposite to the substrate 112 side functions as a touch surface. The above description of the substrate 30 can be referred to for a material of the protective substrate 130.

Cross-Sectional Structure Example 3

Figure 14:
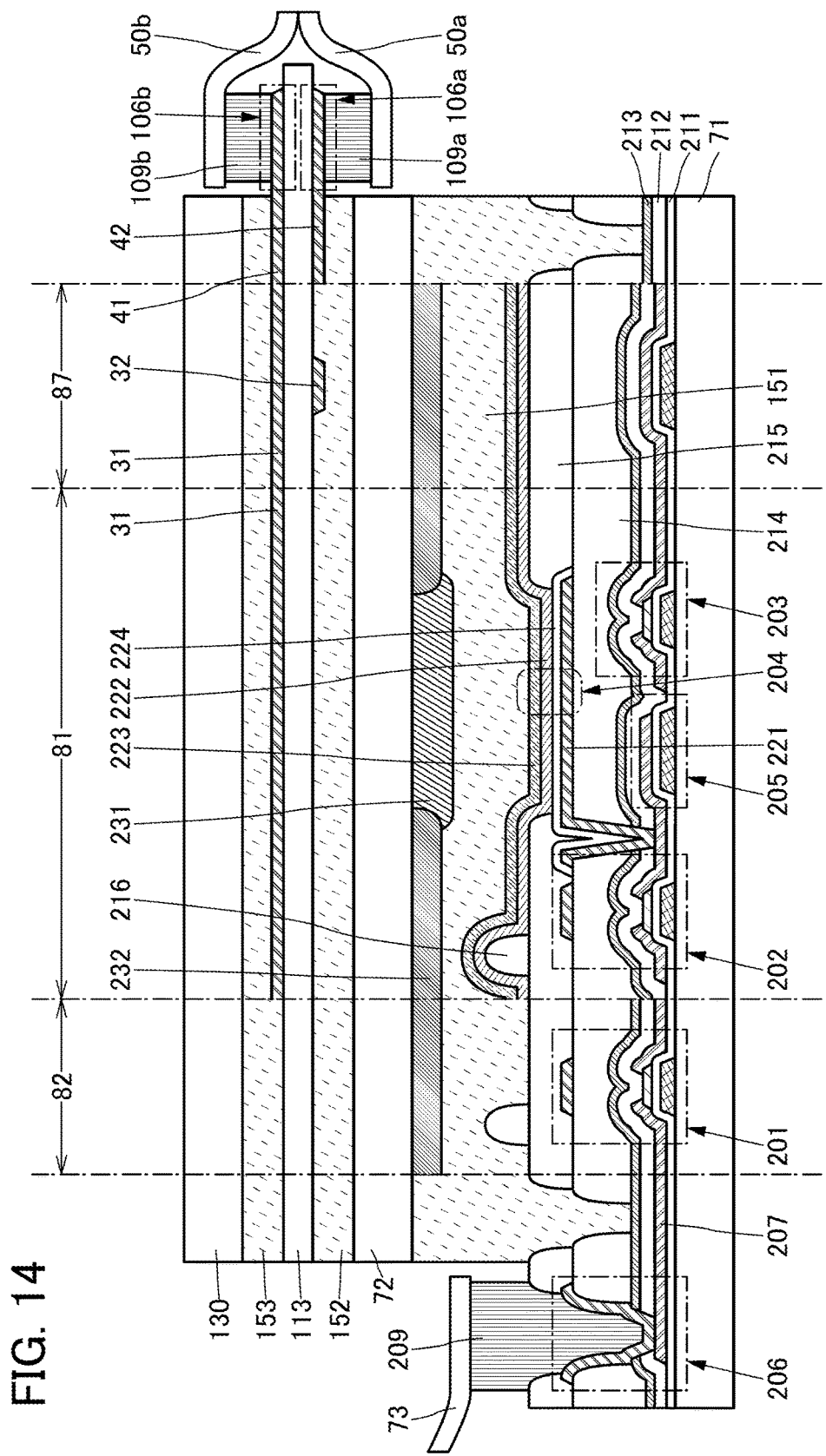
FIG. 14 illustrates a structure example of an input/output device of an embodiment.

A touch panel illustrated in FIG. 14 includes a substrate 113. The substrate 113 and the substrate 72 are attached to each other with the adhesive layer 152.

The substrate 113 is provided with the electrode 32, the wiring 42, and the like on one side. The substrate 113 is also provided with the electrode 31, the wiring 41, and the like on the other side. That is, the electrodes and wirings in the touch sensor are provided on both sides of the substrate 113.

FIG. 14 illustrates an example in which a connection portion 106a where a portion of the wiring 42 is exposed is electrically connected to an FPC 50a through a connection layer 109a and a connection portion 106b where a portion of the wiring 41 is electrically connected to an FPC 50b through a connection layer 109b. Note that the connection portion 106a and the connection portion 106b may overlap with each other in a plan view, or may be arranged so as not to overlap with each other.

Cross-Sectional Structure Example 4

Figure 15:
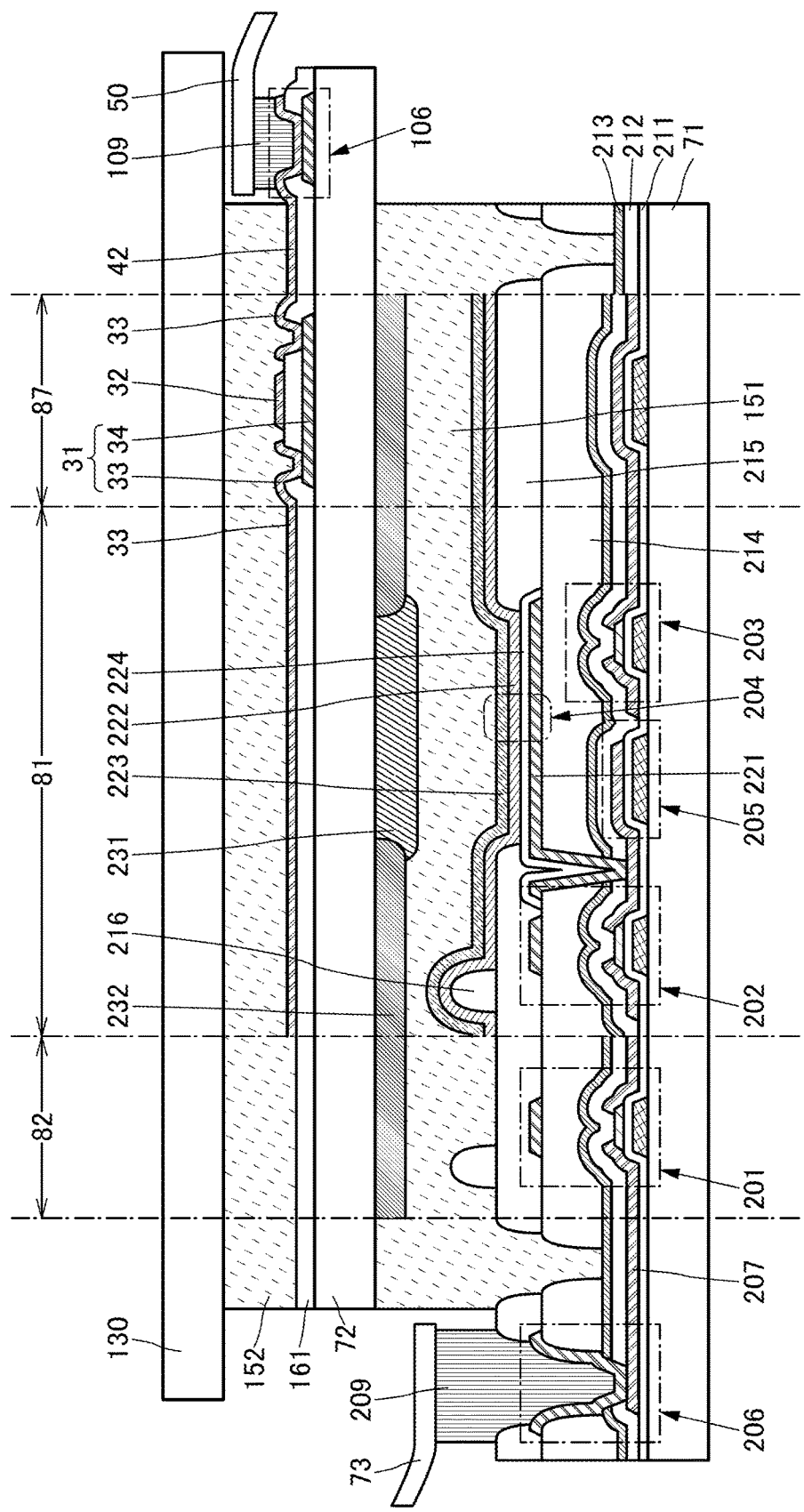
FIG. 15 illustrates a structure example of an input/output device of an embodiment.

In a touch panel illustrated in FIG. 15, the electrodes and the like in the touch sensor are provided on a side of the substrate 72 opposite to the substrate 71 side. Specifically, the bridge electrode 34 and the insulating layer 161 covering a portion of the bridge electrode 34 are provided over the substrate 72, and the electrode 32, the electrode 33, the wiring 41 (not illustrated), the wiring 42, and the like are provided over the insulating layer 161.

As illustrated in FIG. 15, the protective substrate 130 and the substrate 72 may be attached to each other with the adhesive layer 152.

In this structure, the input device 10 and the display panel 70 can share the substrate 72; thus, the thickness of the touch panel can be significantly decreased.

Modification Example 2 of Cross-Sectional Structure Example

Figure 16:
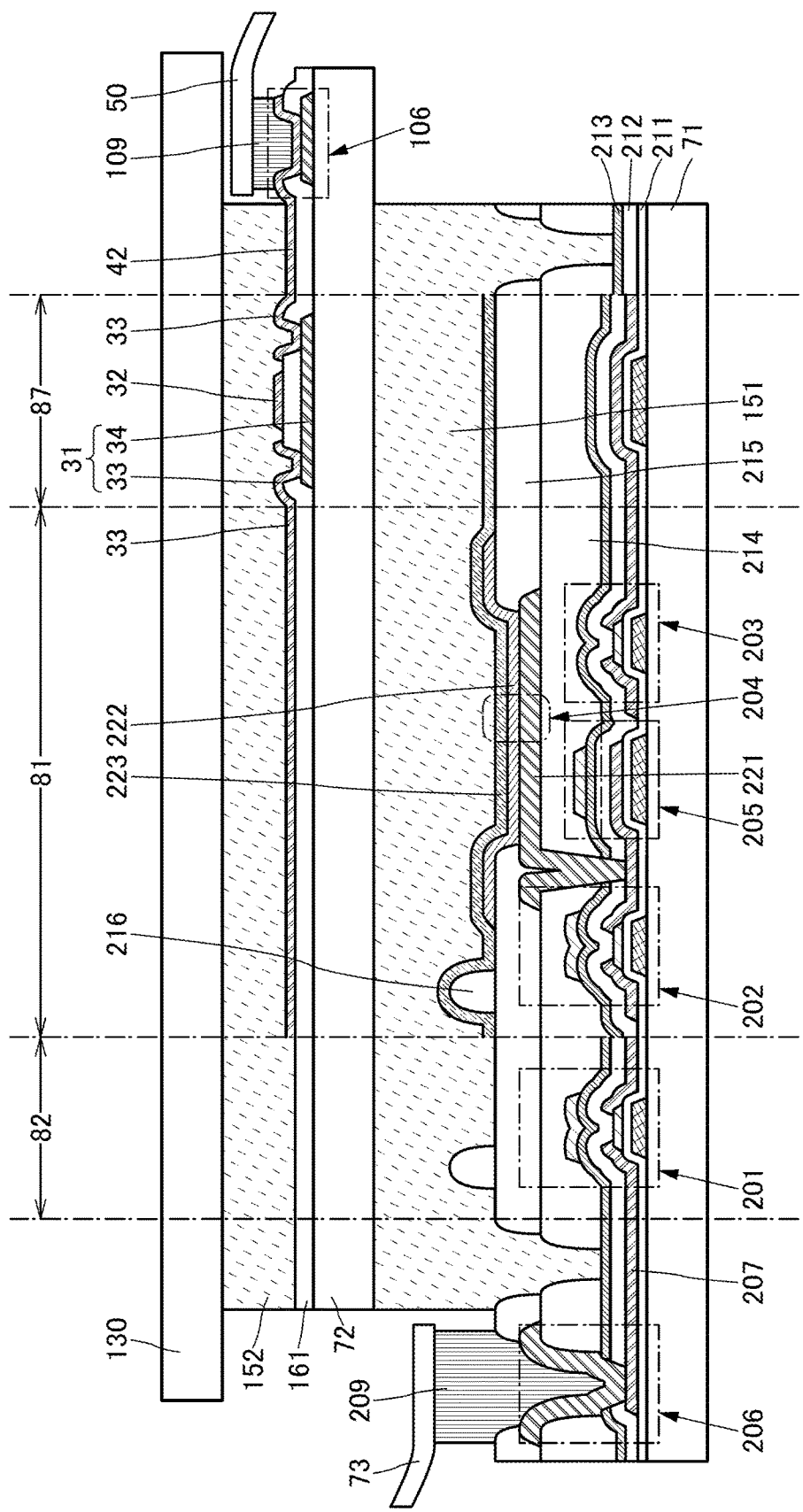
FIG. 16 illustrates a structure example of an input/output device of an embodiment.

FIG. 16 illustrates an example in which the structure of the touch sensor illustrated in FIG. 15 is combined with the structure of the touch panel illustrated in FIG. 12 where the light-emitting element formed by a separate coloring method is used as the display element 204. In the example illustrated in FIG. 16, the light-blocking layer 232 is not provided.

Cross-Sectional Structure Example 5

Figure 17:
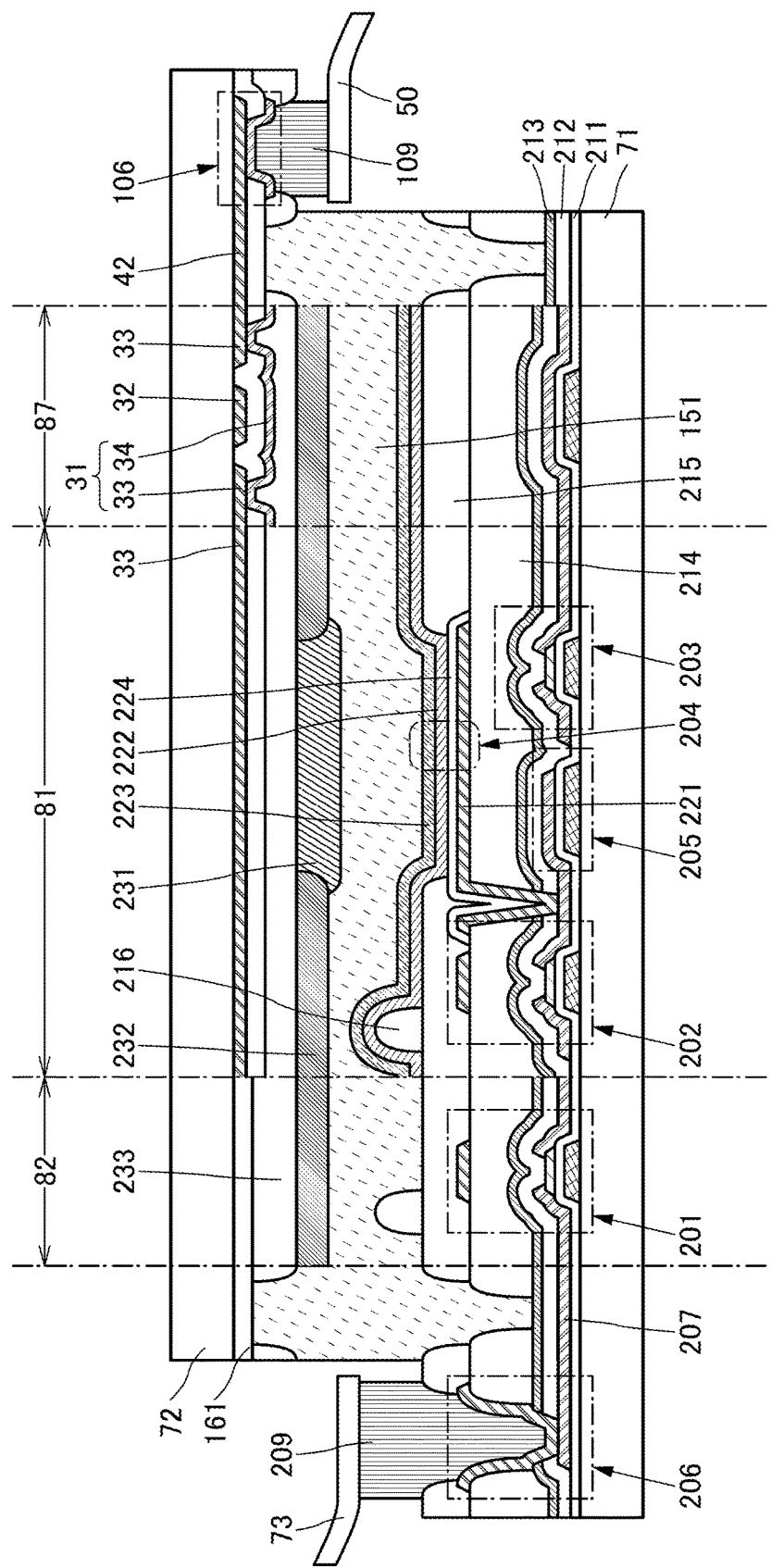
FIG. 17 illustrates a structure example of an input/output device of an embodiment.

In a touch panel illustrated in FIG. 17, the electrodes and the like in the touch sensor are provided on the substrate 71 side of the substrate 72. Specifically, the electrode 32, the electrode 33, the wiring 41 (not illustrated), the wiring 42, and the like are formed over the substrate 72; the insulating layer 161 is formed to cover these components; and the bridge electrode 34 and the like are formed over the insulating layer 161.

An insulating layer 233 is provided to cover the electrodes and the like in the touch sensor. In addition, the coloring layer 231, the light-blocking layer 232, and the like are provided over the insulating layer 233.

In this structure, the input device 10 and the display panel 70 can share the substrate 72 and one surface of the substrate 72 can be used as a touch surface; thus, the thickness of the touch panel 100 can be further decreased.

Modification Example 3 of Cross-Sectional Structure Example

Figure 18:
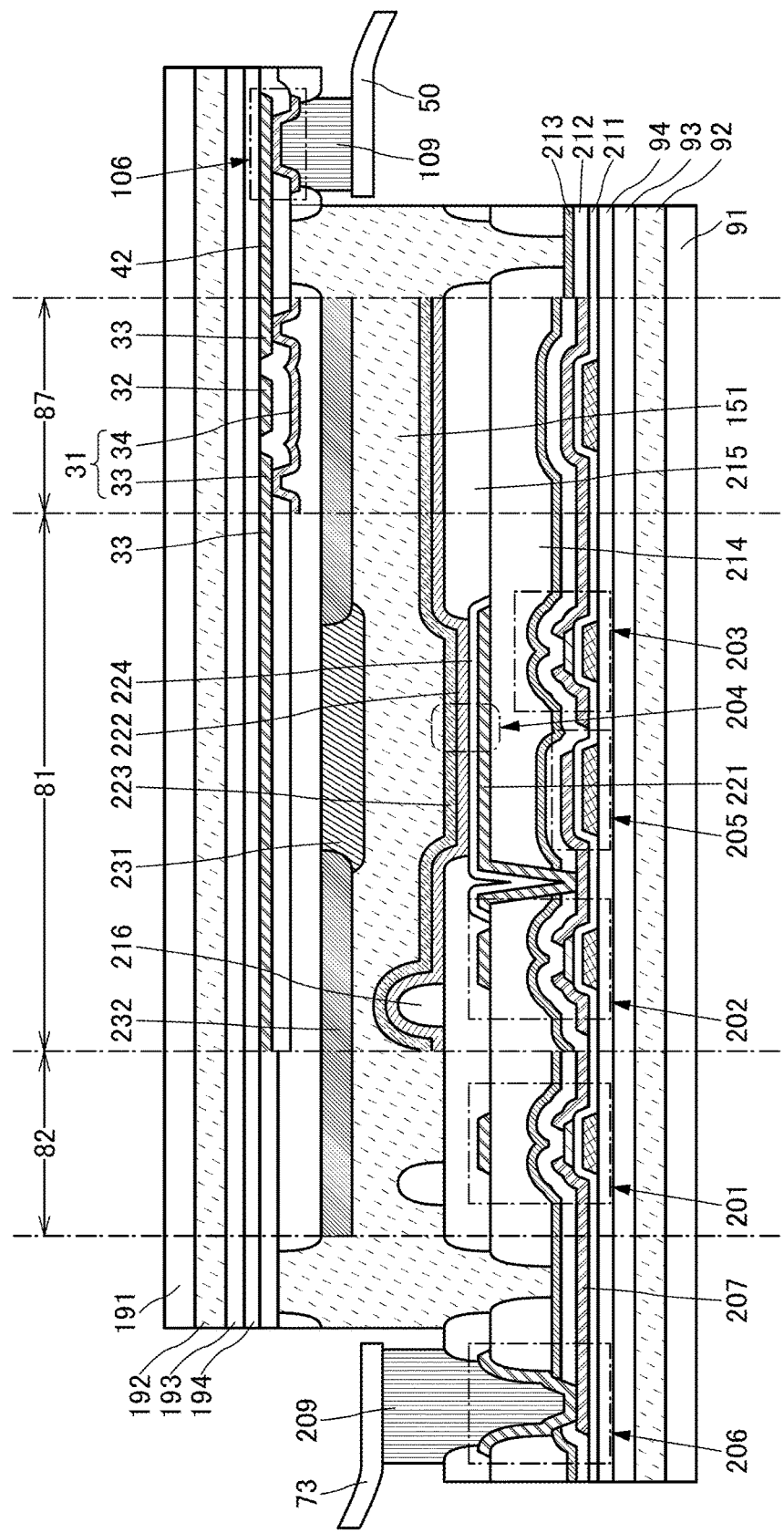
FIG. 18 illustrates a structure example of an input/output device of an embodiment.

FIG. 18 illustrates a modification example of the touch panel illustrated in FIG. 17.

The touch panel in FIG. 18 has a stacked-layer structure including a substrate 91, an adhesive layer 92, a substrate 93, and an insulating layer 94 in place of the substrate 71. The touch panel also has a stacked-layer structure including a substrate 191, an adhesive layer 192, a substrate 193, and an insulating layer 194 in place of the substrate 72.

A material through which impurities such as water or hydrogen do not easily diffuse can be used for the insulating layer 94 and the insulating layer 194. Such a structure can effectively suppress diffusion of the impurities into the display element 204 and the transistors even in the case of using a material permeable to moisture for the substrate 91, the substrate 93, the substrate 191, and the substrate 193, and a highly reliable touch panel can be achieved.

A material such as a resin having flexibility can be used for the substrate 93 and the substrate 193. Films having flexibility or the like are preferably used as the substrate 91 and the substrate 191. With the use of a material having flexibility for these substrates, a bendable touch panel can be achieved.

Cross-Sectional Structure Example 6

Figure 19:
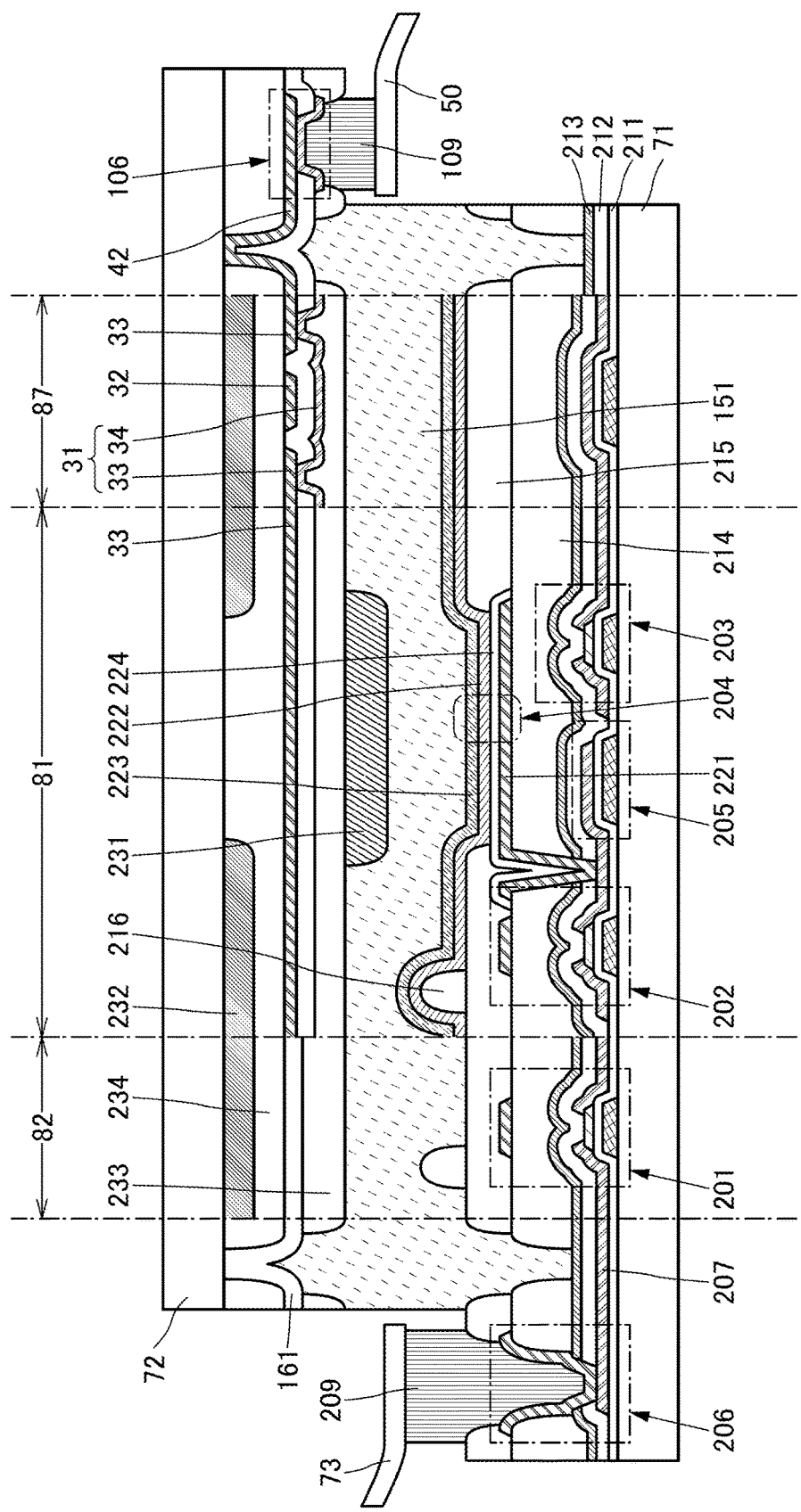
FIG. 19 illustrates a structure example of an input/output device of an embodiment.

In a touch panel illustrated in FIG. 19, the light-blocking layer 232 is provided between the electrodes and the like in the touch sensor and the substrate 72. Specifically, the light-blocking layer 232 is formed over the substrate 72, and an insulating layer 234 is formed to cover the light-blocking layer 232. The electrode 32, the electrode 33, the wiring 41 (not illustrated), and the wiring 42 are formed over the insulating layer 234; the insulating layer 161 is formed to cover these components; and the bridge electrode 34 and the like are formed over the insulating layer 161. In addition, the insulating layer 233 is formed over the bridge electrode 34 and the insulating layer 161, and the coloring layer 231 is formed over the insulating layer 233.

The insulating layers 233 and 234 have a function as a planarization film. Note that the insulating layers 233 and 234 are not necessarily provided when not needed.

In this structure, the light-blocking layer 232 provided in a position closer to the viewing side than that of the electrodes and the like in the touch sensor can prevent the electrode and the like from being visible. Thus, a touch panel with not only small thickness but also improved visibility can be achieved.

Modification Example 4 of Cross-Sectional Structure Example

Figure 20:
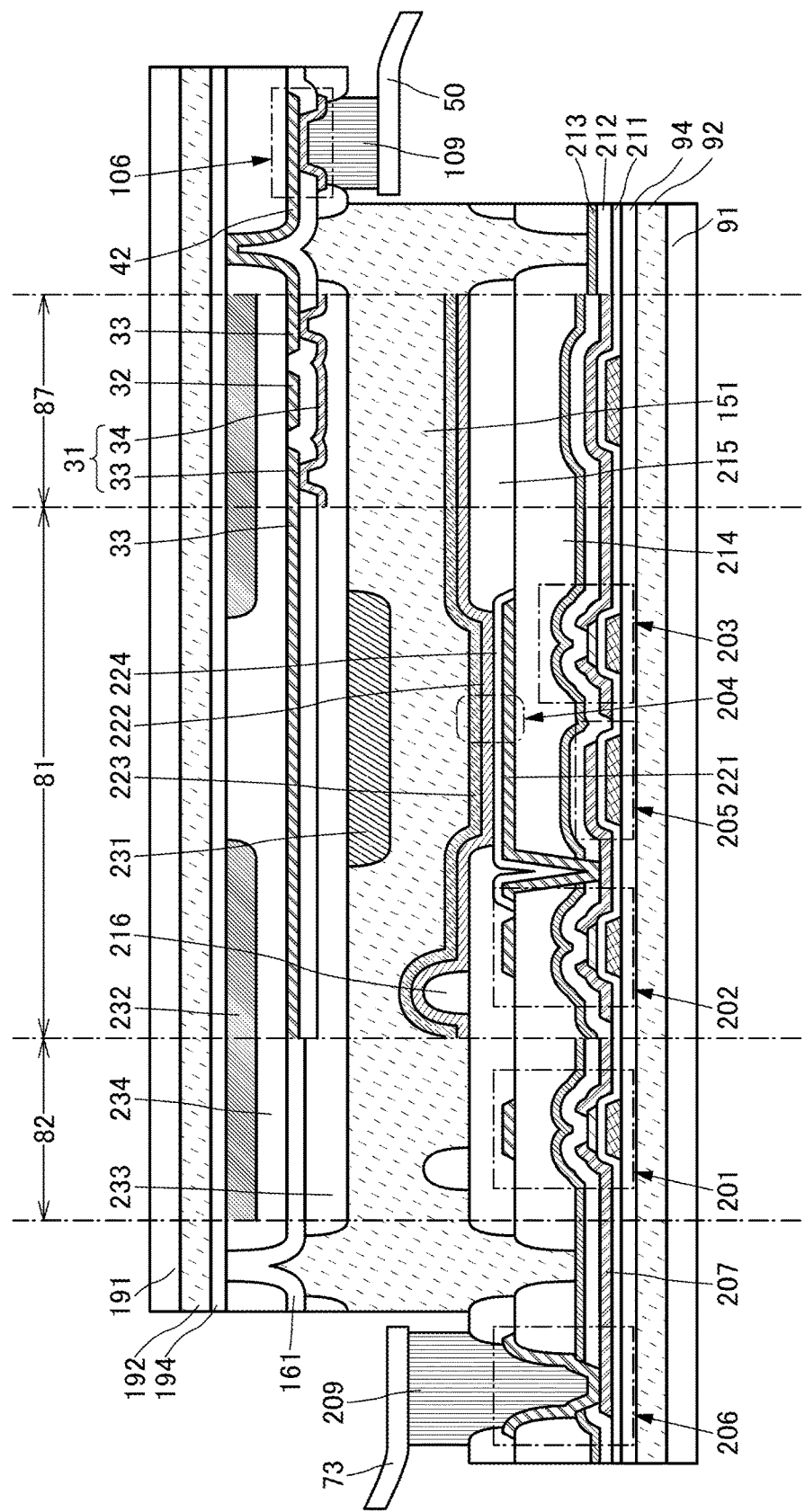
FIG. 20 illustrates a structure example of an input/output device of an embodiment.

FIG. 20 illustrates a modification example of the touch panel illustrated in FIG. 19.

The touch panel in FIG. 20 has a stacked-layer structure including the substrate 91, the adhesive layer 92, and the insulating layer 94 in place of the substrate 71. The touch panel also has a stacked-layer structure including the substrate 191, the adhesive layer 192, and the insulating layer 194 in place of the substrate 72.

With the use of a material having flexibility for the substrates 91 and 191, a bendable touch panel can be achieved.

Cross-Sectional Structure Example 7

Figure 21:
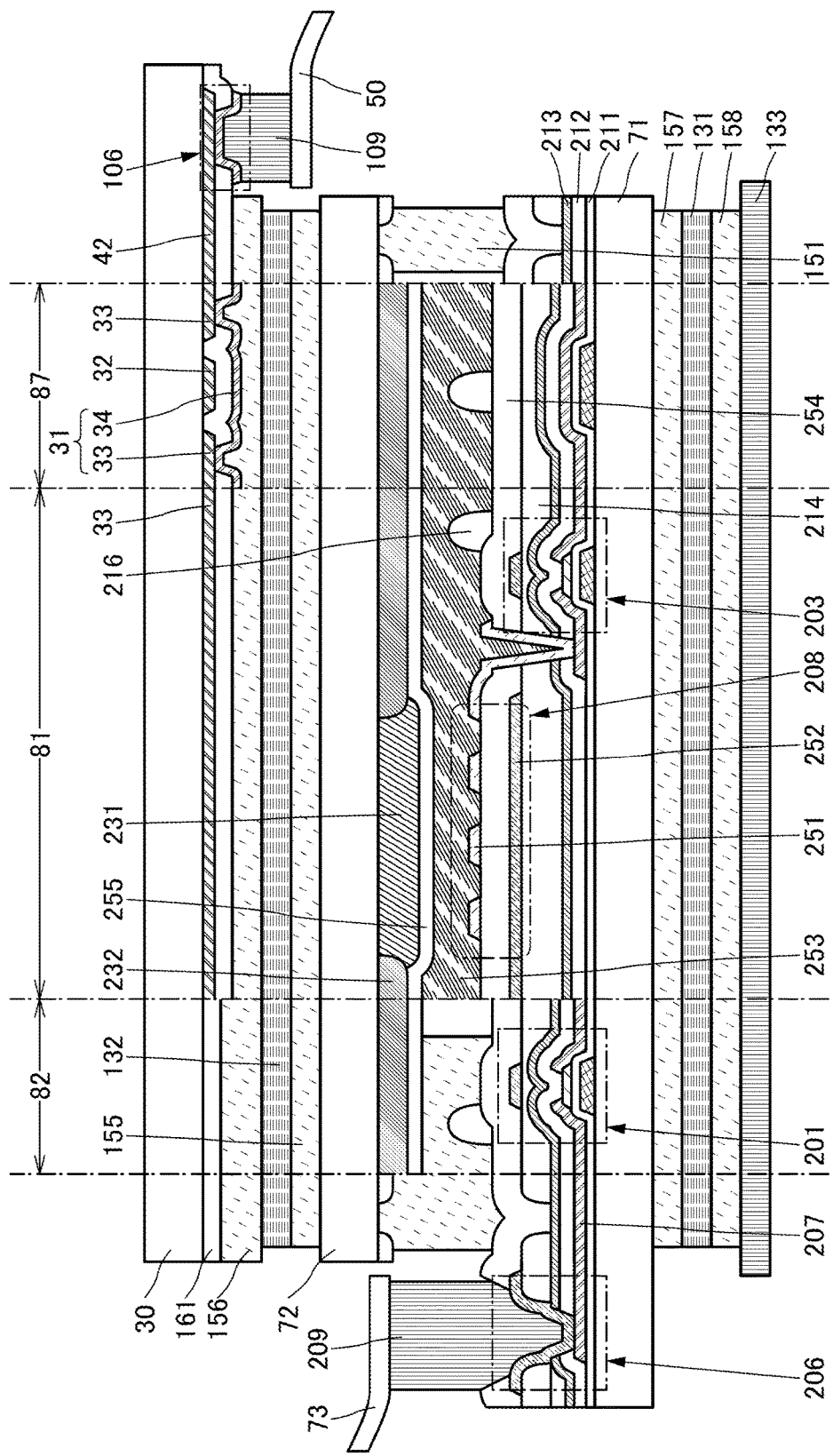
FIG. 21 illustrates a structure example of an input/output device of an embodiment.

FIG. 21 illustrates a cross-sectional structure example of a touch panel where a liquid crystal display device is used as the display panel 70. In the touch panel illustrated in FIG. 21, a liquid crystal element is used as a display element 208. The touch panel includes a polarizing plate 131, a polarizing plate 132, and a backlight 133.

In the example illustrated here, a liquid crystal element using a fringe field switching (FFS) mode is used as the display element 208. The display element 208 includes an electrode 252, an electrode 251, and a liquid crystal 253. The electrode 251 is provided over the electrode 252 with an insulating layer 254 provided therebetween, and has a comb-like shape or a shape provided with a slit.

An overcoat 255 is provided to cover the coloring layer 231 and the light-blocking layer 232. The overcoat 255 has a function of preventing a pigment or the like which is included in the coloring layer 231 or the light-blocking layer 232 from diffusing into the liquid crystal 253.

Surfaces of the overcoat 255, the insulating layer 254, the electrode 251, and the like which are in contact with the liquid crystal 253 may be provided with alignment films for controlling the orientation of the liquid crystal 253.

In FIG. 21, the polarizing plate 131 is attached to the substrate 71 with an adhesive layer 157. The backlight 133 is attached to the polarizing plate 131 with an adhesive layer 158. The polarizing plate 132 is positioned between the substrate 72 and the substrate 30. The polarizing plate 132 is attached to the substrate 72 with an adhesive layer 155, and is attached to the substrate 30 (specifically, a portion of the insulating layer 161 formed over the substrate 30) with an adhesive layer 156.

Although the liquid crystal element using an FFS mode is described above, a vertical alignment (VA) mode, a twisted nematic (TN) mode, an in-plane-switching (IPS) mode, an axially symmetric aligned micro-cell (ASM) mode, an optically compensated birefringence (OCB) mode, a ferroelectric liquid crystal (FLC) mode, an antiferroelectric liquid crystal (AFLC) mode, or the like can be used.

As the liquid crystal, a thermotropic liquid crystal, a low-molecular liquid crystal, a high-molecular liquid crystal, a ferroelectric liquid crystal, an anti-ferroelectric liquid crystal, a polymer dispersed liquid crystal (PDLC), or the like can be used. Moreover, a liquid crystal exhibiting a blue phase is preferably used because an alignment film is not needed and a wide viewing angle is obtained in that case.

A transmissive liquid crystal element, a transflective liquid crystal element, a reflective liquid crystal element, or the like can be used as the liquid crystal element. Note that a portion of a pixel electrode functions as a reflective electrode to achieve a transflective liquid crystal element or a reflective liquid crystal element.

Cross-Sectional Structure Example 8

Figure 22:
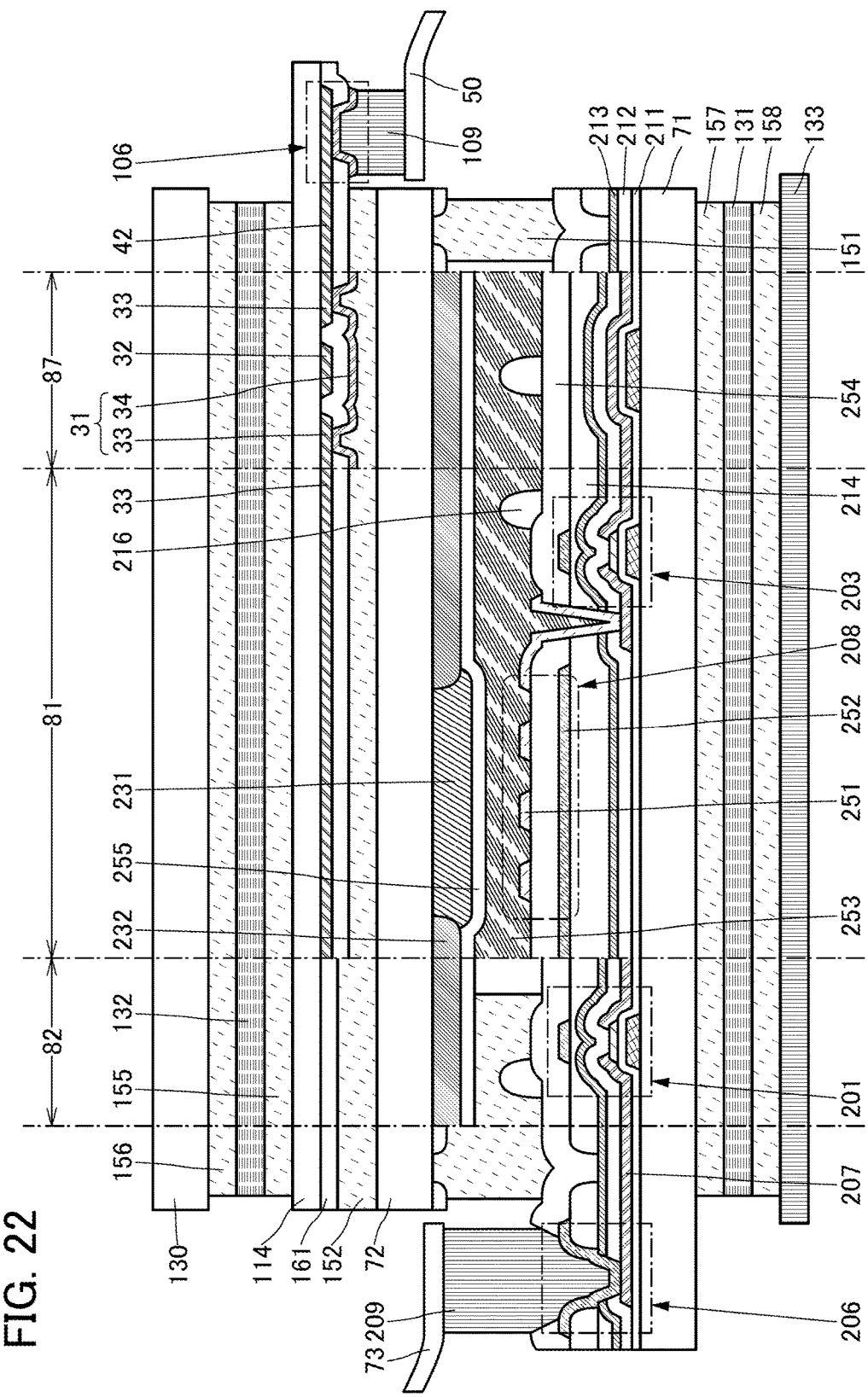
FIG. 22 illustrates a structure example of an input/output device of an embodiment.

FIG. 22 illustrates a cross-sectional structure example of a touch panel where a liquid crystal display device is used as the display panel 70. In the touch panel illustrated in FIG. 22, the polarizing plate 132 is provided in a position closer to the viewing side than that of the electrodes and the like in the touch sensor. Specifically, a substrate 114 provided with the electrode 31, the electrode 32, and the like is attached to the substrate 72 with the adhesive layer 152, and the polarizing plate 132 is attached to the substrate 114 with the adhesive layer 155. The protective substrate 130 attached to the polarizing plate 132 with the adhesive layer 156 is provided in a position closer to the viewing side than that of the polarizing plate 132.

A film having flexibility or the like is preferably used as the substrate 114 because the thickness of the touch panel can be decreased.

Cross-Sectional Structure Example 9

Figure 23:
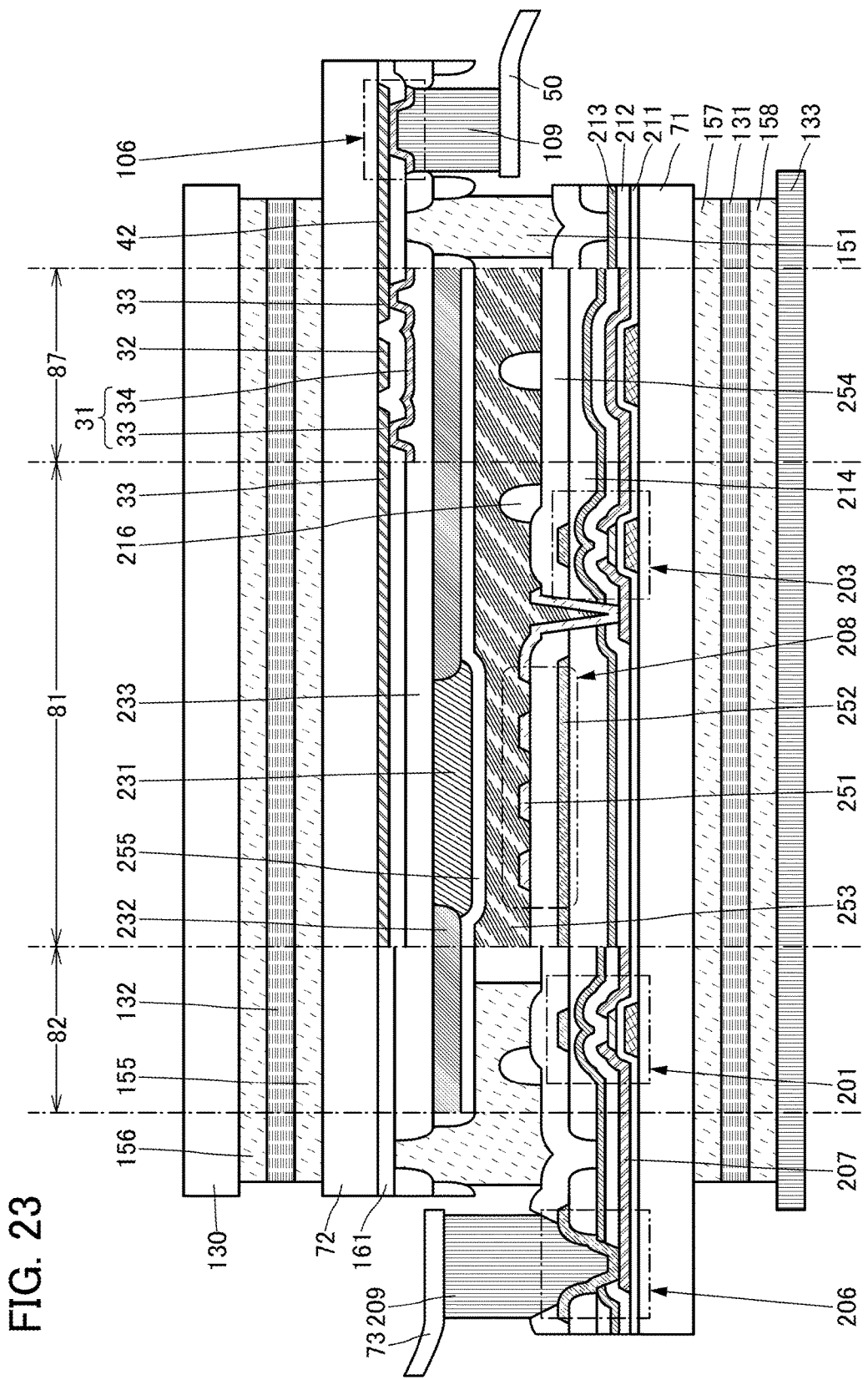
FIG. 23 illustrates a structure example of an input/output device of an embodiment.

FIG. 23 illustrates a cross-sectional structure example of a touch panel where a liquid crystal display device is used as the display panel. In the example of the touch panel illustrated in FIG. 23, the electrodes and the like in the touch sensor are formed on the substrate 71 side of the substrate 72. Specifically, the electrode 32, the electrode 33, the wiring 41 (not illustrated), the wiring 42, and the like are formed over the substrate 72; the insulating layer 161 is formed to cover these components; and the bridge electrode 34 and the like are formed over the insulating layer 161. The insulating layer 233 is formed to cover the electrodes and the like in the touch sensor. In addition, the coloring layer 231, the light-blocking layer 232, and the like are formed over the insulating layer 233.

The polarizing plate 132 is attached to the opposite side of the substrate 72 with the adhesive layer 155. The protective substrate 130 is attached to the polarizing plate 132 with the adhesive layer 156.

In this structure, the input device and the display panel can share the substrate and one surface of the substrate 72 can be used as a touch surface; thus, the thickness of the touch panel can be further decreased.

Cross-Sectional Structure Example 10

Figure 24:
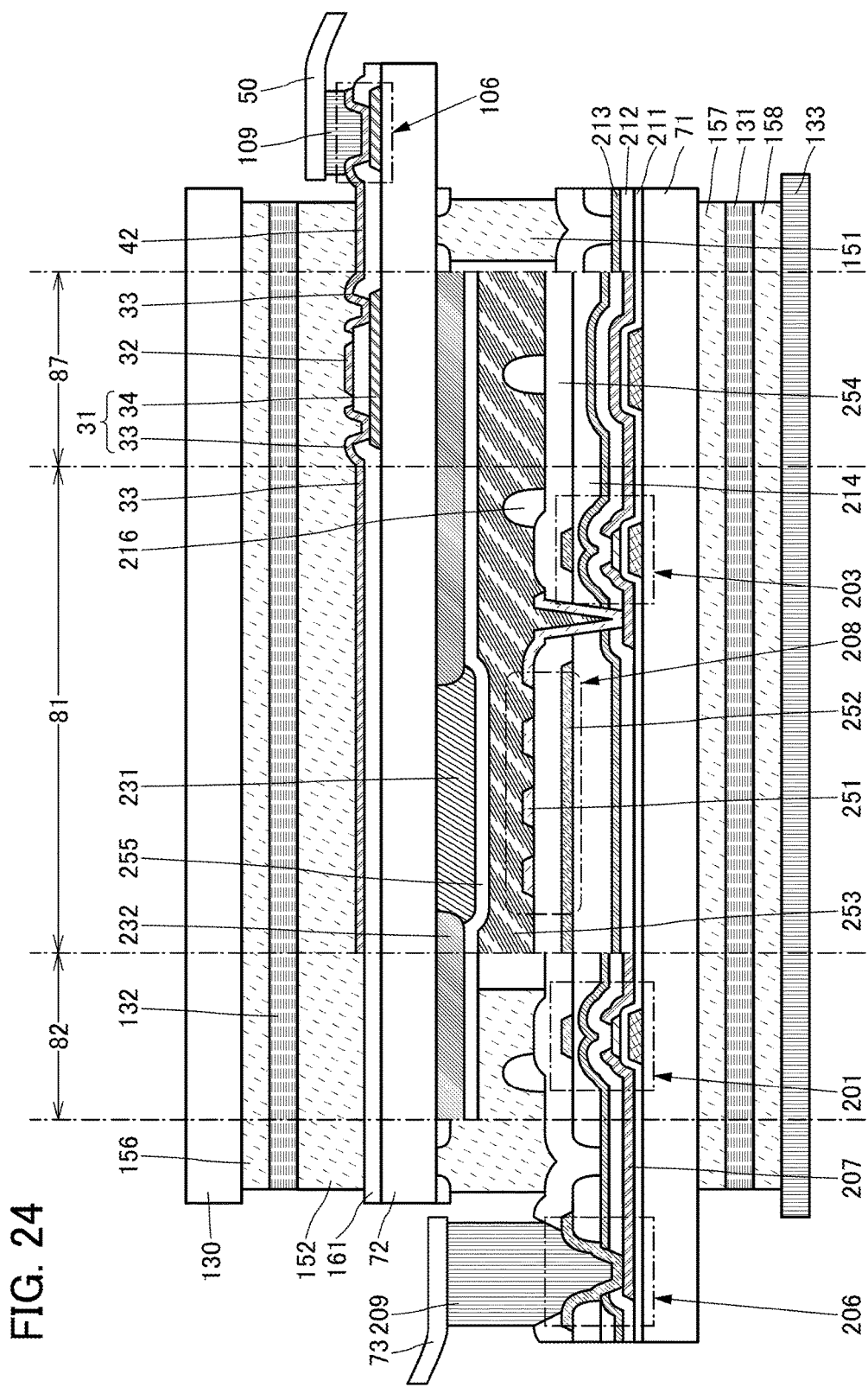
FIG. 24 illustrates a structure example of an input/output device of an embodiment.

FIG. 24 illustrates a cross-sectional structure example of a touch panel where a liquid crystal display device is used as the display panel. In the example of the touch panel illustrated in FIG. 24, the electrodes and the like in the touch sensor are provided on a side of the substrate 72 opposite to the substrate 71 side. Specifically, the bridge electrode 34 is formed over a surface of the substrate 72 on a side opposite to the side where the coloring layer 231 and the like are provided; the insulating layer 161 is formed to cover a portion of the bridge electrode 34; and the electrode 31, the electrode 32, the wiring 41 (not illustrated), the wiring 42, and the like are formed over the insulating layer 161. The polarizing plate 132 is attached to the substrate 72 with the adhesive layer 152, and the protective substrate 130 is attached to the polarizing plate 132 with the adhesive layer 156.

The above is the description of the cross-sectional structure examples.

Although the examples where a light-emitting element or a liquid crystal element is used as a display element are given here, one embodiment of the present invention is not limited thereto.

For example, a display device including a micro electro mechanical system (MEMS) element or an electron emitter as a display element can be used. Examples of MEMS display elements include a MEMS shutter display element, an optical interference type MEMS display element, and the like. A carbon nanotube may be used for the electron emitter. Alternatively, electronic paper may be used. As the electronic paper, an element using a microcapsule method, an electrophoretic method, an electrowetting method, an Electronic Liquid Powder (registered trademark) method, or the like can be used.

Structure Example of in-Cell Touch Panel

Although the examples where the electrodes in the touch sensor are formed over a substrate different from a substrate where the display element and the like are provided are described above, one or both of the pair of electrodes in the touch sensor may be formed over the substrate where the display element and the like are provided.

A structure example of a touch panel incorporating the touch sensor into a display portion including a plurality of pixels will be described below. Here, an example where a liquid crystal element is used as a display element provided in the pixel is shown.

Figure 25A:
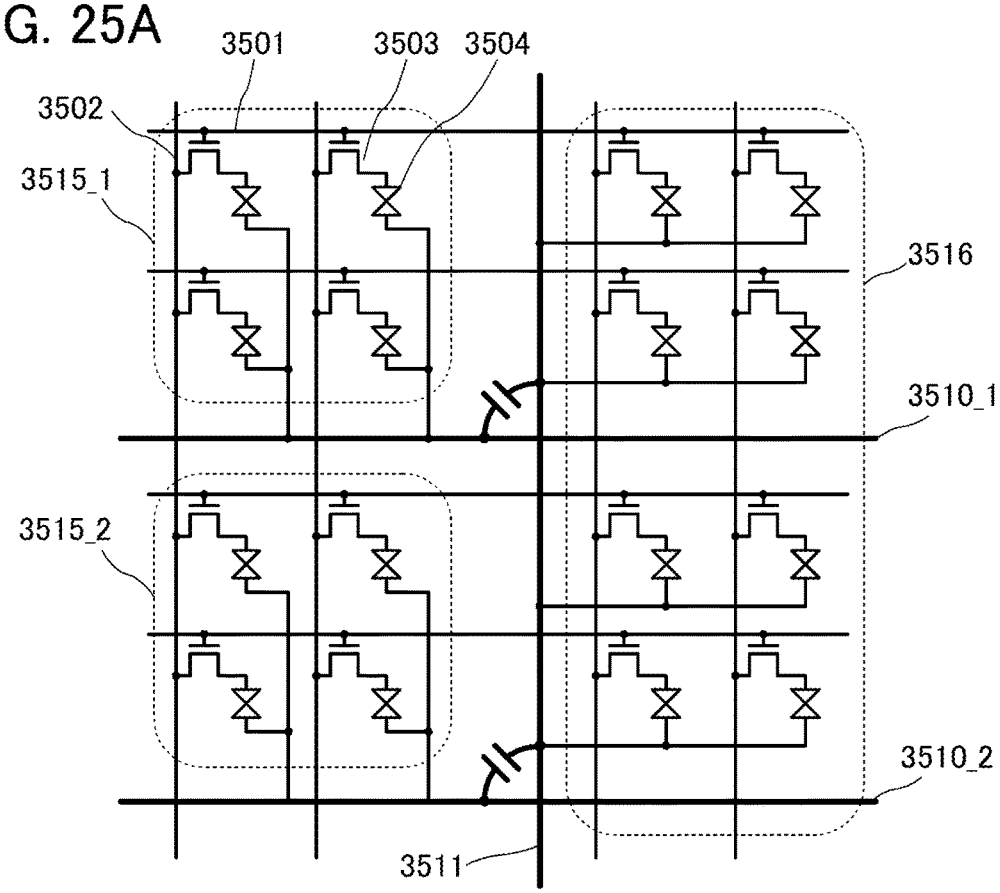
FIGS. 25A and 25B illustrate pixels provided with a touch sensor of an embodiment.

FIG. 25A is an equivalent circuit diagram of part of a pixel circuit provided in the display portion of the touch panel exemplified in this structure example.

Each pixel includes at least a transistor 3503 and a liquid crystal element 3504. In addition, a gate of the transistor 3503 is electrically connected to a wiring 3501 and one of a source and a drain of the transistor 3503 is electrically connected to a wiring 3502.

The pixel circuit includes a plurality of wirings extending in the X direction (e.g., a wiring 3510_1 and a wiring 3510_2) and a plurality of wirings extending in the Y direction (e.g., a wiring 3511). They are provided to intersect with each other, and capacitance is formed therebetween.

Among the pixels provided in the pixel circuit, electrodes of the liquid crystal elements of some pixels adjacent to each other are electrically connected to each other to form one block. The block is classified into two types: an island-shaped block (e.g., a block 3515_1 or a block 3515_2) and a linear block (e.g., a block 3516) extending in the Y direction. Note that only part of the pixel circuit is illustrated in FIGS. 25A and 25B, and actually, these two kinds of blocks are repeatedly arranged in the X direction and the Y direction.

The wiring 3510_1 (or the wiring 3510_2) extending in the X direction is electrically connected to the island-shaped block 3515_1 (or the block 3515_2). Although not illustrated, the wiring 3510_1 extending in the X direction is electrically connected to a plurality of island-shaped blocks 3515_1 which are provided discontinuously along the X direction with the linear blocks therebetween. Furthermore, the wiring 3511 extending in the Y direction is electrically connected to the linear block 3516.

Figure 25B:
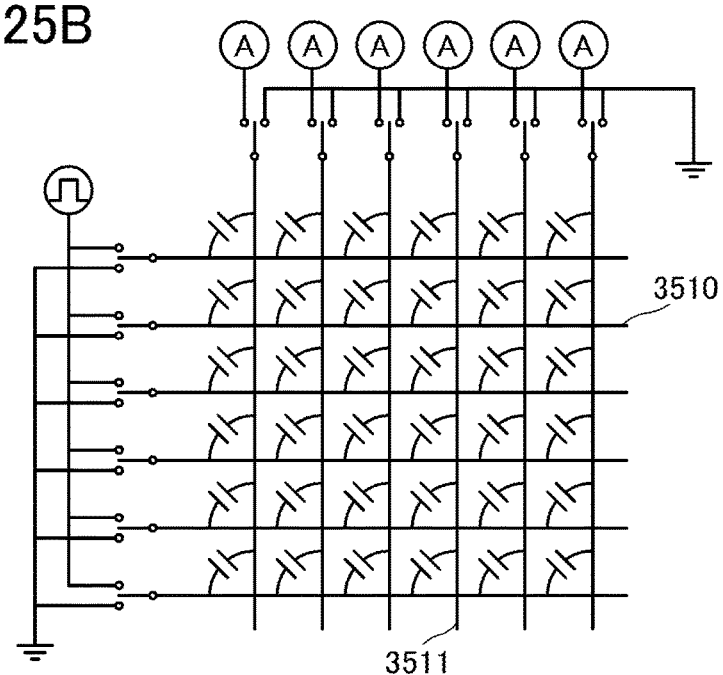

FIG. 25B is an equivalent circuit diagram illustrating the connection between a plurality of wirings 3510 extending in the X direction and the plurality of wirings 3511 extending in the Y direction. Input voltage or a common potential can be input to each of the wirings 3510 extending in the X direction. Furthermore, a ground potential can be input to each of the wirings 3511 extending in the Y direction, or each of the wirings 3511 can be electrically connected to a sensing circuit.

Operation of the above-described touch panel will be described below with reference to FIGS. 26A and 26B.

Here, one frame period is divided into a writing period and a sensing period. The writing period is a period in which image data is written to a pixel, and the wirings 3510 (also referred to as gate lines) are sequentially selected. On the other hand, the sensing period is a period in which sensing is performed by a touch sensor, and the wirings 3510 extending in the X direction are sequentially selected and input voltage is input.

Figure 26A:
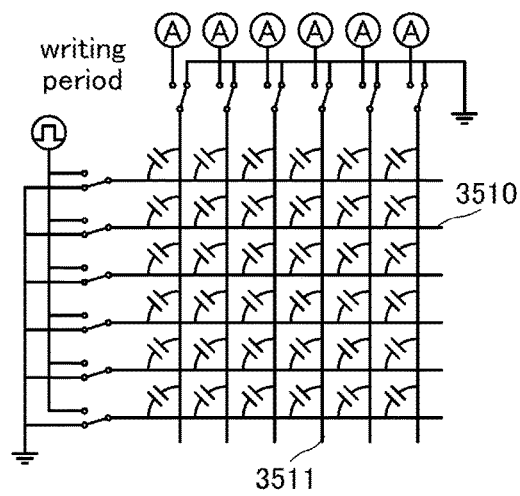
FIGS. 26A and 26B illustrate operations of a touch sensor and pixels of an embodiment.

FIG. 26A is an equivalent circuit diagram in the writing period. In the wiring period, a common potential is input to both the wiring 3510 extending in the X direction and the wiring 3511 extending in the Y direction.

Figure 26B:
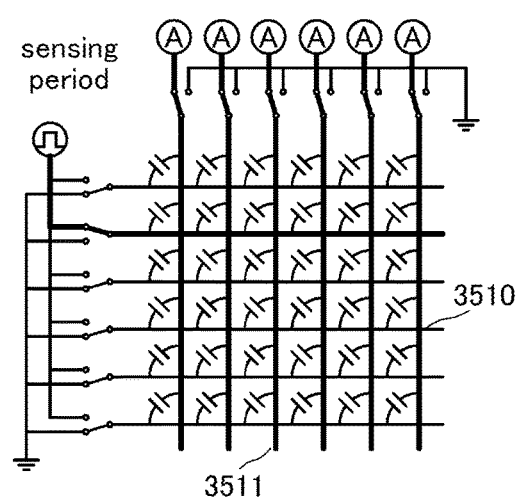

FIG. 26B is an equivalent circuit diagram at some point in time in the sensing period. In the sensing period, each of the wirings 3511 extending in the Y direction is electrically connected to the sensing circuit. Input voltage is input to the wirings 3510 extending in the X direction which are selected, and a common potential is input to the wirings 3510 extending in the X direction which are not selected.

Note that the driving method described here can be applied to not only an in-cell touch panel but also the above-described touch panels, and can be used in combination with the method described in the driving method example.

It is preferable that a period in which an image is written and a period in which sensing is performed by a touch sensor be separately provided as described above. Thus, a decrease in sensitivity of the touch sensor caused by noise generated when data is written to a pixel can be suppressed.

Example of Manufacturing Method

Here, a method for manufacturing a flexible touch panel will be described.

For convenience, a structure including a pixel and a circuit, a structure including an optical member such as a color filter, a structure including electrodes and wirings in a touch sensor, or the like is referred to as an element layer. An element layer includes a display element, for example, and may include a wiring electrically connected to the display element or an element such as a transistor used in a pixel or a circuit in addition to the display element.

Here, a support body (e.g., the substrate 91 or the substrate 191 in FIG. 20) with an insulating surface where an element layer is formed is referred to as a substrate.

As a method for forming an element layer over a flexible substrate provided with an insulating surface, there are a method in which an element layer is formed directly over a substrate, and a method in which an element layer is formed over a supporting base that has stiffness and then the element layer is separated from the supporting base and transferred to a substrate.

In the case where a material of the substrate can withstand heating temperature in a process for forming the element layer, it is preferable that the element layer be formed directly over the substrate, in which case a manufacturing process can be simplified. At this time, the element layer is preferably formed in a state where the substrate is fixed to the supporting base, in which case transfer thereof in an apparatus and between apparatuses can be easy.

In the case of employing the method in which the element layer is formed over the supporting base and then transferred to the substrate, first, a separation layer and an insulating layer are stacked over the supporting base, and then the element layer is formed over the insulating layer. Next, the element layer is separated from the supporting base and then transferred to the substrate. At this time, a material is selected that would cause separation at an interface between the supporting base and the separation layer, at an interface between the separation layer and the insulating layer, or in the separation layer.

For example, it is preferable that a stacked layer of a layer including a high-melting-point metal material, such as tungsten, and a layer including an oxide of the metal material be used as the separation layer, and a stacked layer of a plurality of layers, such as a silicon nitride layer and a silicon oxynitride or silicon nitride oxide layer be used as the insulating layer over the separation layer. The use of the high-melting-point metal material is preferable because the degree of freedom of the process for forming the element layer can be increased.

The separation may be performed by application of mechanical power, by etching of the separation layer, by dripping of a liquid into part of the separation interface to penetrate the entire separation interface, or the like. Alternatively, separation may be performed by heating the separation interface by utilizing a difference in thermal expansion coefficient.

The separation layer is not necessarily provided in the case where separation can occur at an interface between the supporting base and the insulating layer. For example, glass is used as the supporting base and an organic resin such as polyimide is used as the insulating layer, a separation trigger is formed by locally heating part of the organic resin by laser light or the like, and separation is performed at an interface between the glass and the insulating layer. Alternatively, a metal layer may be provided between the supporting base and the insulating layer formed of an organic resin, and separation may be performed at the interface between the metal layer and the insulating layer by heating the metal layer by feeding a current to the metal layer. Alternatively, a layer of a light-absorbing material (e.g., a metal, a semiconductor, or an insulator) may be provided between the supporting base and the insulating layer formed of an organic resin and may be locally heated by being irradiated with laser light or the like to form a separation trigger. In these methods, the insulating layer formed of an organic resin can be used as a substrate.

Examples of materials of flexible substrates include polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, and a polyvinyl chloride resin. In particular, a material whose thermal expansion coefficient is low is preferred, and for example, a polyamide imide resin, a polyimide resin, or PET with a thermal expansion coefficient of $30 \times 10^{-6}$/K or less can be suitably used. A substrate in which a fibrous body is impregnated with a resin (also referred to as prepreg) or a substrate whose thermal expansion coefficient is reduced by mixing an inorganic filler with an organic resin can also be used.

In the case where a fibrous body is included in the above material, a high-strength fiber of an organic compound or an inorganic compound is used as the fibrous body. The high-strength fiber is specifically a fiber with a high tensile elastic modulus or a fiber with a high Young's modulus. Typical examples thereof include a polyvinyl alcohol based fiber, a polyester based fiber, a polyamide based fiber, a polyethylene based fiber, an aramid based fiber, a polyparaphenylene benzobisoxazole fiber, a glass fiber, and a carbon fiber. As the glass fiber, glass fiber using E glass, S glass, D glass, Q glass, or the like can be used. These fibers may be used in a state of a woven fabric or a nonwoven fabric, and a structure body in which this fibrous body is impregnated with a resin and the resin is cured may be used as the flexible substrate. The structure body including the fibrous body and the resin is preferably used as the flexible substrate, in which case the reliability against bending or breaking due to local pressure can be increased.

Alternatively, glass, metal, or the like that is thin enough to have flexibility can be used as the substrate. Alternatively, a composite material where glass and a resin material are bonded to each other may be used.

In the structure shown in FIG. 20, for example, a first separation layer and the insulating layer 94 are formed in this order over a first supporting base, and then components over the first separation layer and the insulating layer 94 are formed. Separately, a second separation layer and the insulating layer 194 are formed in this order over a second supporting base, and then upper components are formed. Next, the first supporting base and the second supporting base are attached to each other with the adhesive layer 151. After that, separation at an interface between the second separation layer and the insulating layer 194 is conducted so that the second supporting base and the second separation layer are removed, and then the substrate 191 is attached to the insulating layer 194 with the adhesive layer 192. Furthermore, separation at an interface between the first separation layer and the insulating layer 94 is conducted so that the first supporting base and the first separation layer are removed, and then the substrate 91 is attached to the insulating layer 94 with the adhesive layer 92. Note that either side may be subjected to separation and attachment first.

The above is the description of a method for manufacturing a flexible touch panel.

At least part of this embodiment can be implemented in combination with any of the other embodiments described in this specification as appropriate.

Embodiment 2

In this embodiment, electronic devices and lighting devices of one embodiment of the present invention will be described with reference to drawings.

Electronic devices and lighting devices can be manufactured by using the input device, the display device, or the input/output device of one embodiment of the present invention. Highly reliable electronic devices and lighting devices with curved surfaces can be manufactured by using the input device, the display device, or the input/output device of one embodiment of the present invention. In addition, flexible and highly reliable electronic devices and lighting devices can be manufactured by using the input device, the display device, or the input/output device of one embodiment of the present invention. Furthermore, electronic devices and lighting devices including touch sensors with improved sensitivity can be manufactured by using the input device or the input/output device of one embodiment of the present invention.

Examples of electronic devices are television devices (also referred to as TV or television receivers), monitors for computers and the like, cameras such as digital cameras and digital video cameras, digital photo frames, cellular phones (also referred to as portable telephone devices), portable game machines, portable information terminals, audio playback devices, large game machines such as pin-ball machines, and the like.

In the case of having flexibility, the light-emitting device or lighting device of one embodiment of the present invention can be incorporated along a curved inside/outside wall surface of a house or a building or a curved interior/exterior surface of a car.

Furthermore, the electronic device of one embodiment of the present invention may include a secondary battery. It is preferable that the secondary battery be capable of being charged by non-contact power transmission.

Examples of the secondary battery include a lithium ion secondary battery such as a lithium polymer battery using a gel electrolyte (lithium ion polymer battery), a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, the electronic device can display an image, data, or the like on a display portion. When the electronic device includes a secondary battery, the antenna may be used for non-contact power transmission.

FIGS. 27A, 27B, 27C1, 27C2, 27D, and 27E illustrate examples of electronic devices each including a display portion 7000 with a curved surface. The display surface of the display portion 7000 is curved, and images can be displayed on the curved display surface. Note that the display portion 7000 may be flexible.

The display portion 7000 is formed using the display device, the input/output device, or the like of one embodiment of the present invention. One embodiment of the present invention makes it possible to provide a highly reliable electronic device having a curved display portion.

FIG. 27A illustrates an example of a cellular phone. A cellular phone 7100 includes a housing 7101, a display portion 7000, operation buttons 7103, an external connection port 7104, a speaker 7105, a microphone 7106, and the like.

The cellular phone 7100 illustrated in FIG. 27A includes a touch sensor in the display portion 7000. Operations such as making a call and inputting a character can be performed by touch on the display portion 7000 with a finger, a stylus, or the like.

The power can be turned on or off with the operation button 7103. In addition, types of images displayed on the display portion 7000 can be switched; for example, switching images from a mail creation screen to a main menu screen is performed with the operation button 7103.

FIG. 27B illustrates an example of a television device. In a television device 7200, the display portion 7000 is incorporated in a housing 7201. Here, the housing 7201 is supported by a stand 7203.

Operation of the television device 7200 in FIG. 27B can be performed with an operation switch of the housing 7201 or a separate remote controller 7211. Furthermore, the display portion 7000 may include a touch sensor. The display portion 7000 can be operated by touching the display portion 7000 with a finger or the like. The remote controller 7211 may be provided with a display portion for displaying data output from the remote controller 7211. With operation keys or a touch panel of the remote controller 7211, channels and volume can be controlled and images displayed on the display portion 7000 can be controlled.

Note that the television device 7200 is provided with a receiver, a modem, and the like. With the use of the receiver, general television broadcasting can be received. Moreover, when the television device is connected to a communication network with or without wires via the modem, one-way (from a sender to a receiver) or two-way (between a sender and a receiver or between receivers) information communication can be performed.

FIGS. 27C1, 27C2, 27D, and 27E illustrate examples of portable information terminals. Each of the portable information terminals includes a housing 7301 and the display portion 7000. Furthermore, each of the portable information terminals may also include an operation button, an external connection port, a speaker, a microphone, an antenna, a battery, or the like. The display portion 7000 is provided with a touch sensor. An operation of the portable information terminal can be performed by touching the display portion 7000 with a finger, a stylus, or the like.

FIG. 27C1 is a perspective view of a portable information terminal 7300. FIG. 27C2 is a top view of the portable information terminal 7300. FIG. 27D is a perspective view of a portable information terminal 7310. FIG. 27E is a perspective view of a portable information terminal 7320.

Each of the portable information terminals illustrated in this embodiment functions as, for example, one or more of a telephone set, a notebook, and an information browsing system. Specifically, each of the portable information terminals can be used as a smartphone. Each of the portable information terminals illustrated in this embodiment is capable of executing a variety of applications such as cellular phone calls, e-mailing, reading and editing texts, music reproduction, Internet communication, and a computer game, for example.

The portable information terminals 7300, 7310, and 7320 can each display characters and image information on its plurality of surfaces. For example, as illustrated in FIGS. 27C1 and 27D, three operation buttons 7302 can be displayed on one surface, and information 7303 indicated by a rectangle can be displayed on another surface. FIGS. 27C1 and 27C2 illustrate an example in which information is displayed at the top of the portable information terminal. FIG. 27D illustrates an example in which information is displayed on the side of the portable information terminal. Information may be displayed on three or more surfaces of the portable information terminal FIG. 27E illustrates an example where information 7304, information 7305, and information 7306 are displayed on different surfaces.

Examples of the information include notification from a social networking service (SNS), display indicating reception of an e-mail or an incoming call, the title of an e-mail or the like, the sender of an e-mail or the like, the date, the time, remaining battery, and the reception strength of an antenna. Alternatively, the operation button, an icon, or the like may be displayed in place of the information.

For example, a user of the portable information terminal 7300 can see the display (here, the information 7303) with the portable information terminal 7300 put in a breast pocket of his/her clothes.

Specifically, a caller's phone number, name, or the like of an incoming call is displayed in a position that can be seen from above the portable information terminal 7300. Thus, the user can see the display without taking out the portable information terminal 7300 from the pocket and decide whether to answer the call.

FIGS. 27F to 27H each illustrate an example of a lighting device having a curved light-emitting portion.

The light-emitting portion included in each of the lighting devices illustrated in FIGS. 27F to 27H can be manufactured using the display device, the input/output device, or the like of one embodiment of the present invention. One embodiment of the present invention makes it possible to provide a highly reliable lighting device having a curved light-emitting portion.

A lighting device 7400 illustrated in FIG. 27F includes a light-emitting portion 7402 with a wave-shaped light-emitting surface and thus is a good-design lighting device.

A light-emitting portion 7412 included in a lighting device 7410 illustrated in FIG. 27G has two convex-curved light-emitting portions symmetrically placed. Thus, light radiates from the lighting device 7410.

A lighting device 7420 illustrated in FIG. 27H includes a concave-curved light-emitting portion 7422. This is suitable for illuminating a specific range because light emitted from the light-emitting portion 7422 is collected to the front of the lighting device 7420. In addition, with this structure, a shadow is less likely to be produced.

The light-emitting portion included in each of the lighting devices 7400, 7410, and 7420 may be flexible. The light-emitting portion may be fixed on a plastic member, a movable frame, or the like so that an emission surface of the light-emitting portion can be bent freely depending on the intended use.

The lighting devices 7400, 7410, and 7420 each include a stage 7401 provided with an operation switch 7403 and a light-emitting portion supported by the stage 7401.

Note that although the lighting device in which the light-emitting portion is supported by the stage is described as an example here, a housing provided with a light-emitting portion can be fixed on a ceiling or suspended from a ceiling. Since the light-emitting surface can be curved, the light-emitting surface is curved to have a concave shape, whereby a particular area can be brightly illuminated, or the light-emitting surface is curved to have a convex shape, whereby a whole room can be brightly illuminated.

FIGS. 28A1, 28A2, 28B, 28C, 28D, 28E, 28F, 28G, 28H, and 28I each illustrate an example of a portable information terminal including a display portion 7001 having flexibility.

The display portion 7001 is formed using the display device, the input/output device, or the like of one embodiment of the present invention. For example, a display device, an input/output device, or the like that can be bent with a radius of curvature of greater than or equal to 0.01 mm and less than or equal to 150 mm can be used. The display portion 7001 may include a touch sensor so that the portable information terminal can be operated by touching the display portion 7001 with a finger or the like. One embodiment of the present invention makes it possible to provide a highly reliable electronic device including a display portion having flexibility.

FIGS. 28A1 and 28A2 are a perspective view and a side view illustrating an example of the portable information terminal, respectively. A portable information terminal 7500 includes a housing 7501, the display portion 7001, a display portion pull 7502, operation buttons 7503, and the like.

The portable information terminal 7500 includes the display portion 7001 that is flexible and rolled in the housing 7501.

The portable information terminal 7500 can receive a video signal with a control portion incorporated therein and can display the received video on the display portion 7001. Furthermore, the portable information terminal 7500 incorporates a battery. Moreover, a terminal portion for connecting a connector may be included in the housing 7501 so that a video signal or power can be directly supplied from the outside with a wiring.

By pressing the operation buttons 7503, power ON/OFF, switching of displayed videos, and the like can be performed. Although FIGS. 28A1, 28A2, and 28B illustrate an example where the operation buttons 7503 are positioned on a side surface of the portable information terminal 7500, one embodiment of the present invention is not limited thereto. The operation buttons 7503 may be placed on the same surface as a display surface (a front surface) or a rear surface of the portable information terminal 7500.

FIG. 28B illustrates the portable information terminal 7500 in a state where the display portion 7001 is pulled out with the display portion pull 7502. Videos can be displayed on the display portion 7001 in this state. In addition, the portable information terminal 7500 may perform different displays in the state where part of the display portion 7001 is rolled as illustrated in FIG. 28A1 and in the state where the display portion 7001 is pulled out with the display portion pull 7502 as illustrated in FIG. 28B. For example, in the state illustrated in FIG. 28A1, the rolled portion of the display portion 7001 is put in a non-display state, which results in a reduction in power consumption of the portable information terminal 7500.

Note that a reinforcement frame may be provided for a side portion of the display portion 7001 so that the display portion 7001 maintains a flat display surface when pulled out.

Note that in addition to this structure, a speaker may be provided in the housing so that sound is output in accordance with an audio signal received together with a video signal.

FIGS. 28C to 28E illustrate an example of a foldable portable information terminal FIG. 28C illustrates a portable information terminal 7600 that is opened. FIG. 28D illustrates the portable information terminal 7600 that is being opened or being folded. FIG. 28E illustrates the portable information terminal 7600 that is folded. The portable information terminal 7600 is highly portable when folded, and is highly browsable when opened because of a seamless large display area.

The display portion 7001 is supported by three housings 7601 joined together by hinges 7602. By folding the portable information terminal 7600 at a connection portion between two housings 7601 with the hinges 7602, the portable information terminal 7600 can be reversibly changed in shape from the opened state to the folded state.

FIGS. 28F and 28G illustrate an example of a foldable portable information terminal FIG. 28F illustrates a portable information terminal 7650 that is folded so that the display portion 7001 is on the inside. FIG. 28G illustrates the portable information terminal 7650 that is folded so that the display portion 7001 is on the outside. The portable information terminal 7650 includes the display portion 7001 and a non-display portion 7651. When the portable information terminal 7650 is not used, the portable information terminal 7650 may be folded so that the display portion 7001 is on the inside, whereby the display portion 7001 can be prevented from being contaminated or damaged.

FIG. 28H illustrates an example of a flexible portable information terminal. A portable information terminal 7700 includes a housing 7701 and the display portion 7001. In addition, the portable information terminal 7700 may include buttons 7703*a* and 7703*b* which serve as input means, speakers 7704*a* and 7704*b* which serve as sound output means, an external connection port 7705, a microphone 7706, or the like. A flexible battery 7709 can be mounted on the portable information terminal 7700. The battery 7709 may be arranged to overlap with the display portion 7001, for example.

The housing 7701, the display portion 7001, and the battery 7709 are flexible. Thus, it is easy to curve the portable information terminal 7700 into a desired shape or to twist the portable information terminal 7700. For example, the portable information terminal 7700 can be folded so that the display portion 7001 is on the inside or on the outside. The portable information terminal 7700 can be used in a rolled state. Since the shapes of the housing 7701 and the display portion 7001 can be changed freely in this manner, the portable information terminal 7700 is less likely to be broken even when the portable information terminal 7700 falls down or external force is applied to the portable information terminal 7700.

The portable information terminal 7700 can be used effectively in various situations because the portable information terminal 7700 is lightweight. For example, the portable information terminal 7700 can be used while being suspected with the upper portion of the housing 7701 held by a clip or the like, or while the housing 7701 is fixed to a wall by magnets or the like.

FIG. 28I illustrates an example of a wrist-watch-type portable information terminal. A portable information terminal 7800 includes a band 7801, the display portion 7001, an input/output terminal 7802, operation buttons 7803, and the like. The band 7801 has a function of a housing. In addition, a flexible battery 7805 can be mounted on the portable information terminal 7800. The battery 7805 may overlap with the display portion 7001 and the band 7801, for example.

The band 7801, the display portion 7001, and the battery 7805 have flexibility. Thus, the portable information terminal 7800 can be easily curved to have a desired shape.

With the operation buttons 7803, a variety of functions such as time setting, ON/OFF of the power, ON/OFF of wireless communication, setting and cancellation of silent mode, and setting and cancellation of power saving mode can be performed. For example, the functions of the operation buttons 7803 can be set freely by the operating system incorporated in the portable information terminal 7800.

By touching an icon 7804 displayed on the display portion 7001 with a finger or the like, application can be started.

The portable information terminal 7800 can employ near field communication that is a communication method based on an existing communication standard. In that case, for example, mutual communication between the portable information terminal 7800 and a headset capable of wireless communication can be performed, and thus hands-free calling is possible.

Alternatively, the portable information terminal 7800 may include the input/output terminal 7802. In the case where the input/output terminal 7802 is included, data can be directly transmitted to and received from another information terminal via a connector. Charging through the input/output terminal 7802 is also possible. Note that charging of the portable information terminal described as an example in this embodiment can be performed by non-contact power transmission without using the input/output terminal.

Figure 29A:
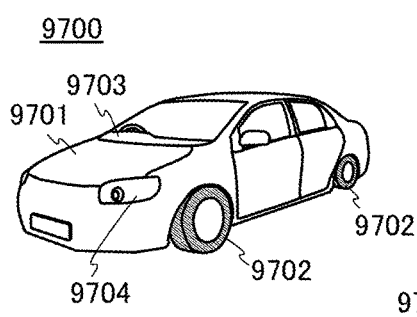
FIGS. 29A to 29E each illustrate an example of an electronic device of an embodiment.
Figure 29B:
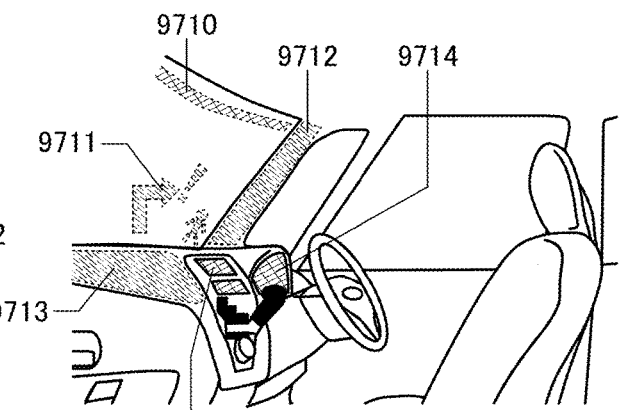

FIG. 29A is an external view of an automobile 9700. FIG. 29B illustrates a driver's seat of the automobile 9700. The automobile 9700 includes a car body 9701, wheels 9702, a dashboard 9703, lights 9704, and the like. The display device or input/output device of one embodiment of the present invention can be used in a display portion or the like of the automobile 9700. For example, the display device or input/output device of one embodiment of the present invention can be used in display portions 9710 to 9715 illustrated in FIG. 29B.

The display portion 9710 and the display portion 9711 are display devices or input/output devices provided in an automobile windshield. The display device or input/output device of one embodiment of the present invention can be a see-through display device or input/output device, through which the opposite side can be seen, by using a light-transmitting conductive material for its electrodes. Such a see-through display device or input/output device does not hinder driver's vision during the driving of the automobile 9700. Therefore, the display device or input/output device of one embodiment of the present invention can be provided in the windshield of the automobile 9700. Note that in the case where a transistor or the like for driving the display device or input/output device is provided in the display device or input/output device, a transistor having light-transmitting properties, such as an organic transistor using an organic semiconductor material or a transistor using an oxide semiconductor, is preferably used.

The display portion 9712 is a display device or input/output device provided on a pillar portion. For example, the display portion 9712 can compensate for the view hindered by the pillar portion by showing an image taken by an imaging unit provided on the car body. The display portion 9713 is a display device or input/output device provided on a dashboard portion. For example, the display portion 9713 can compensate for the view hindered by the dashboard portion by showing an image taken by an imaging unit provided on the car body. That is, showing an image taken by an imaging unit provided on the outside of the car body leads to elimination of blind areas and enhancement of safety. In addition, showing an image so as to compensate for the area which a driver cannot see makes it possible for the driver to confirm safety easily and comfortably.

Figure 29C:
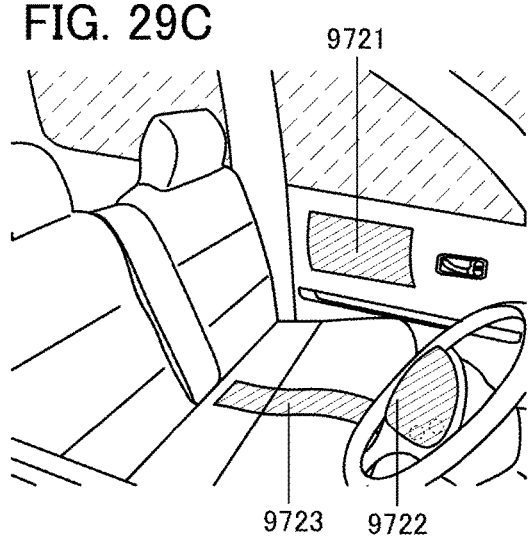

FIG. 29C illustrates the inside of a car in which a bench seat is used as a driver seat and a front passenger seat. A display portion 9721 is a display device or input/output device provided in a door portion. For example, the display portion 9721 can compensate for the view hindered by the door portion by showing an image taken by an imaging unit provided on the car body. A display portion 9722 is a display device or input/output device provided in a steering wheel. A display portion 9723 is a display device or input/output device provided in the middle of a seating face of the bench seat. Note that the display device or input/output device can be used as a seat heater by providing the display device or input/output device on the seating face or backrest and by using heat generated by the display device or input/output device as a heat source.

The display portion 9714, the display portion 9715, and the display portion 9722 can display a variety of kinds of information such as navigation data, a speedometer, a tachometer, a mileage, a fuel meter, a gearshift indicator, and air-condition setting. The content, layout, or the like of the display on the display portions can be changed freely by a user as appropriate. The information listed above can also be displayed on the display portions 9710 to 9713, 9721, and 9723. The display portions 9710 to 9715 and 9721 to 9723 can also be used as lighting devices. The display portions 9710 to 9715 and 9721 to 9723 can also be used as heating devices.

The display portions each including the display device or input/output device of one embodiment of the present invention can be flat, in which case the display device or input/output device of one embodiment of the present invention does not necessarily have a curved surface or flexibility.

Figure 29D:
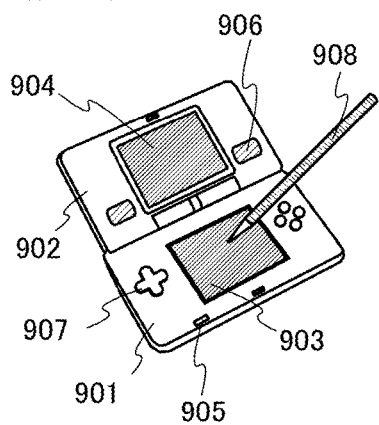

FIG. 29D illustrates a portable game machine including a housing 901, a housing 902, a display portion 903, a display portion 904, a microphone 905, a speaker 906, an operation key 907, a stylus 908, and the like.

The portable game machine illustrated in FIG. 29D includes two display portions 903 and 904. Note that the number of display portions of an electronic device of one embodiment of the present invention is not limited to two and can be one or three or more as long as at least one display portion includes the display device or input/output device of one embodiment of the present invention.

Figure 29E:
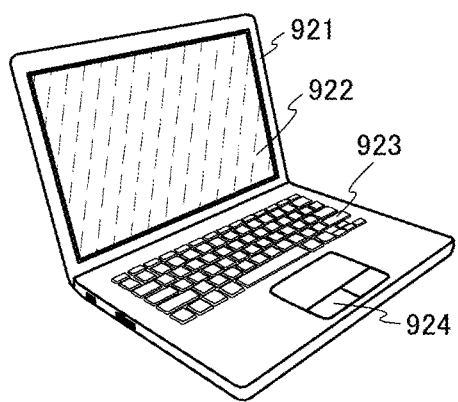

FIG. 29E illustrates a notebook personal computer, which includes a housing 921, a display portion 922, a keyboard 923, a pointing device 924, and the like.

The display device or input/output device of one embodiment of the present invention can be used in the display portion 922.

Figure 30A:
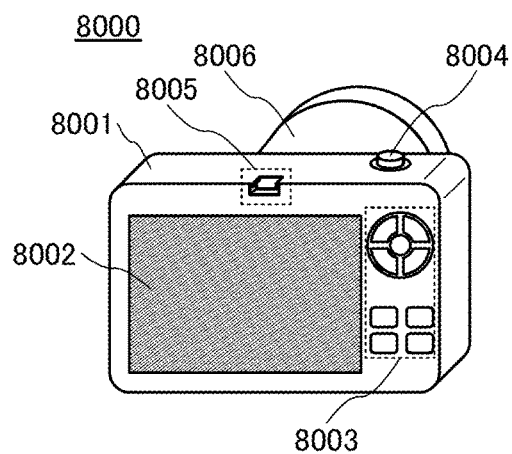
FIGS. 30A to 30C each illustrate an example of an electronic device of an embodiment.

FIG. 30A illustrates an external view of a camera 8000. The camera 8000 includes a housing 8001, a display portion 8002, an operation button 8003, a shutter button 8004, a connection portion 8005, and the like. A lens 8006 can be put on the camera 8000.

The connection portion 8005 includes an electrode to connect a finder 8100, which is described below, a stroboscope, or the like.

Although the lens 8006 of the camera 8000 here is detachable from the housing 8001 for replacement, the lens 8006 may be included in the housing 8001.

Images can be taken at the press of the shutter button 8004. In addition, images can be taken at the touch of the display portion 8002 which serves as a touch panel.

The display device or input/output device of one embodiment of the present invention can be used in the display portion 8002.

Figure 30B:
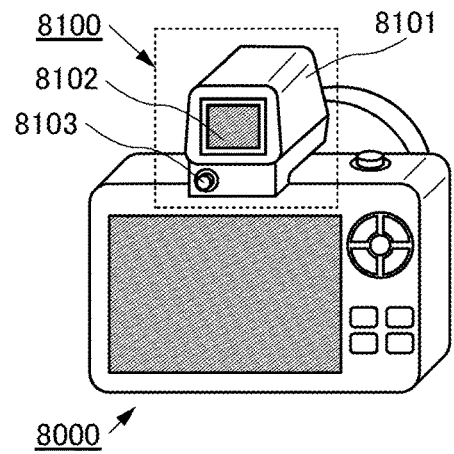

FIG. 30B shows the camera 8000 with the finder 8100 connected.

The finder 8100 includes a housing 8101, a display portion 8102, a button 8103, and the like.

The housing 8101 includes a connection portion for engagement with the connection portion 8005 of the camera 8000 so that the finder 8100 can be connected to the camera 8000. The connection portion includes an electrode, and an image or the like received from the camera 8000 through the electrode can be displayed on the display portion 8102.

The button 8103 has a function of a power button, and the display portion 8102 can be turned on and off with the button 8103.

The display device or input/output device of one embodiment of the present invention can be used in the display portion 8102.

Although the camera 8000 and the finder 8100 are separate and detachable electronic devices in FIGS. 30A and 30B, the housing 8001 of the camera 8000 may include a finder having the display device or input/output device of one embodiment of the present invention.

Figure 30C:
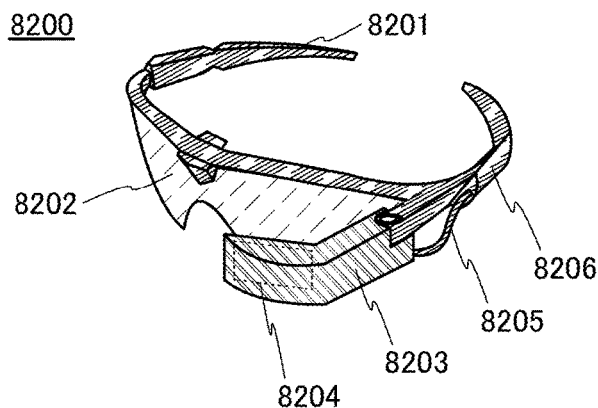

FIG. 30C illustrates an external view of a head-mounted display 8200.

The head-mounted display 8200 includes a mounting portion 8201, a lens 8202, a main body 8203, a display portion 8204, a cable 8205, and the like. The mounting portion 8201 includes a battery 8206.

Power is supplied from the battery 8206 to the main body 8203 through the cable 8205. The main body 8203 includes a wireless receiver or the like to receive video data, such as image data, and display it on the display portion 8204. The movement of the eyeball and the eyelid of a user is captured by a camera in the main body 8203 and then coordinates of the points the user looks at are calculated using the captured data to utilize the eye of the user as an input means.

The mounting portion 8201 may include a plurality of electrodes so as to be in contact with the user. The main body 8203 may be configured to sense current flowing through the electrodes with the movement of the user's eyeball to recognize the direction of his or her eyes. The main body 8203 may be configured to sense current flowing through the electrodes to monitor the user's pulse. The mounting portion 8201 may include sensors, such as a temperature sensor, a pressure sensor, or an acceleration sensor so that the user's biological information can be displayed on the display portion 8204. The main body 8203 may be configured to sense the movement of the user's head or the like to move an image displayed on the display portion 8204 in synchronization with the movement of the user's head or the like.

The display device or input/output device of one embodiment of the present invention can be used in the display portion 8204.

At least part of this embodiment can be implemented in combination with any of the other embodiments described in this specification as appropriate.

This application is based on Japanese Patent Application serial no. 2014-203854 filed with Japan Patent Office on Oct. 2, 2014, the entire contents of which are hereby incorporated by reference.

What is claimed is:
1. An input device comprising:
m row wirings (m is an integer of 2 or more);
n column wirings (n is an integer of 2 or more);
a plurality of capacitors; and
a circuit,
wherein:
  each of the plurality of capacitors is between one of the m row wirings and one of then column wirings,
  the circuit is configured to sense a potential of each of the n column wirings or a current flowing to each of the n column wirings,
  the circuit is configured to input an i-th signal (i is an integer greater than or equal to 1 and less than or equal to m−1) to an i-th row wiring, and to input an i+1-th signal to an i+1-th row wiring,
  the i-th signal changes from a first potential into a second potential at a first time, and from the second potential into the first potential at a second time,
  the i-th signal includes a first period in which the first time and the second time are alternately and regularly repeated,
  the i+1-th signal changes from a third potential into a fourth potential at a third time, and from the fourth potential into the third potential at a fourth time,
  the i+1-th signal includes a second period in which the third time and the fourth time are alternately and regularly repeated,
  each of the first potential and the fourth potential is a low level potential,
  each of the second potential and the third potential is a high level potential, and the third time is placed between the first time and the second time.

2. The input device according to claim 1, wherein a period from the first time to the second time has the same length as a period from the third time to the fourth time.

3. The input device according to claim 1, wherein a period from the first time to the second time corresponds to a frame period.

4. The input device according to claim 1, wherein:
the first potential is equal to the fourth potential, and
the second potential is equal to the third potential.

5. The input device according to claim 1, wherein:
the first potential is equal to the third potential, and
the second potential is equal to the fourth potential.

6. The input device according to claim 1, wherein m is an odd number of 3 or more.

7. The input device according to claim 1, wherein the m row wirings and the n column wirings contain a light-transmitting conductive material.

8. The input device according to claim 1, wherein the m row wirings and the n column wirings contain a light-blocking conductive material and have a region whose width is greater than or equal to 50 nm and less than or equal to 100 µm.

9. The input device according to claim 1, wherein:
in a period from the first time to the third time, the i-th signal and the i+1-th are respectively in a state of the high level potential, and
in a period from the second time to the fourth time, the i-th signal and the i+1-th are respectively in a state of the low level potential.

10. The input device according to claim 1, wherein in a period from the third time to the second time, the i-th signal and the i+1-th signal are in states of level potentials opposite to each other.

11. An input/output device comprising:
the input device according to claim 1; and
a display panel,
wherein the display panel includes a display element and a transistor.

12. A method for driving an input device,
the input device comprising:
m row wirings (m is an integer of 2 or more);
n column wirings (n is an integer of 2 or more);
a plurality of capacitors; and
a circuit,
the method comprising:
inputting an i-th signal (i is an integer greater than or equal to 1 and less than or equal to m−1) to an i-th row wiring, and an i+1-th signal to an i+1-th row wiring; and
sensing a potential of each of the n column wirings or a current flowing to each of then column wirings,
wherein:
each of the plurality of capacitors is between one of them row wirings and one of the n column wirings,
the i-th signal changes from a first potential into a second potential at a first time, and from the second potential into the first potential at a second time,
the i-th signal includes a first period in which the first time and the second time are alternately and regularly repeated,
the i+1-th signal changes from a third potential into a fourth potential at a third time, and from the fourth potential into the third potential at a fourth time,
the i+1-th signal includes a second period in which the third time and the fourth time are alternately and regularly repeated,
each of the first potential and the fourth potential is a low level potential,
each of the second potential and the third potential is a high level potential, and
the third time is placed between the first time and the second time.

13. The method according to claim 12, wherein a period from the first time to the second time has the same length as a period from the third time to the fourth time.

14. The method according to claim 12, wherein a period from the first time to the second time corresponds to a frame period.

15. The method according to claim 12, wherein:
the first potential is equal to the fourth potential, and
the second potential is equal to the third potential.

16. The method according to claim 12, wherein:
the first potential is equal to the third potential, and
the second potential is equal to the fourth potential.

17. The method according to claim 12, wherein m is an odd number of 3 or more.

18. The method according to claim 12, wherein:
in a period from the first time to the third time, the i-th signal and the i+1-th are respectively in a state of the high level potential, and
in a period from the second time to the fourth time, the i-th signal and the i+1-th are respectively in a state of the low level potential.

19. The method according to claim 12, wherein in a period from the third time to the second time, the i-th signal and the i+1-th signal are in states of level potentials opposite to each other.

* * * * *